United States Patent
Wu et al.

(10) Patent No.: US 12,058,873 B2
(45) Date of Patent: Aug. 6, 2024

(54) MEMORY DEVICE INCLUDING A SEMICONDUCTING METAL OXIDE FIN TRANSISTOR AND METHODS OF FORMING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Hui-Hsien Wei, Taoyuan (TW); Chia-Jung Yu, Hsinchu (TW); Pin-Cheng Hsu, Zhubei (TW); Mauricio Manfrini, Zhubei (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 159 days.

(21) Appl. No.: 17/229,753

(22) Filed: Apr. 13, 2021

(65) Prior Publication Data

US 2021/0408116 A1    Dec. 30, 2021

Related U.S. Application Data

(60) Provisional application No. 63/045,289, filed on Jun. 29, 2020.

(51) Int. Cl.
*H10B 61/00* (2023.01)
*H01L 21/02* (2006.01)
(Continued)

(52) U.S. Cl.
CPC ....... *H10B 61/22* (2023.02); *H01L 21/02565* (2013.01); *H01L 29/24* (2013.01);
(Continued)

(58) Field of Classification Search
CPC ........ H10B 63/30; H10B 61/22; H10B 41/70; H10L 29/7869; H10L 27/1225;
(Continued)

(56) References Cited

U.S. PATENT DOCUMENTS 8,471,296 B2    6/2013  Cheng et al.
9,704,899 B2 *  7/2017  Kurokawa .......... H01L 29/7869
(Continued)

FOREIGN PATENT DOCUMENTS

KR    20130103579 A    9/2013
TW    202021134 A      6/2020
WO    2017038403 A1    8/2018

OTHER PUBLICATIONS

Korean Patent and Trademark Office, Application No. 10-2021-0070736 Office Action, mailed Sep. 27, 2022, 6 pages.
(Continued)

*Primary Examiner* — Samuel A Gebremariam
*Assistant Examiner* — Jonas T Beardsley
(74) *Attorney, Agent, or Firm* — The Marbury Law Group, PLLC

(57) ABSTRACT

A semiconductor device includes a semiconducting metal oxide fin located over a lower-level dielectric material layer, a gate dielectric layer located on a top surface and sidewalls of the semiconducting metal oxide fin, a gate electrode located on the gate dielectric layer and straddling the semiconducting metal oxide fin, an access-level dielectric material layer embedding the gate electrode and the semiconducting metal oxide fin, a memory cell embedded in a memory-level dielectric material layer and including a first electrode, a memory element, and a second electrode, and a bit line overlying the memory cell. The first electrode may be electrically connected to a drain region within the semiconducting metal oxide fin through a first electrically con-
(Continued)

ductive path, and the second electrode is electrically connected to the bit line.

20 Claims, 49 Drawing Sheets

(51) Int. Cl.
 *H01L 29/24*   (2006.01)
 *H01L 29/417*   (2006.01)
 *H01L 29/66*   (2006.01)
 *H01L 29/78*   (2006.01)
 *H10B 53/30*   (2023.01)
 *H10B 63/00*   (2023.01)
 *H10N 50/01*   (2023.01)
 *H10N 70/00*   (2023.01)

(52) U.S. Cl.
 CPC .. *H01L 29/41791* (2013.01); *H01L 29/66969* (2013.01); *H01L 29/785* (2013.01); *H10B 53/30* (2023.02); *H10B 63/30* (2023.02); *H10N 50/01* (2023.02); *H10N 70/011* (2023.02)

(58) Field of Classification Search
 CPC ............. H01L 29/7869; H01L 27/1225; H01L 29/66969; H01L 29/78696; H01L 27/0688
 See application file for complete search history.

(56) References Cited

U.S. PATENT DOCUMENTS

| | | |
|---|---|---|
| 2016/0118404 A1 | 4/2016 | Peng |
| 2017/0018655 A1* | 1/2017 | Okazaki .............. H01L 29/4908 |
| 2018/0240797 A1 | 8/2018 | Yokoyama et al. |
| 2019/0273119 A1 | 9/2019 | Zhou |
| 2020/0091156 A1 | 3/2020 | Sharma et al. |
| 2020/0098934 A1 | 3/2020 | Shivaraman et al. |
| 2020/0194499 A1 | 6/2020 | Chung |
| 2020/0279595 A1* | 9/2020 | Oikawa ................. G11C 11/419 |
| 2021/0159271 A1* | 5/2021 | Reznicek ............... H10B 61/22 |
| 2021/0296396 A1* | 9/2021 | Wu ....................... H10N 70/011 |

OTHER PUBLICATIONS

Taiwan Patent and Trademark Office, Application No. 110121638 Office Action, mailed Jul. 15, 2022, 3 pages.
German Patent and Trademark Office, Application No. 10-2021-110374.6, Office Action, mailed Jun. 24, 2023, 7 pages.

* cited by examiner

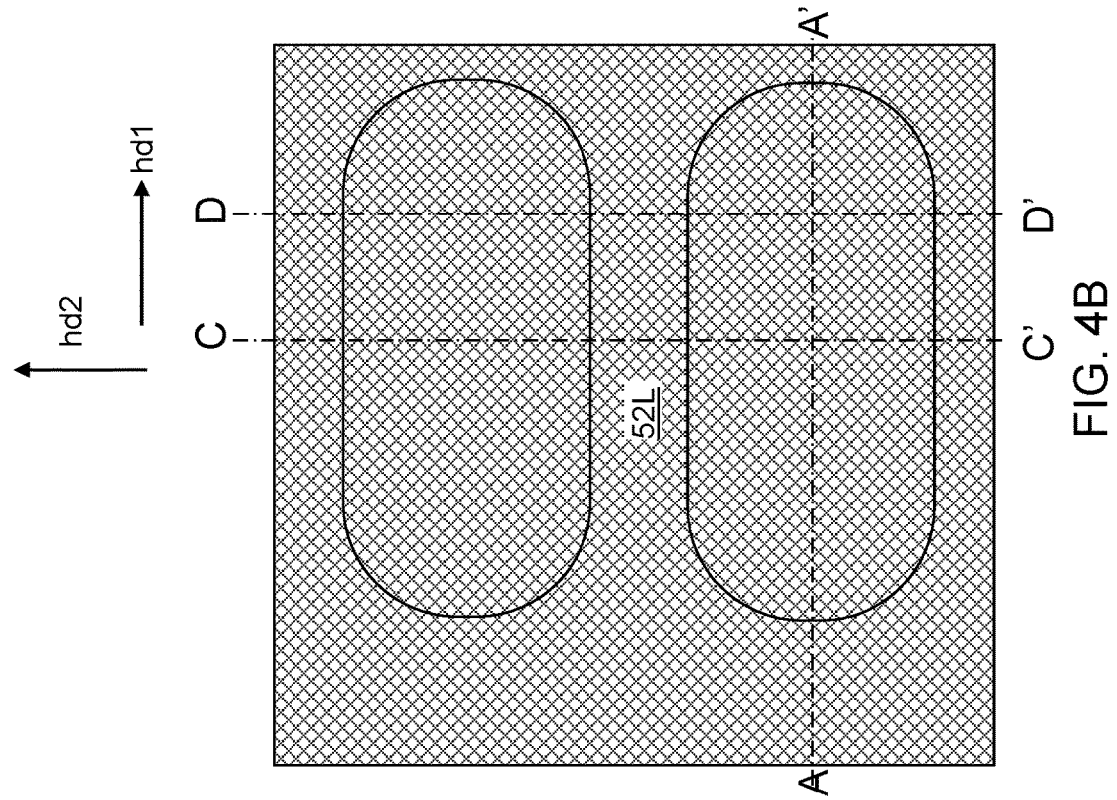
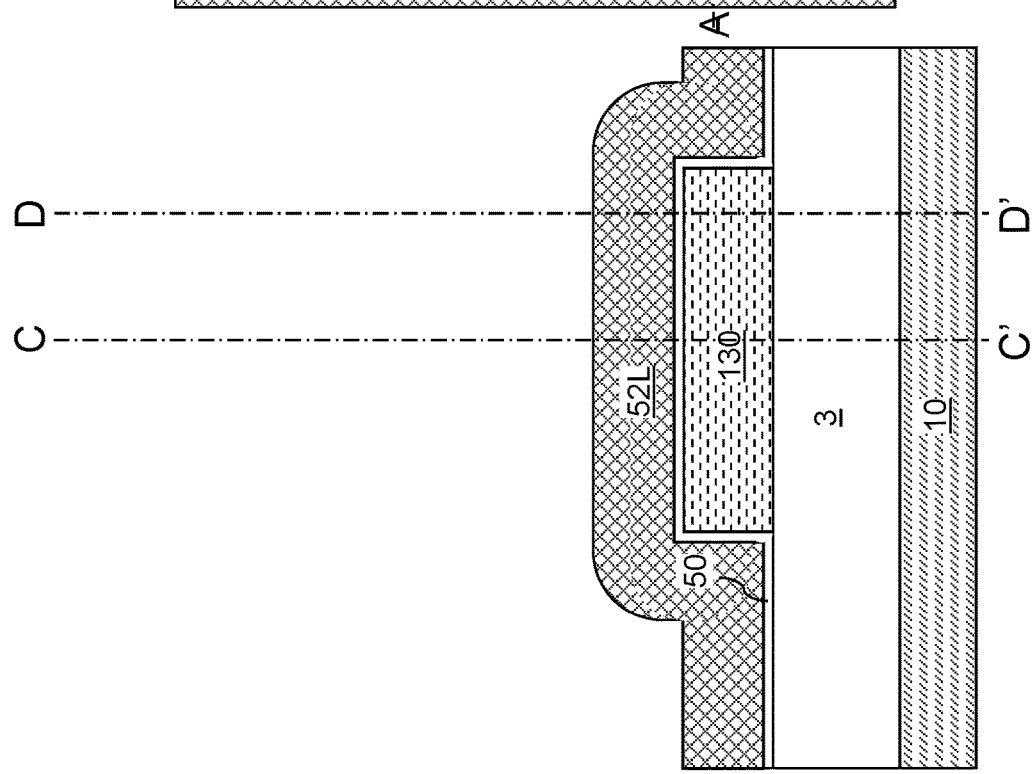
FIG. 4A
FIG. 4B

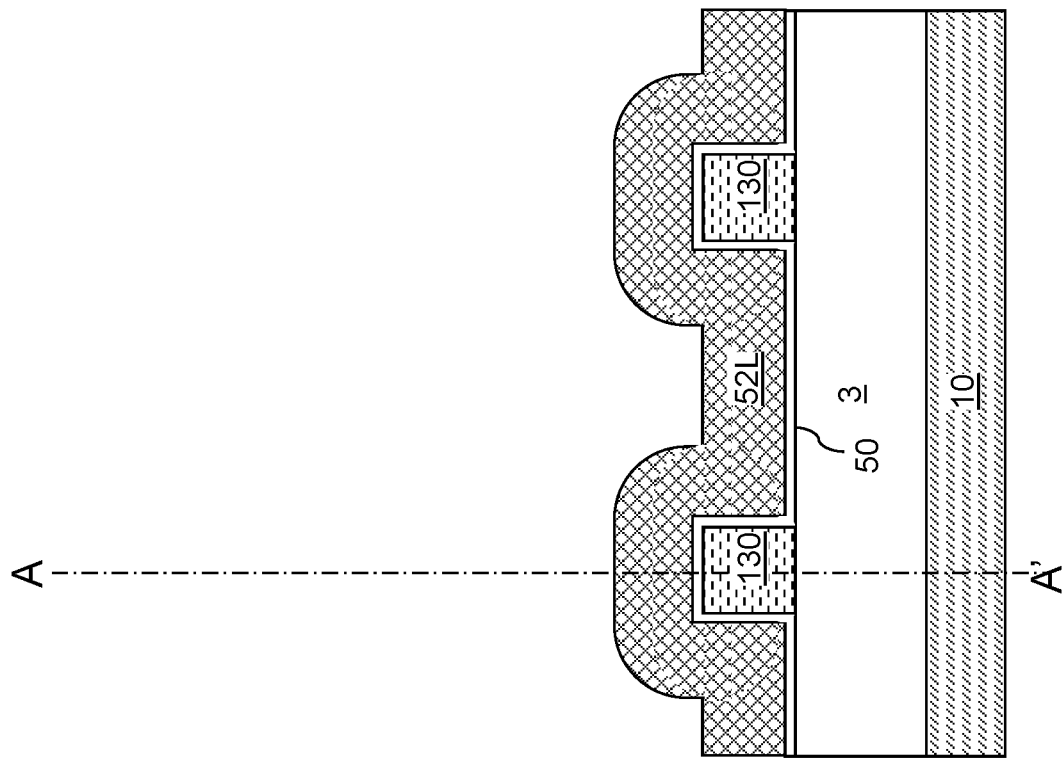
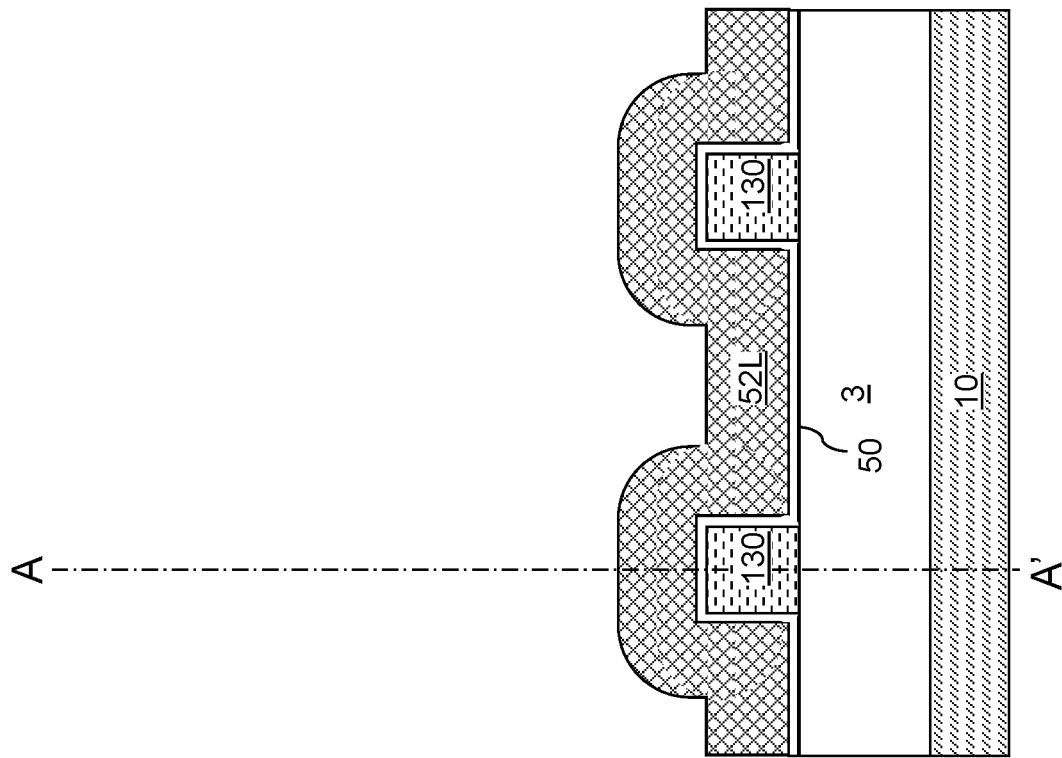

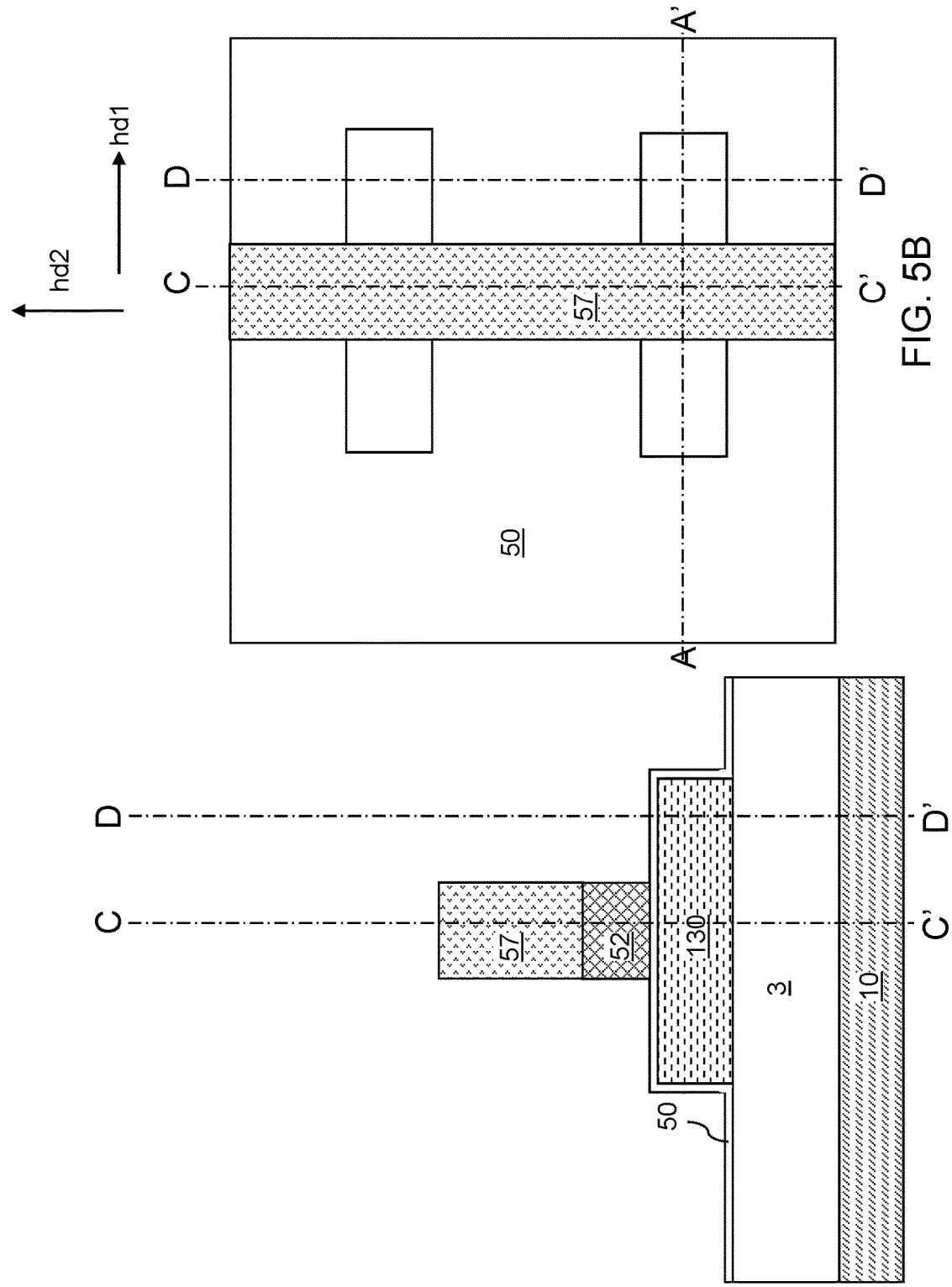

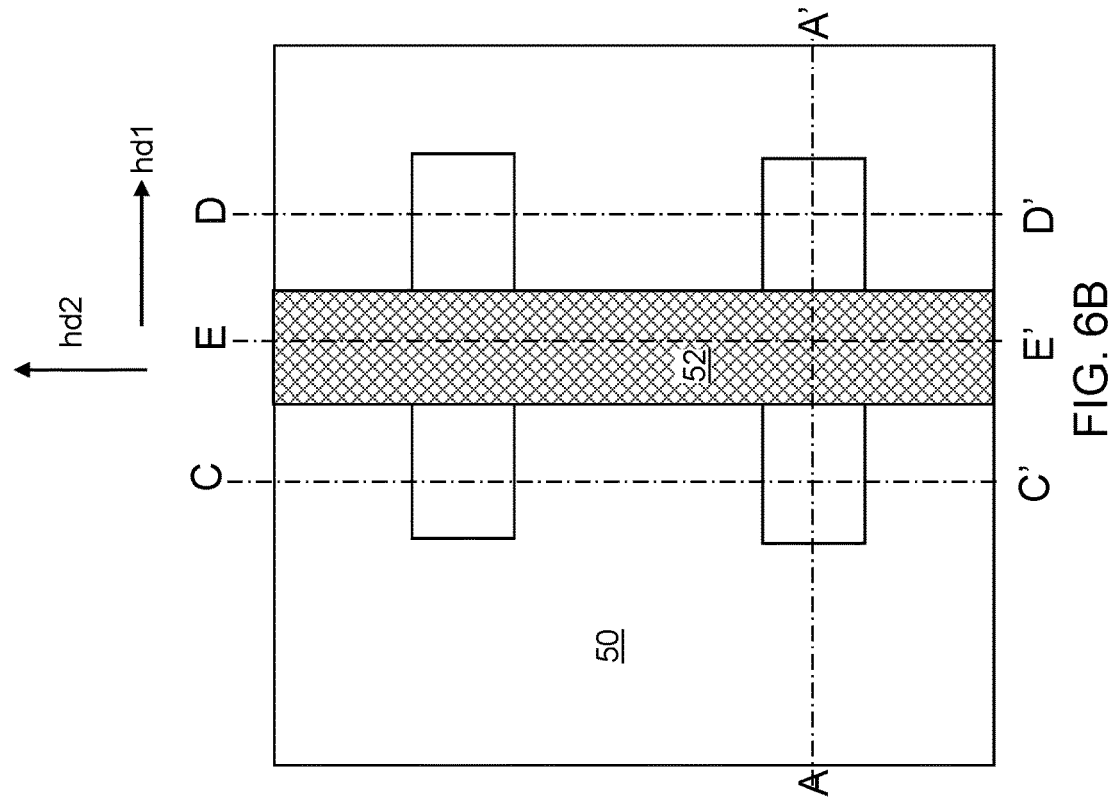
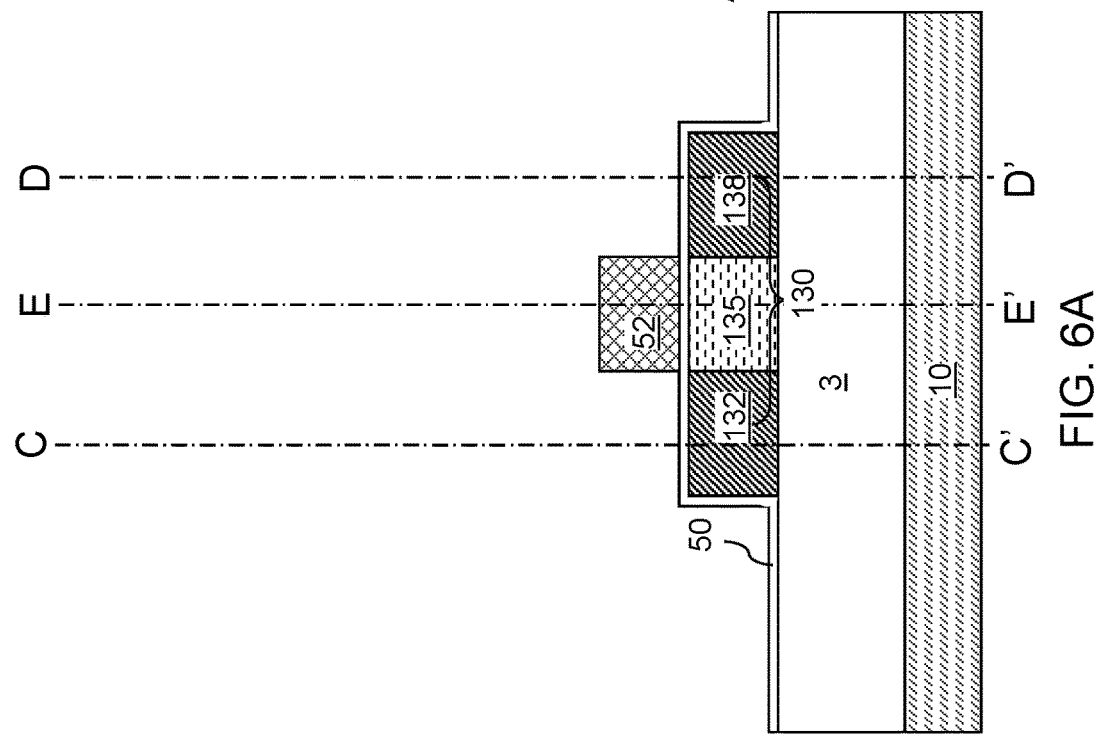
FIG. 6A
FIG. 6B

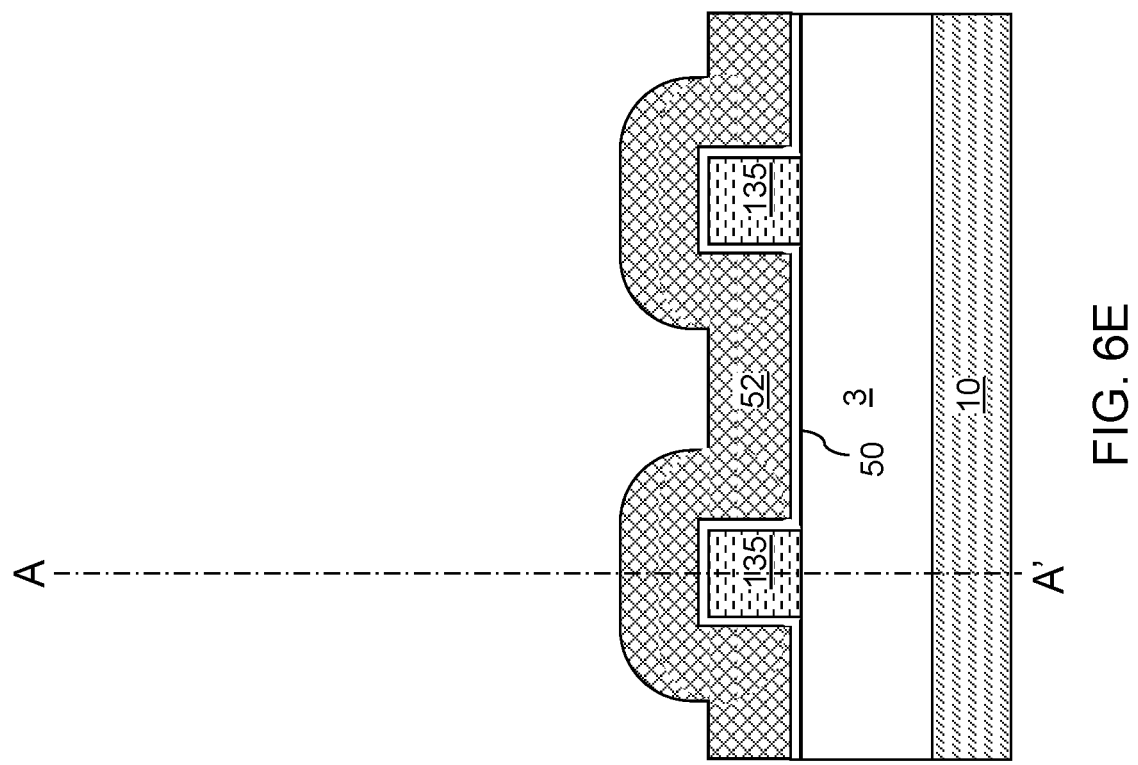

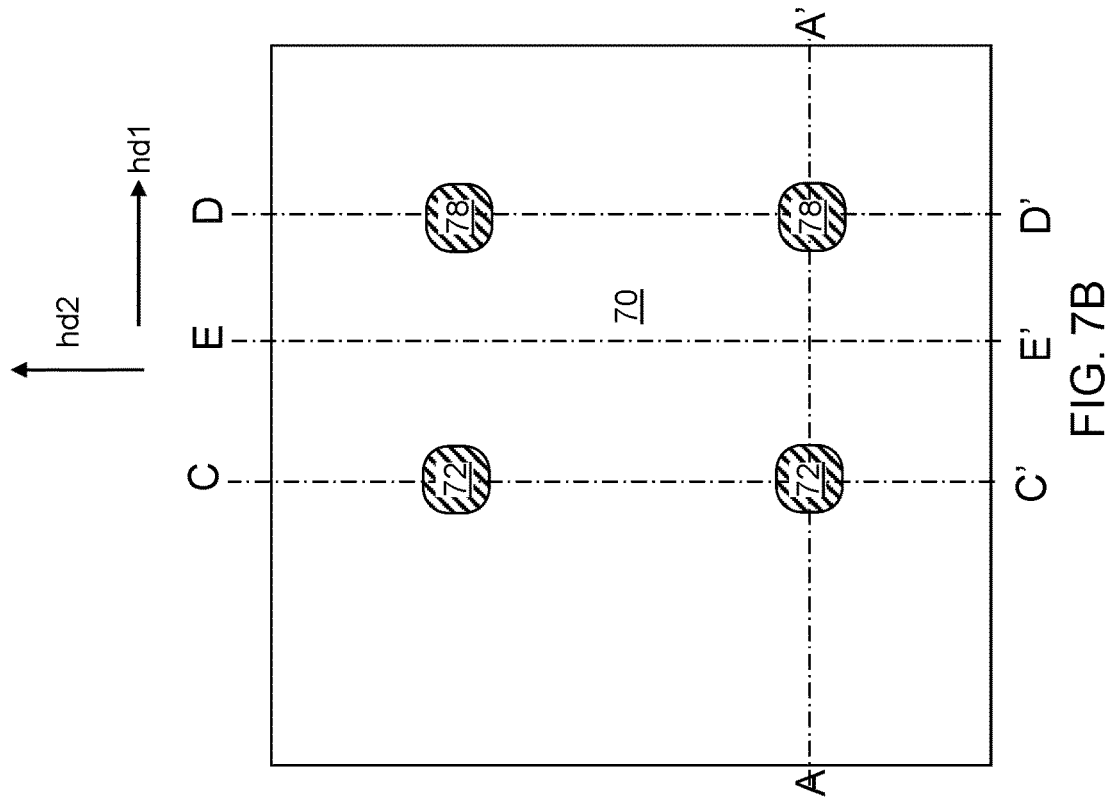
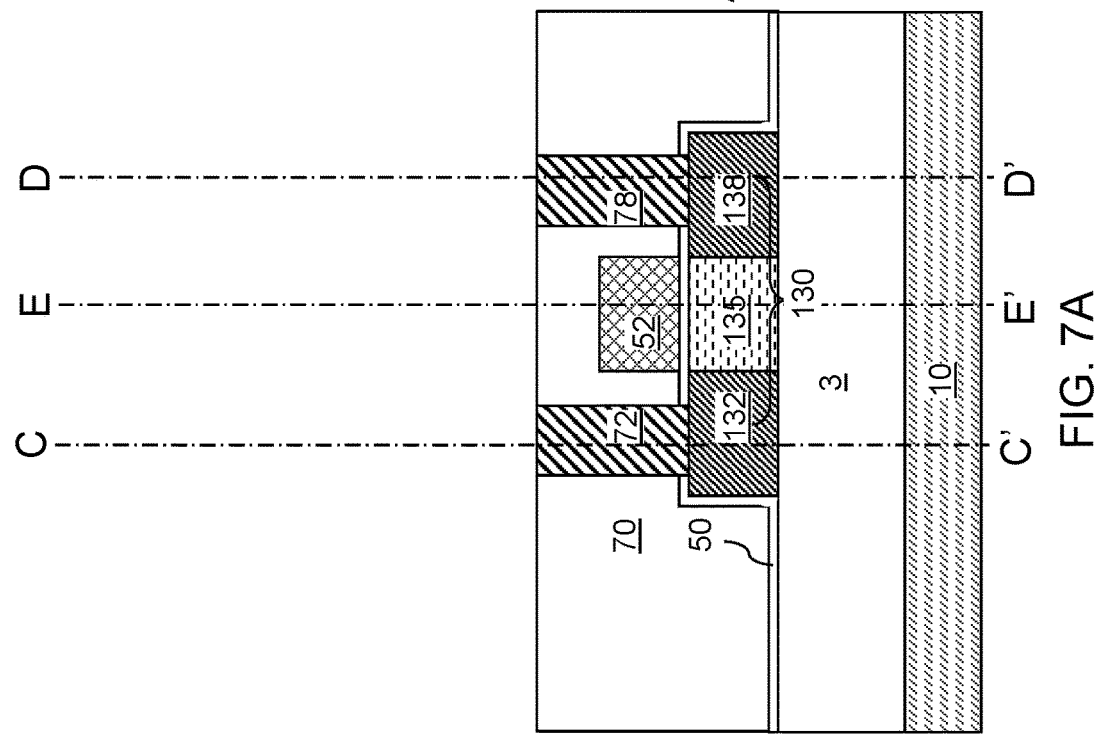
FIG. 7A
FIG. 7B

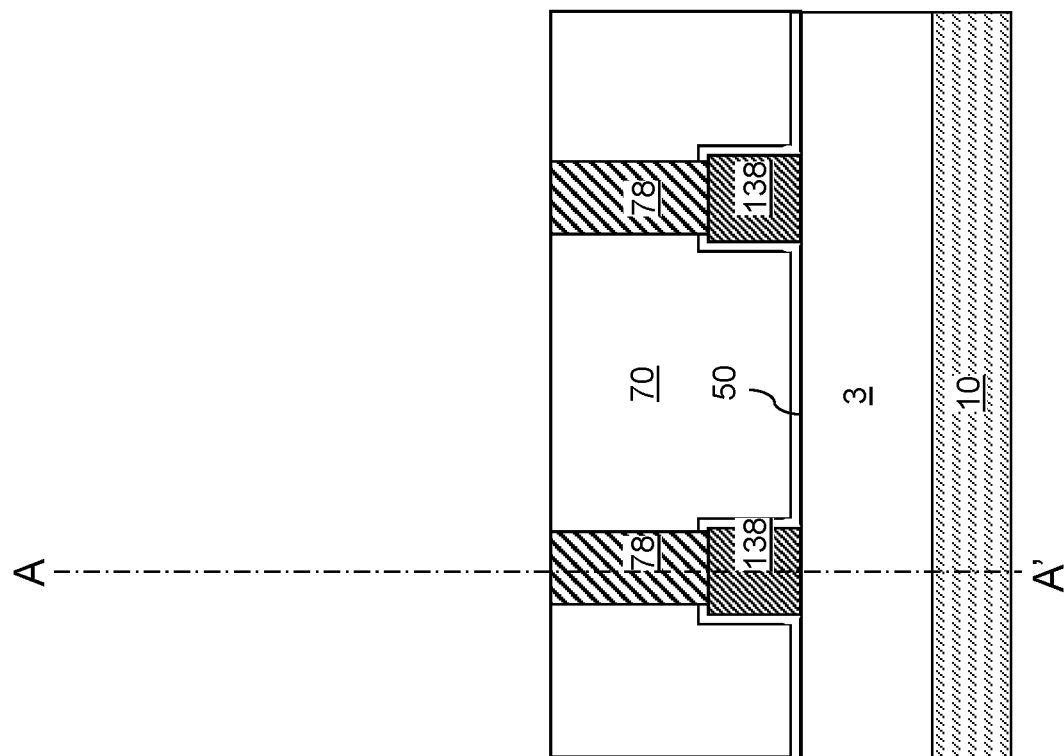
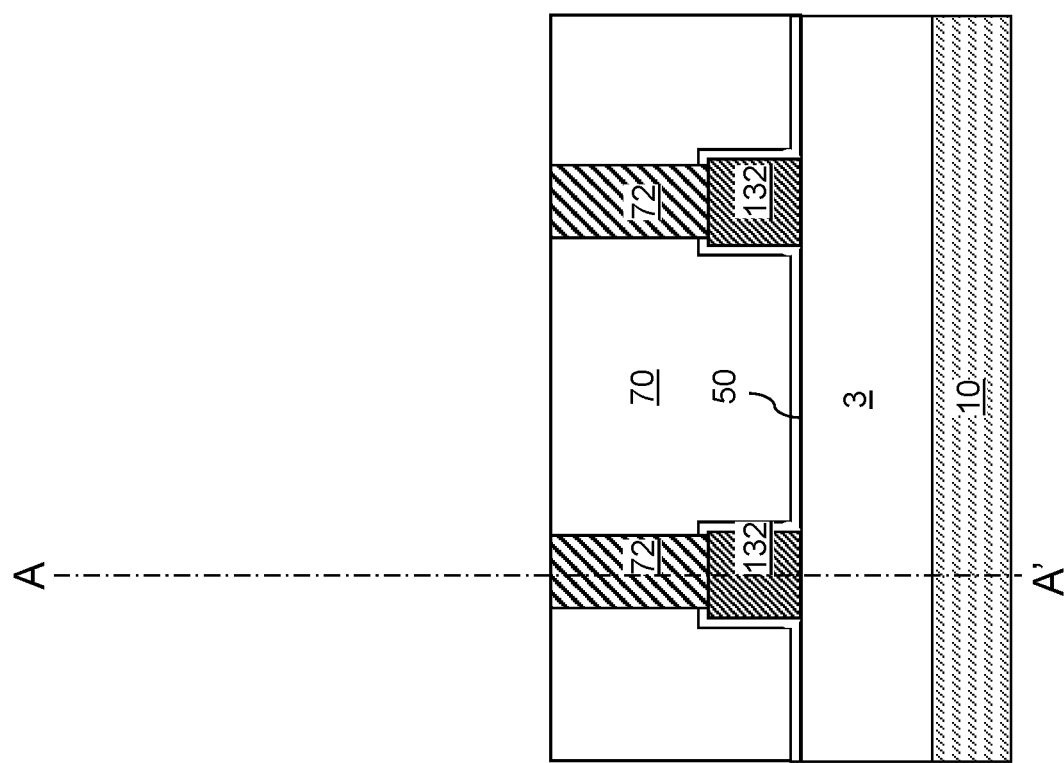

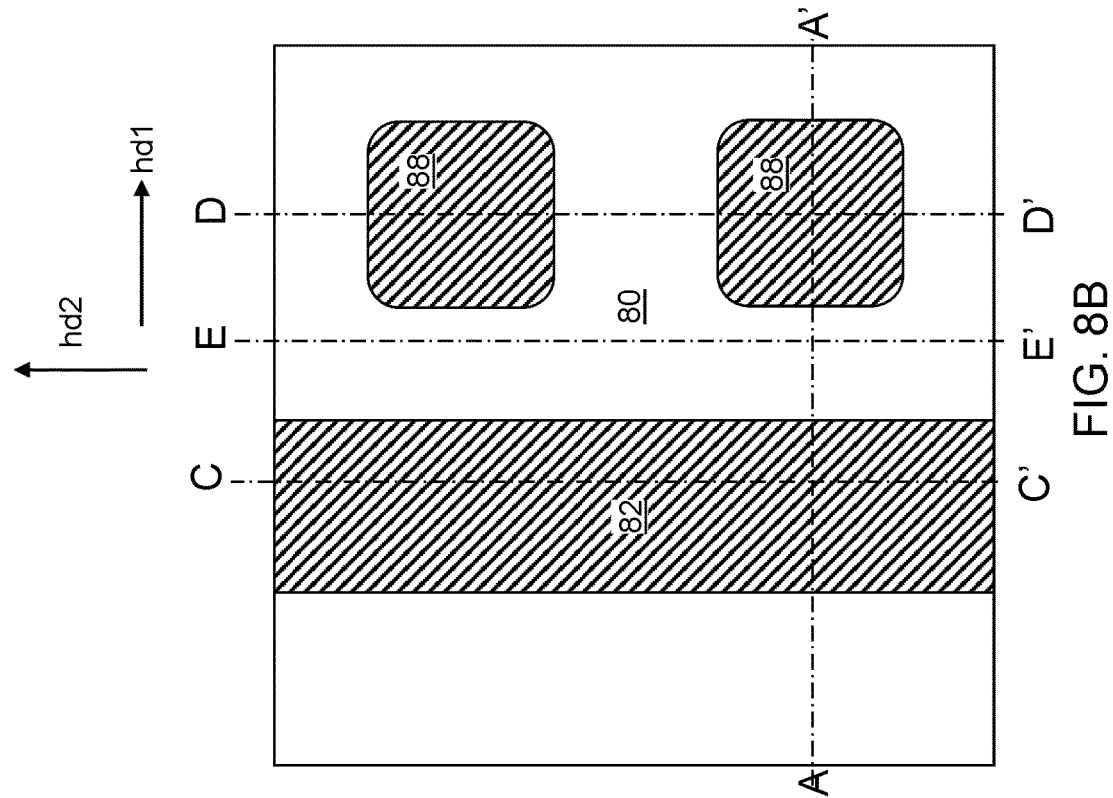
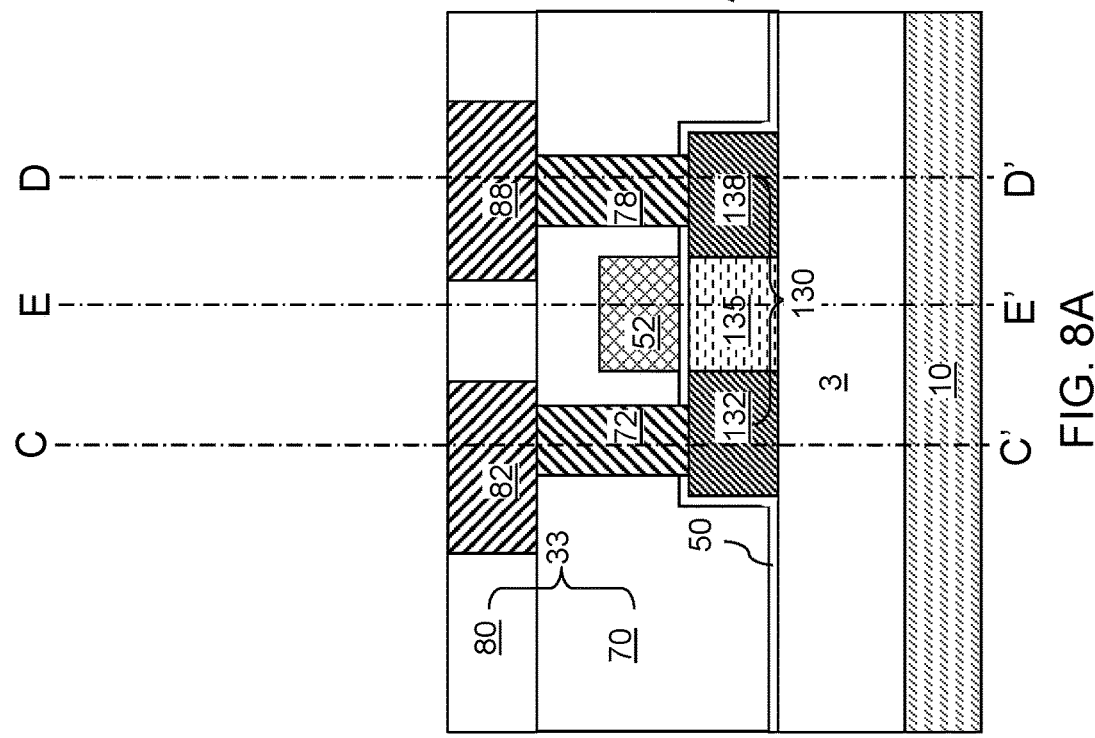

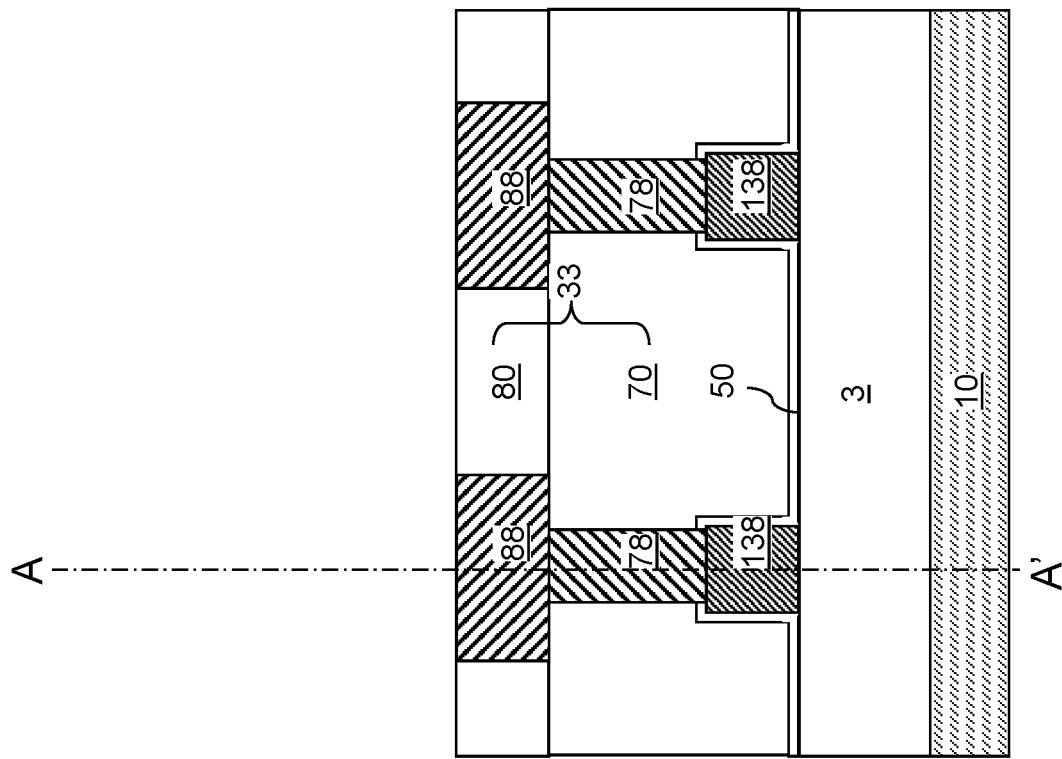
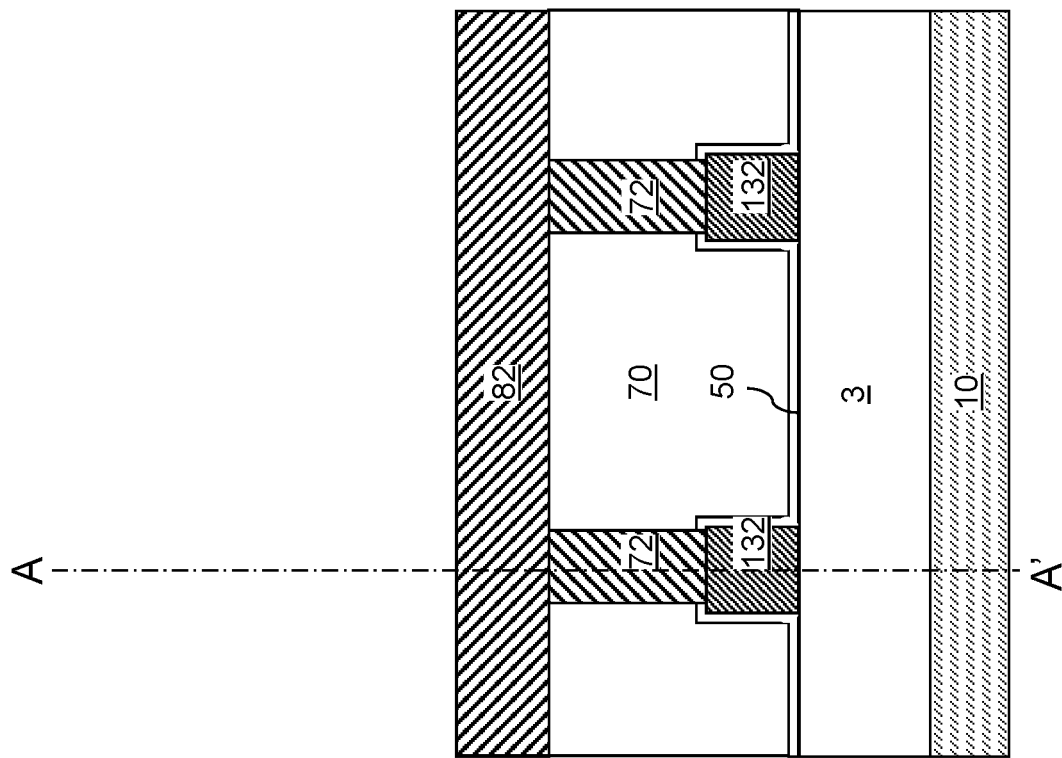

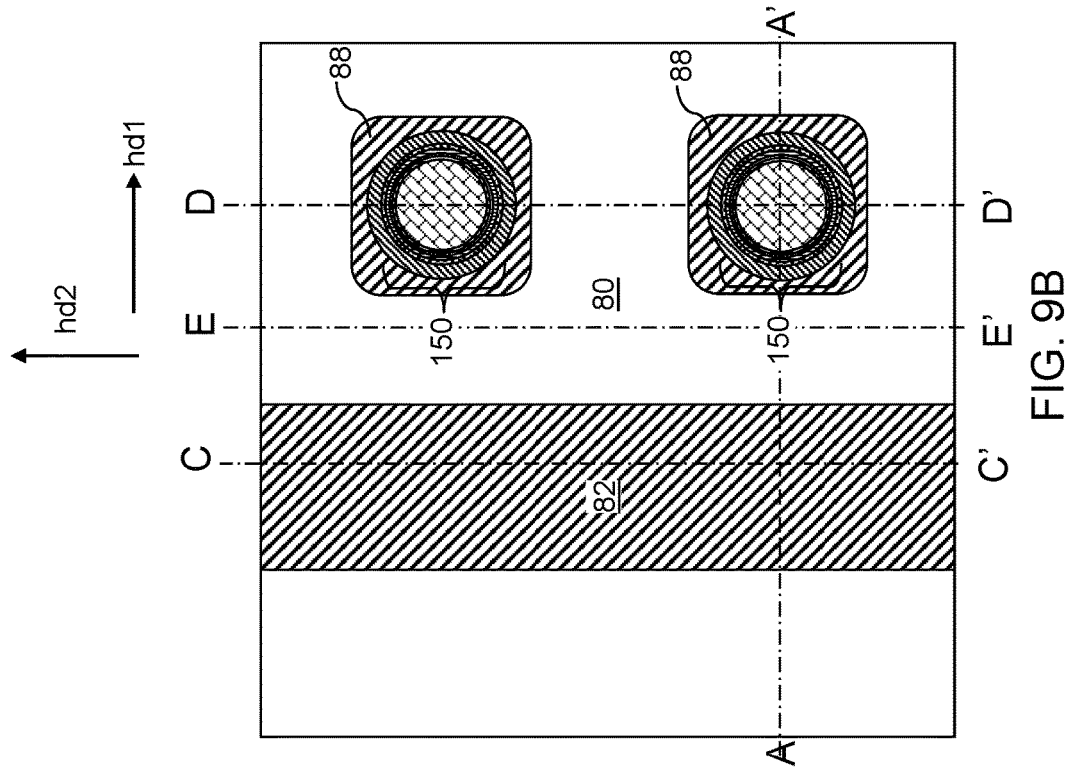
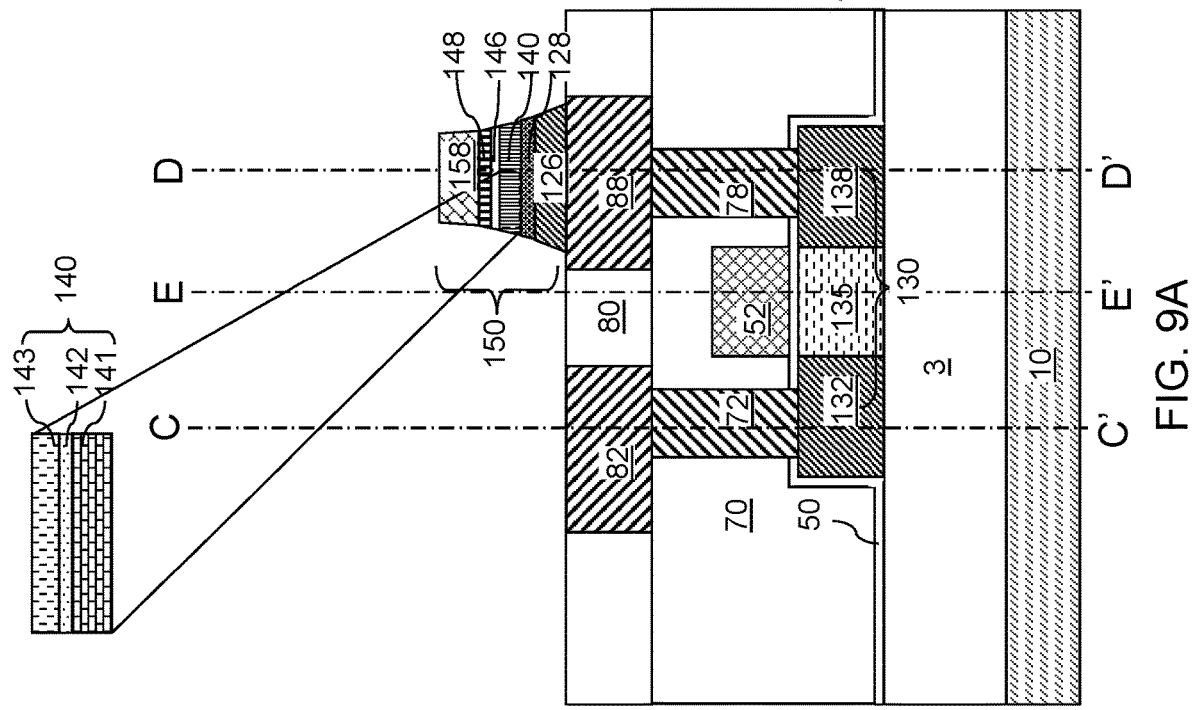
FIG. 9A
FIG. 9B

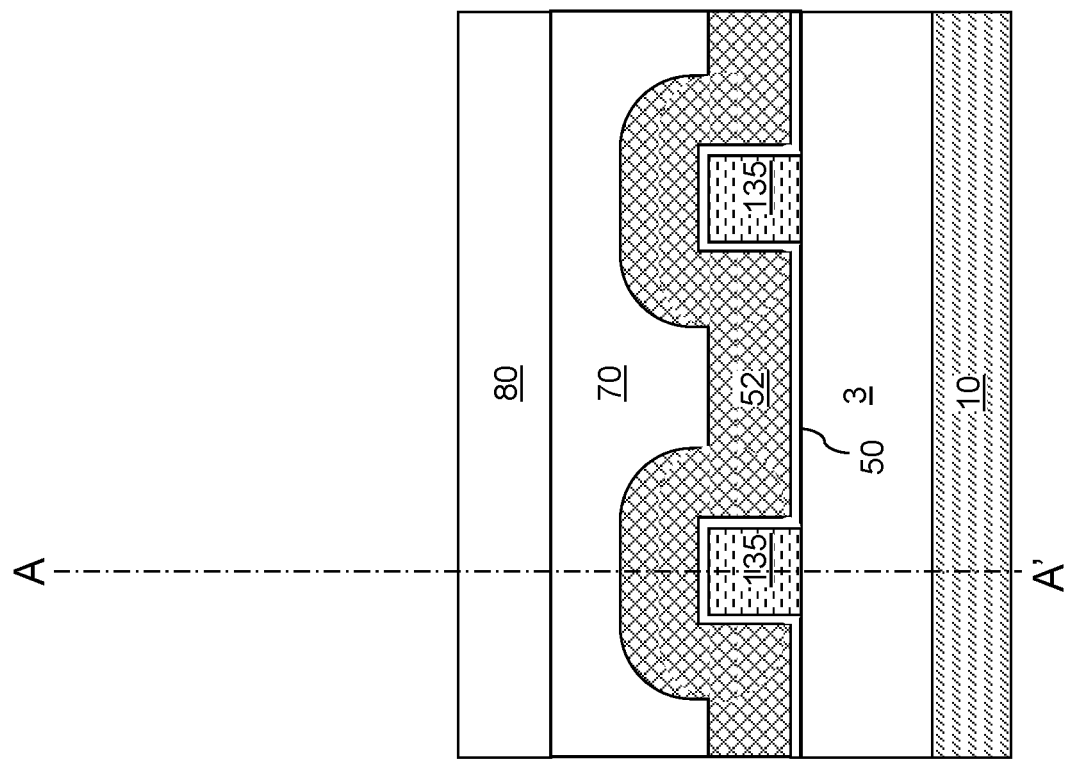

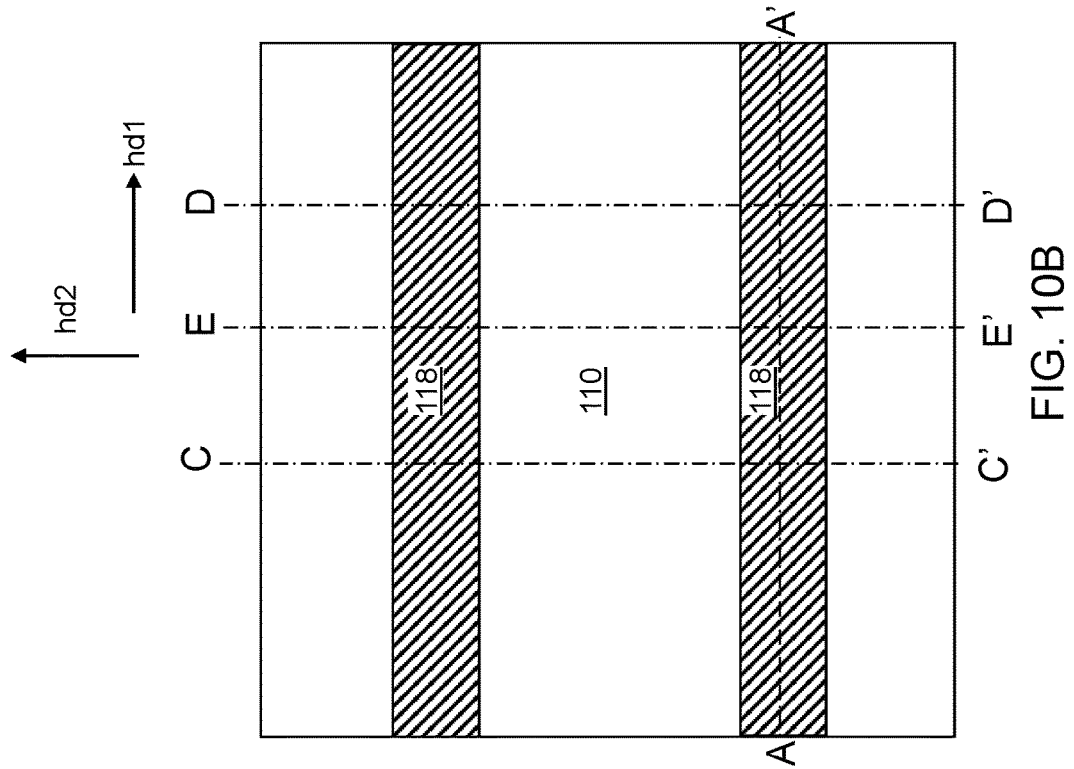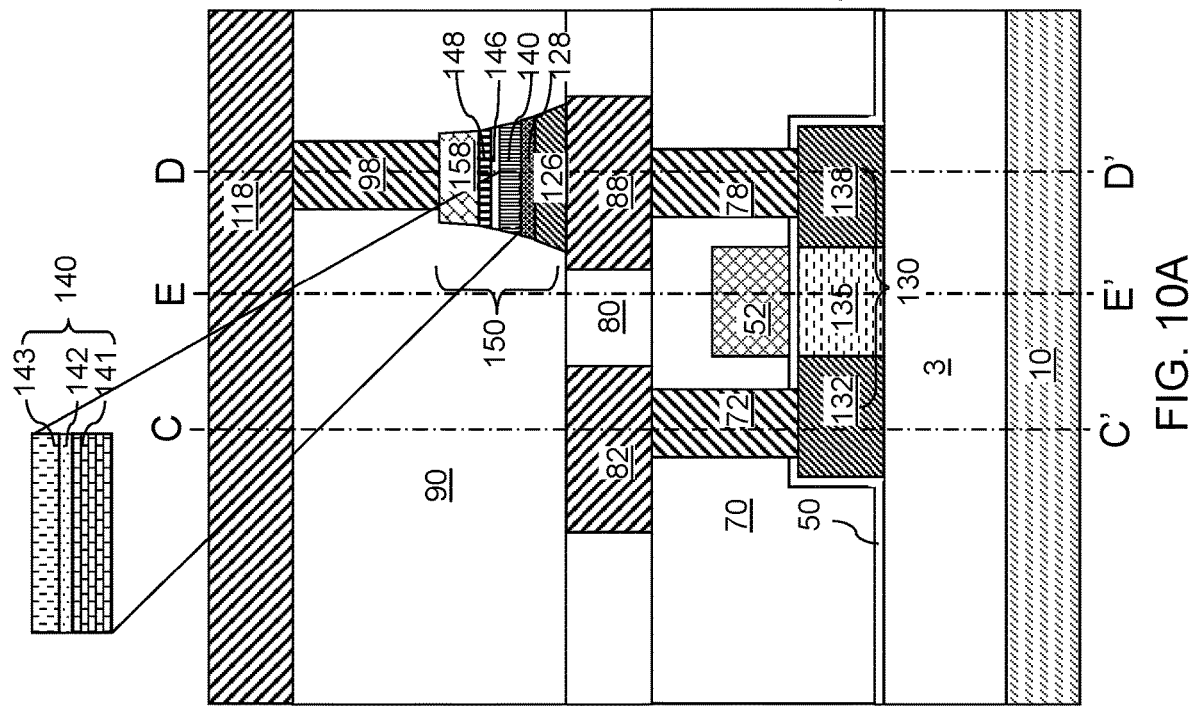

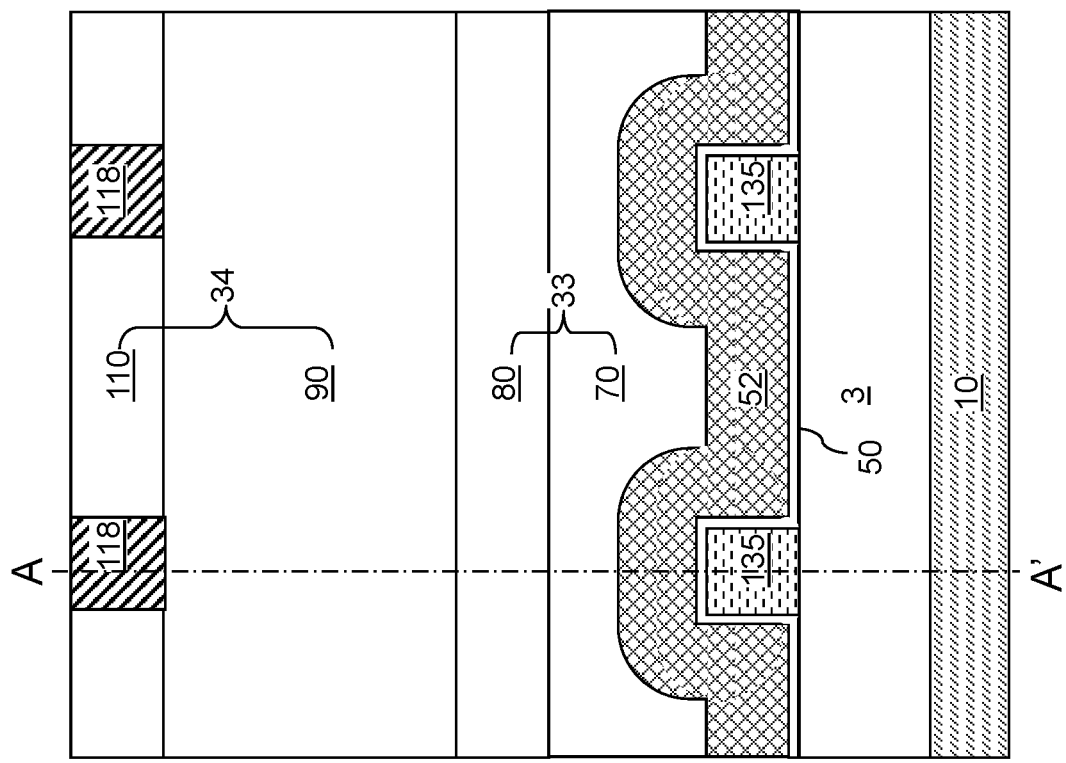

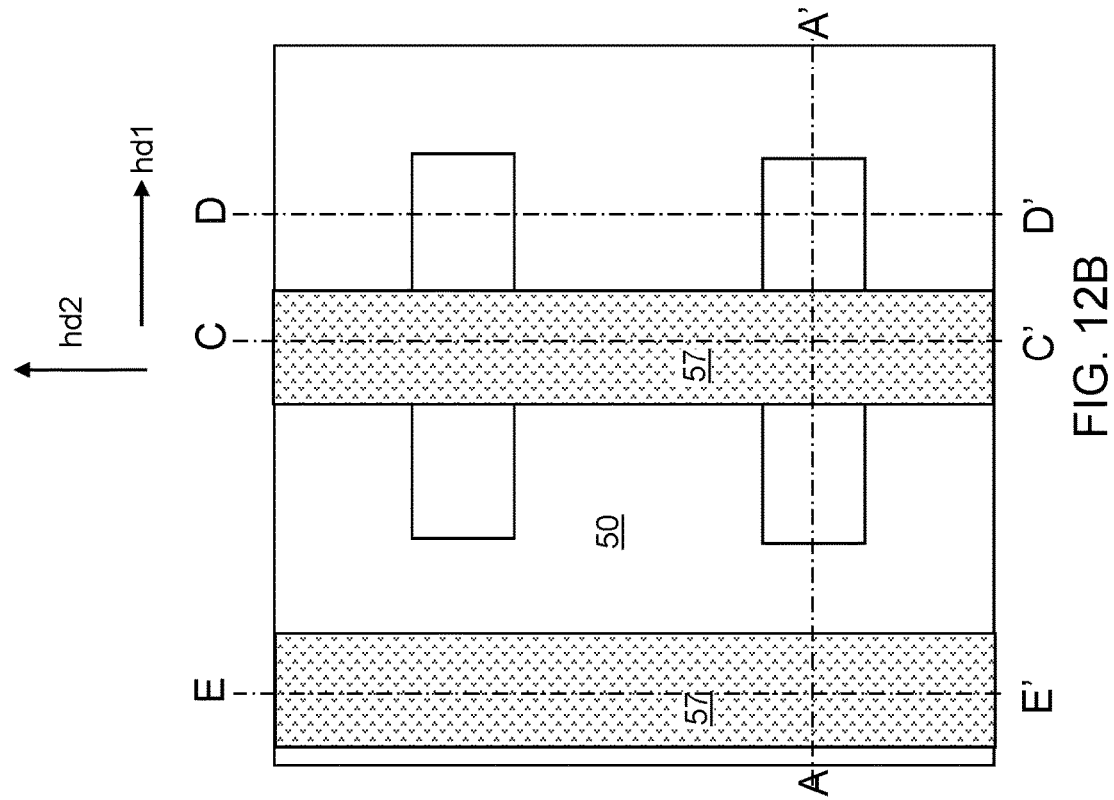
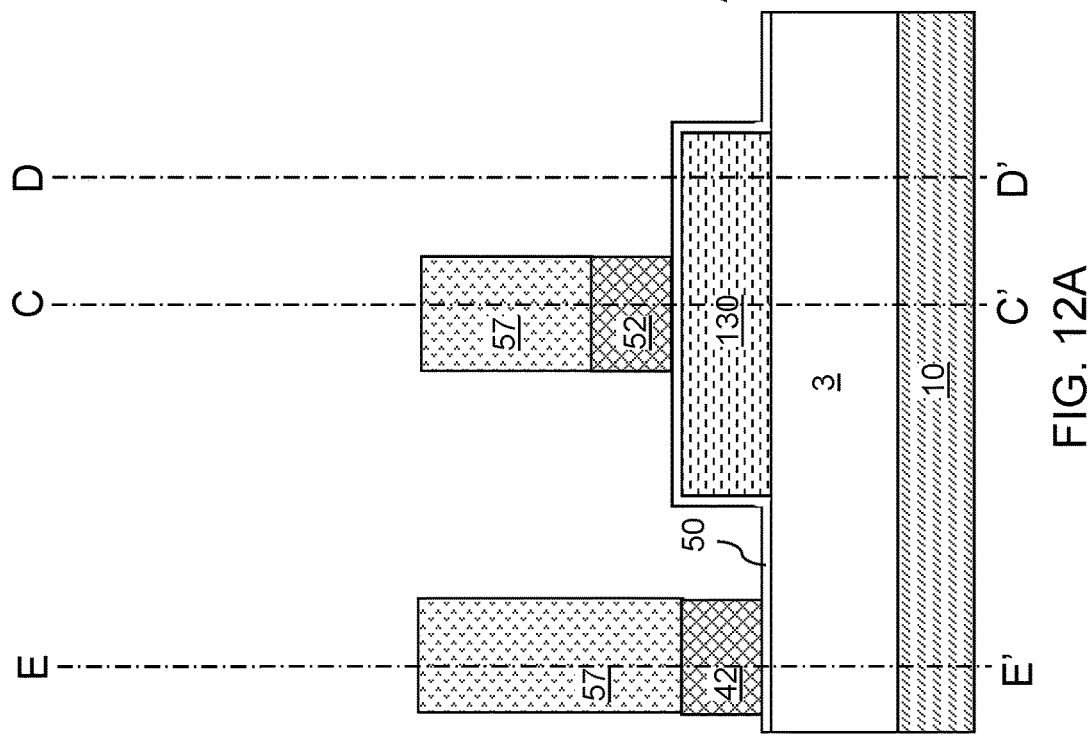
FIG. 12A
FIG. 12B

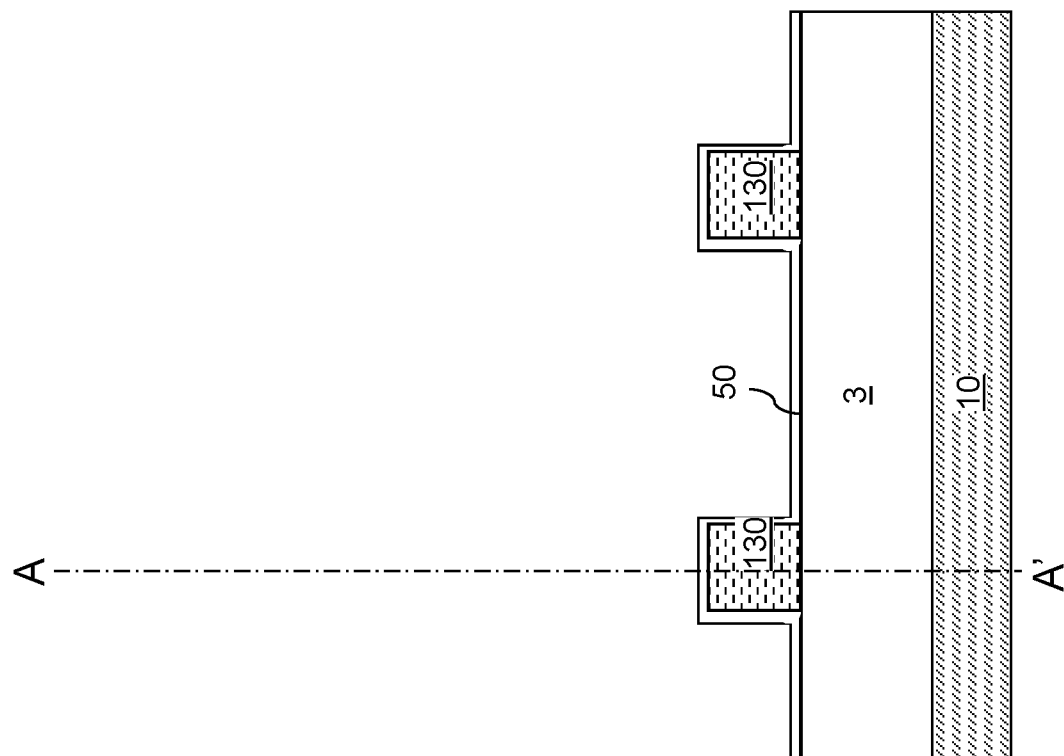
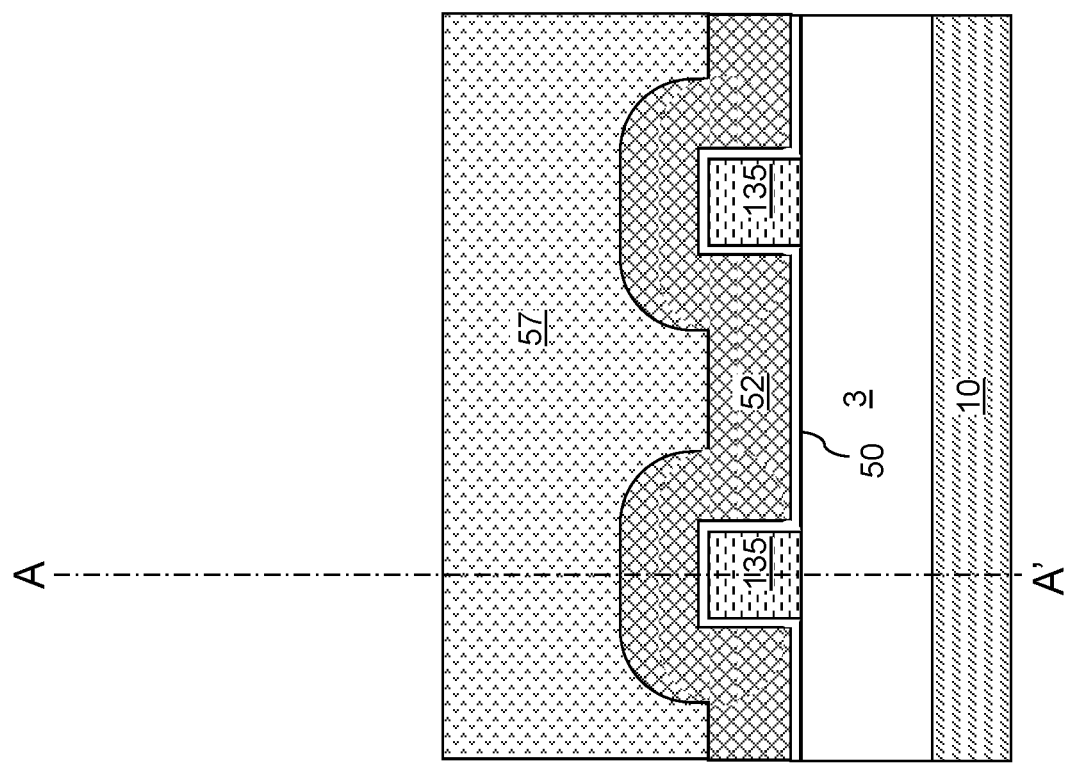
FIG. 12C
FIG. 12D

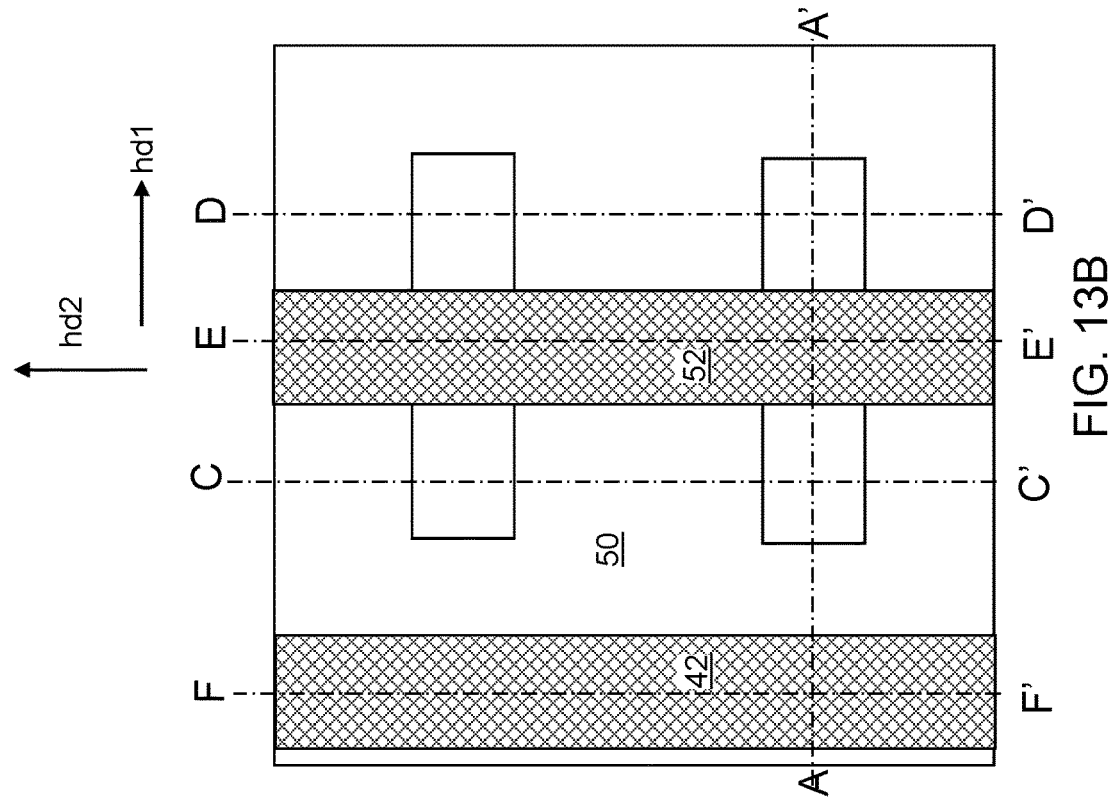
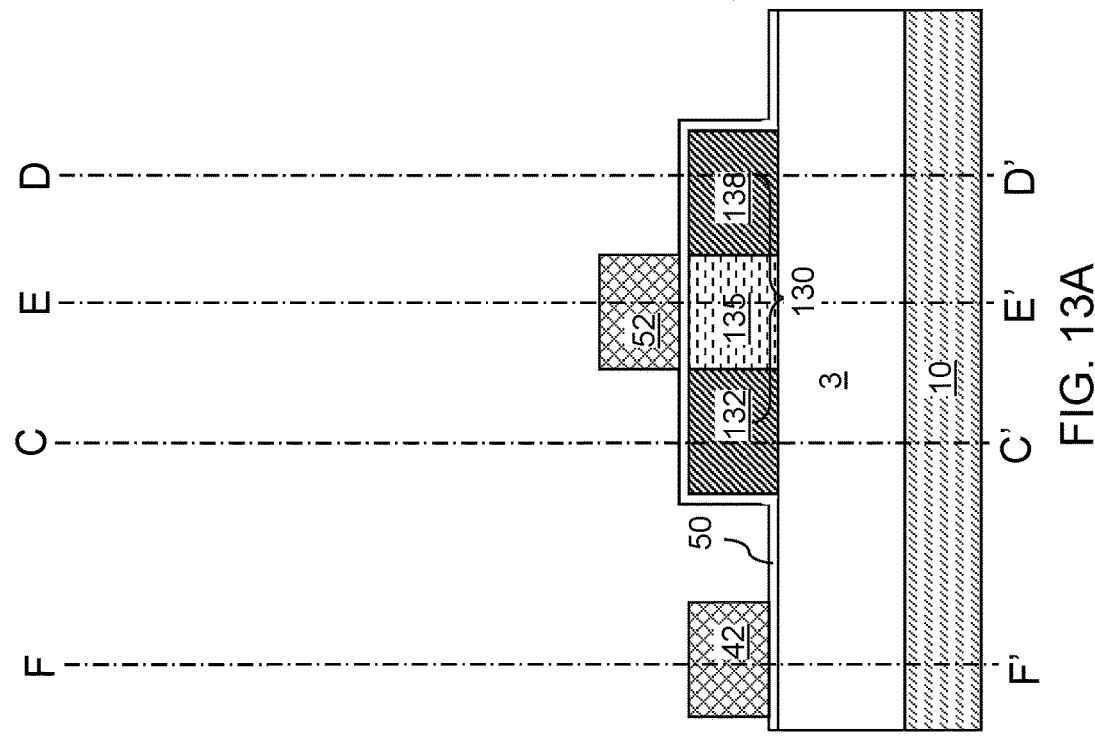
FIG. 13A
FIG. 13B

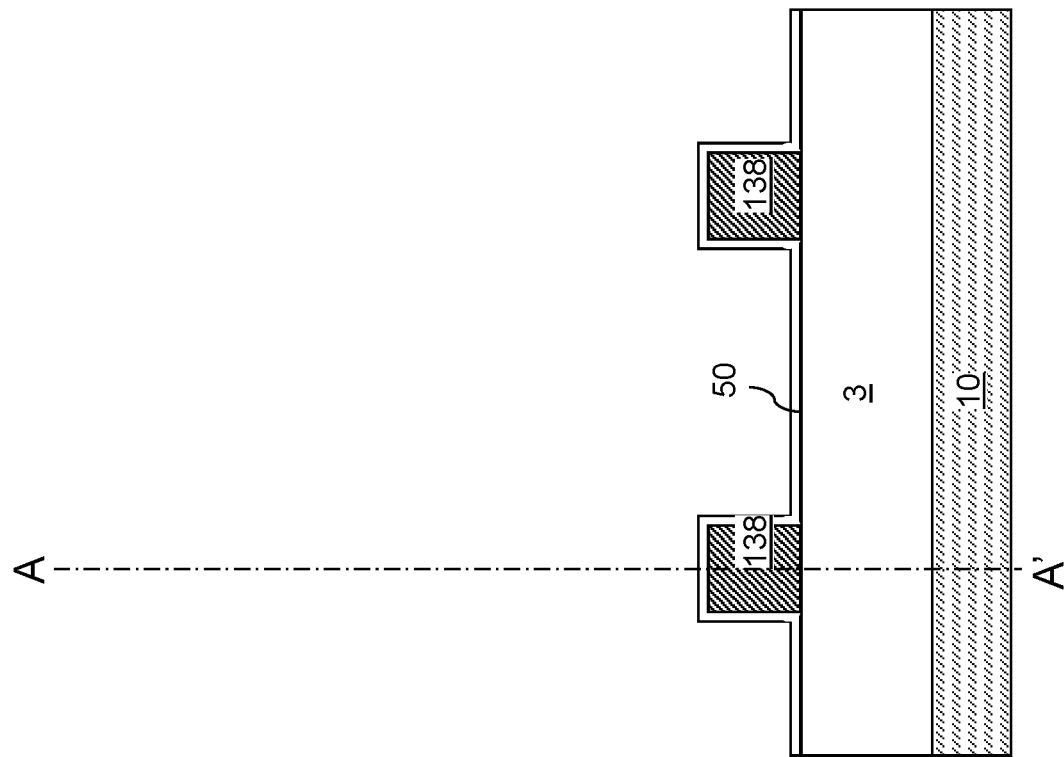
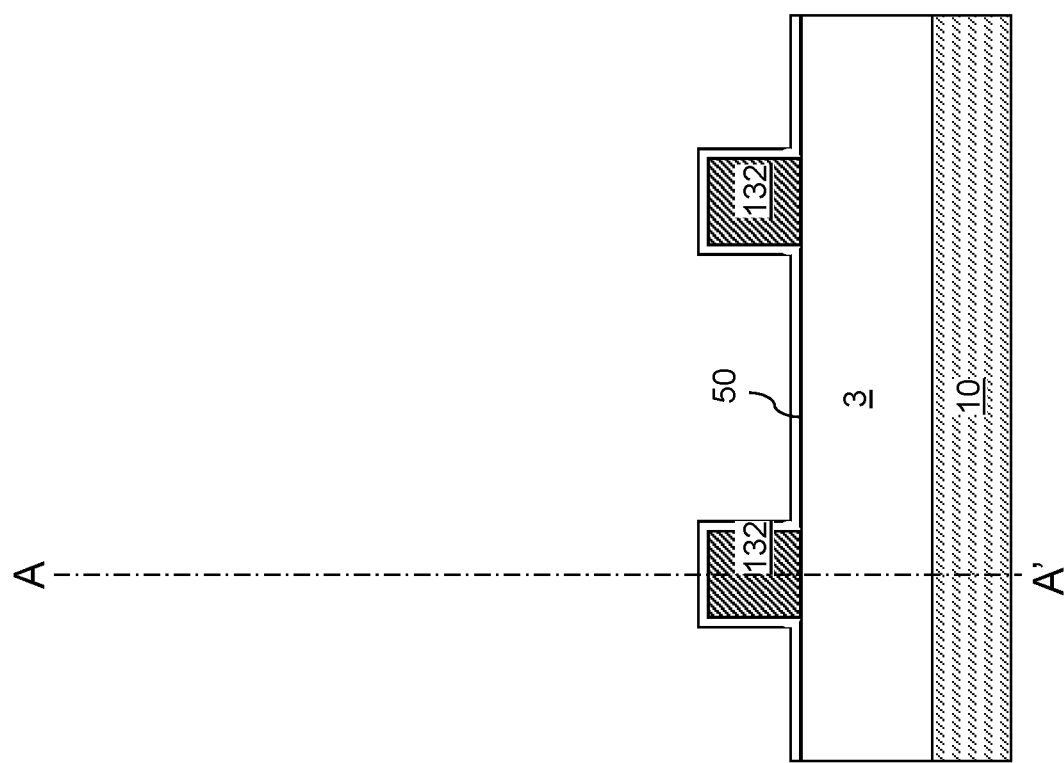

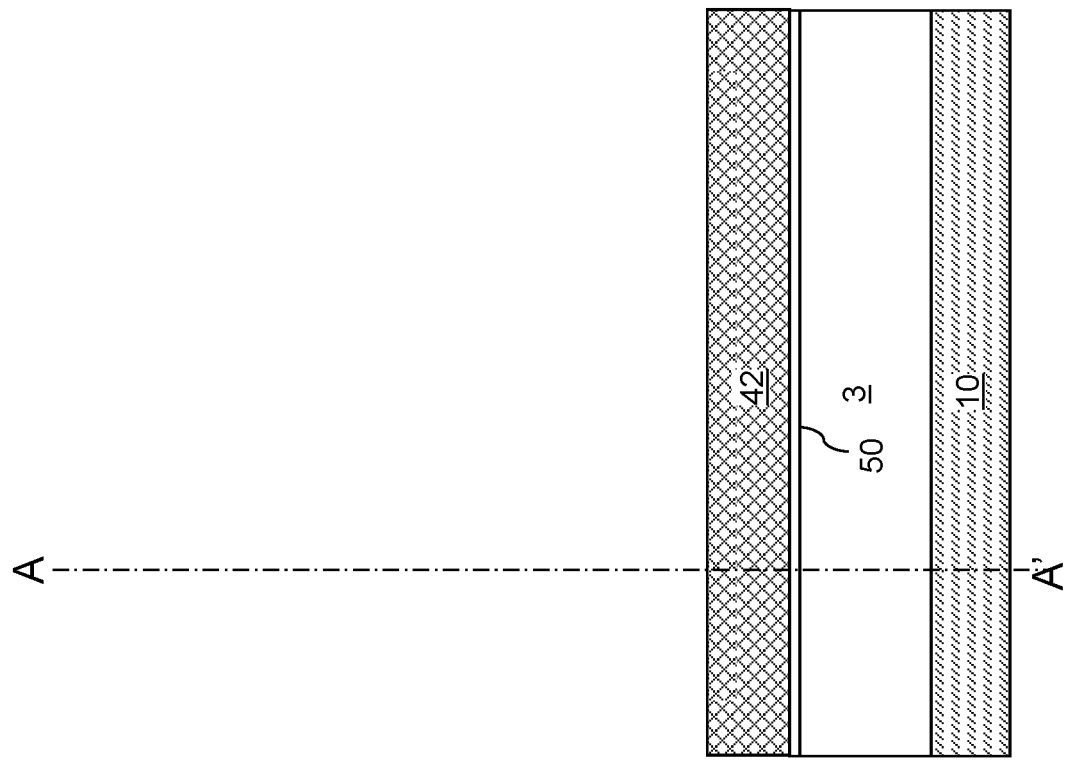
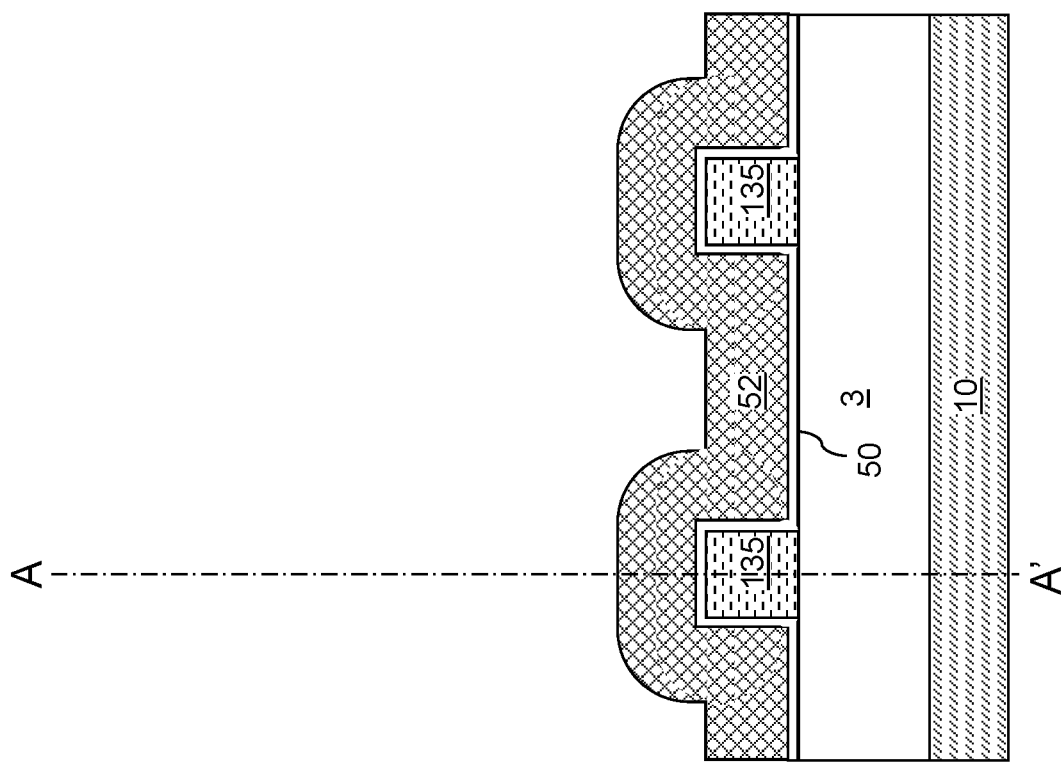
FIG. 13E
FIG. 13F

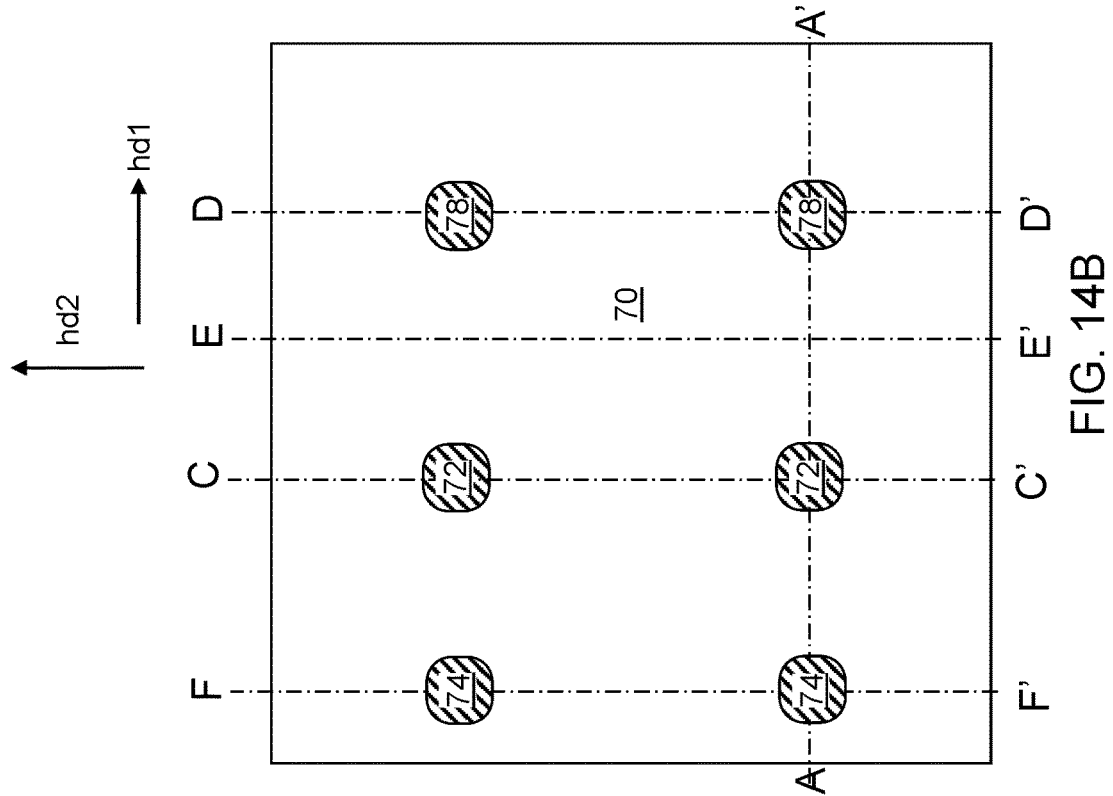
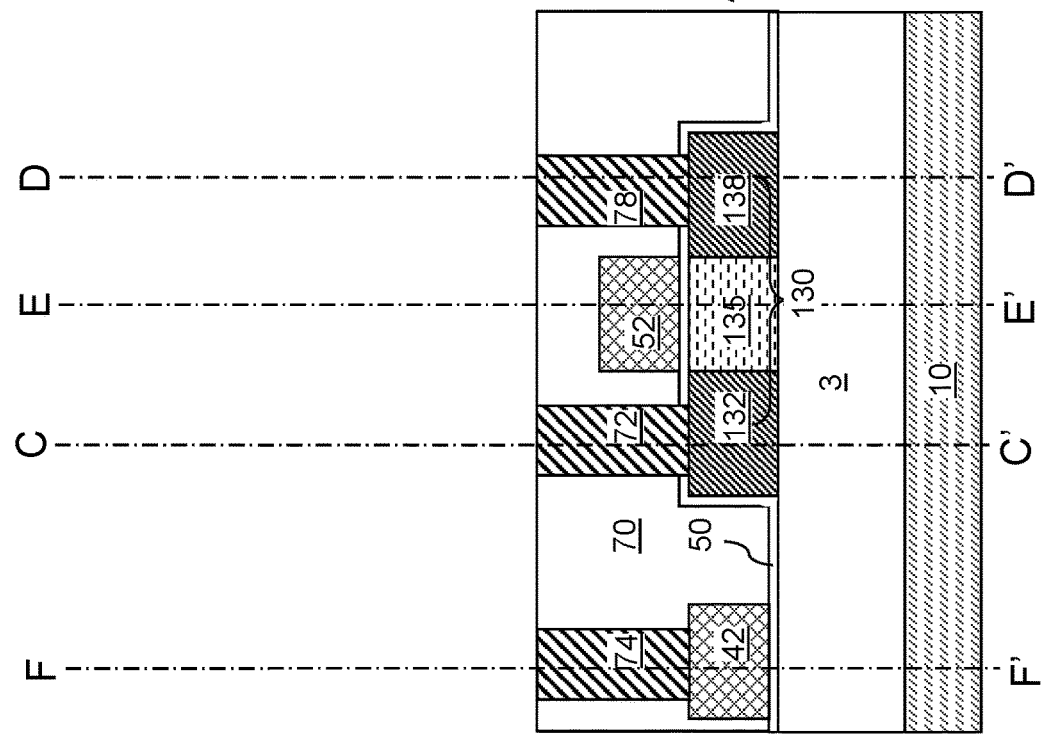
FIG. 14B
FIG. 14A

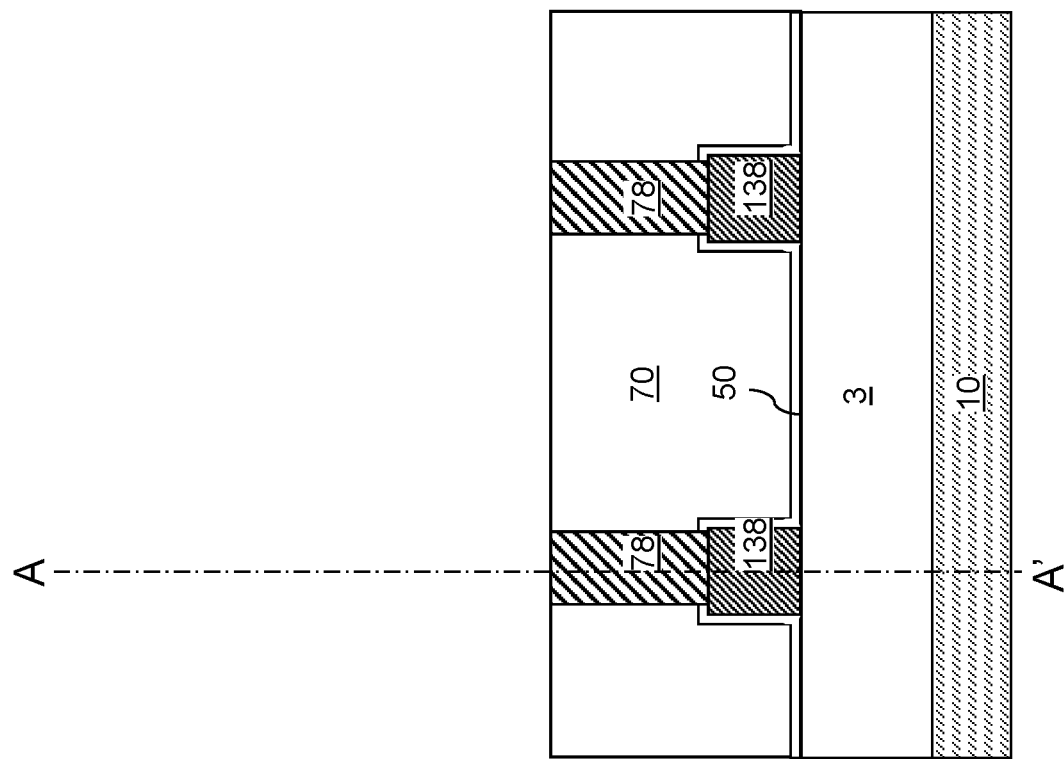
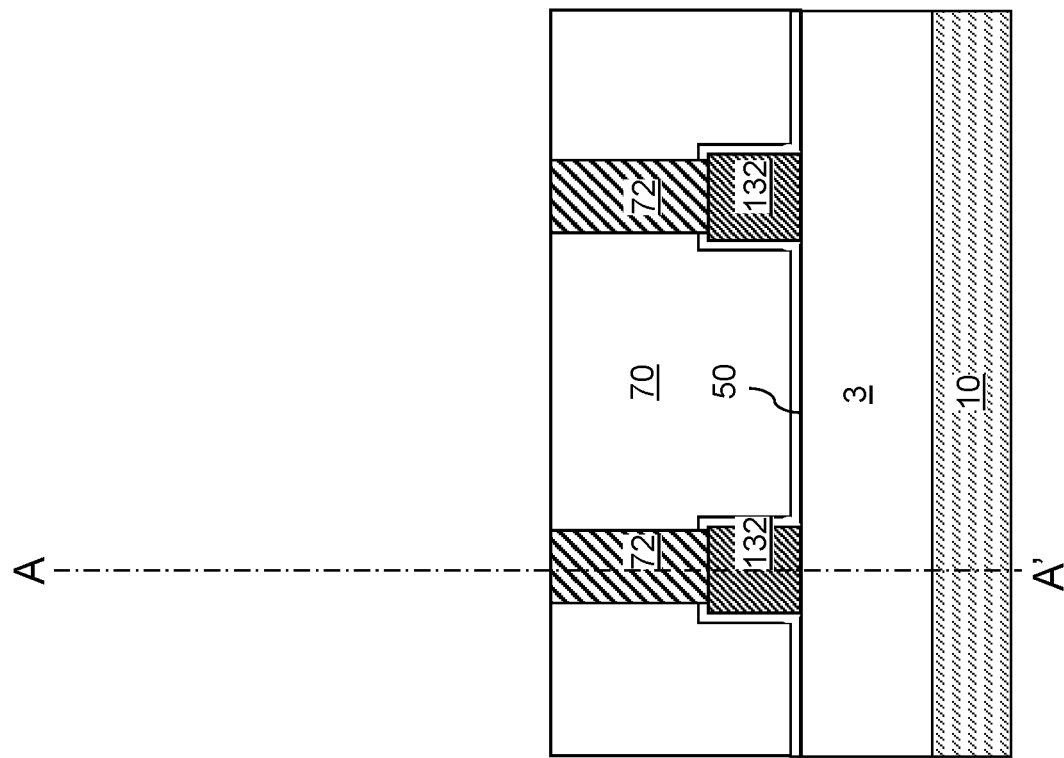

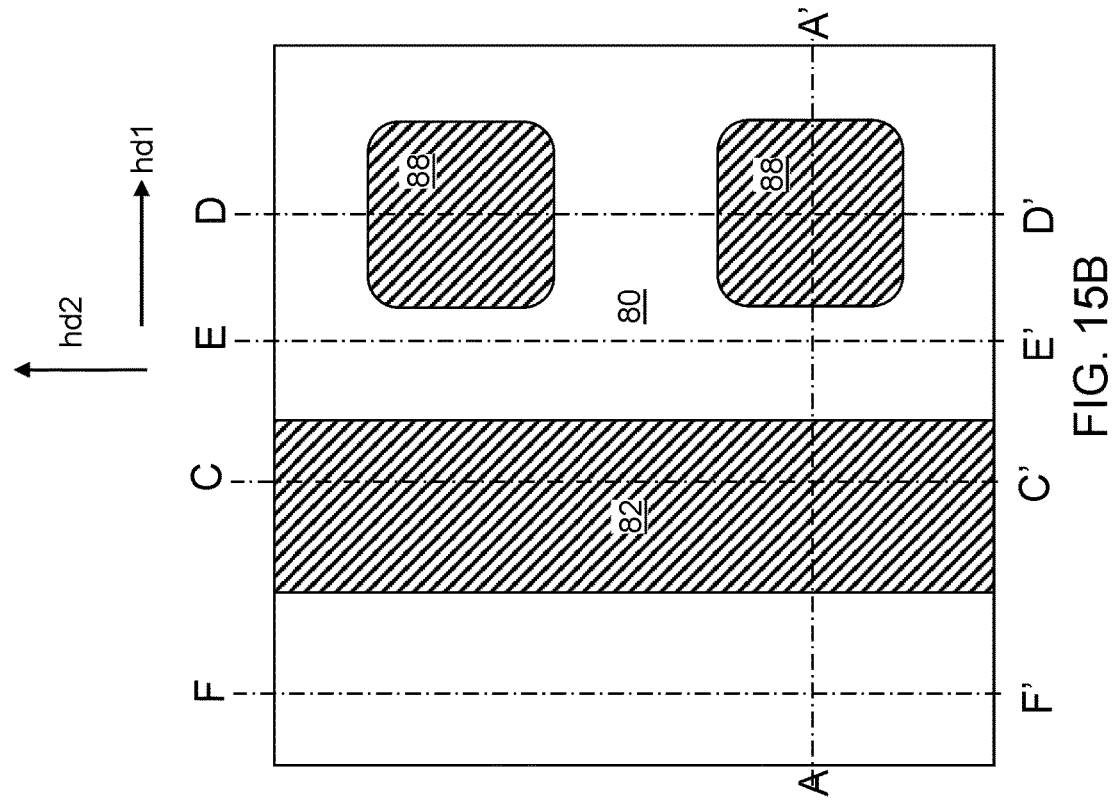
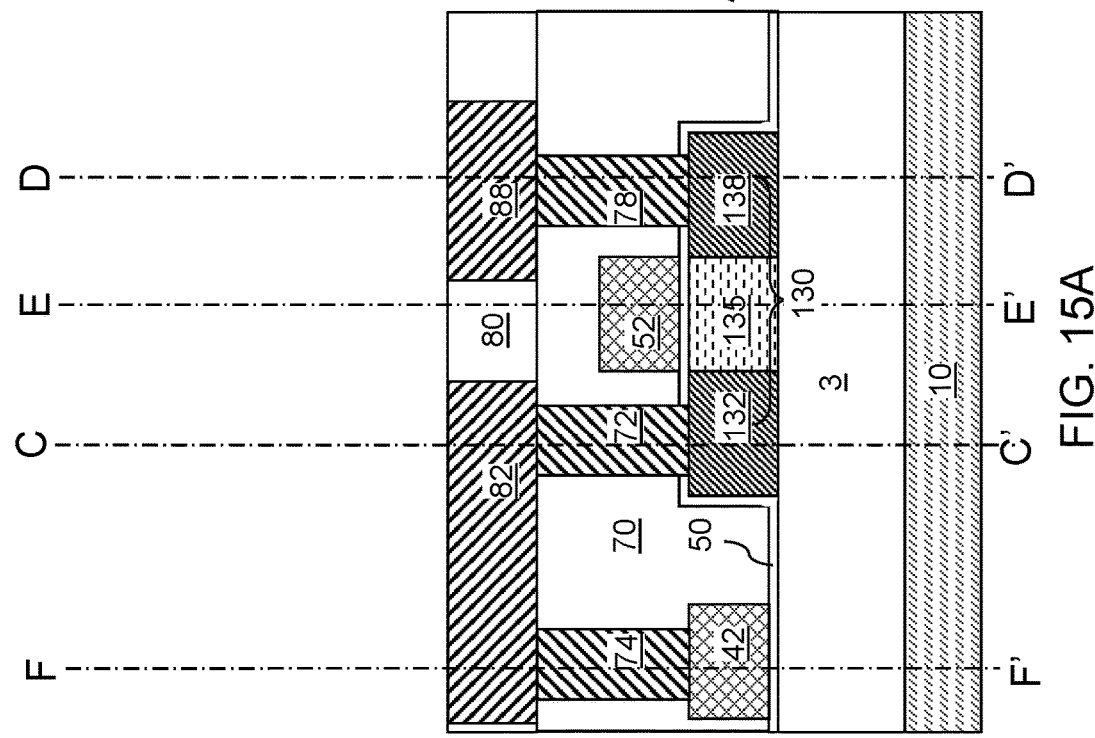

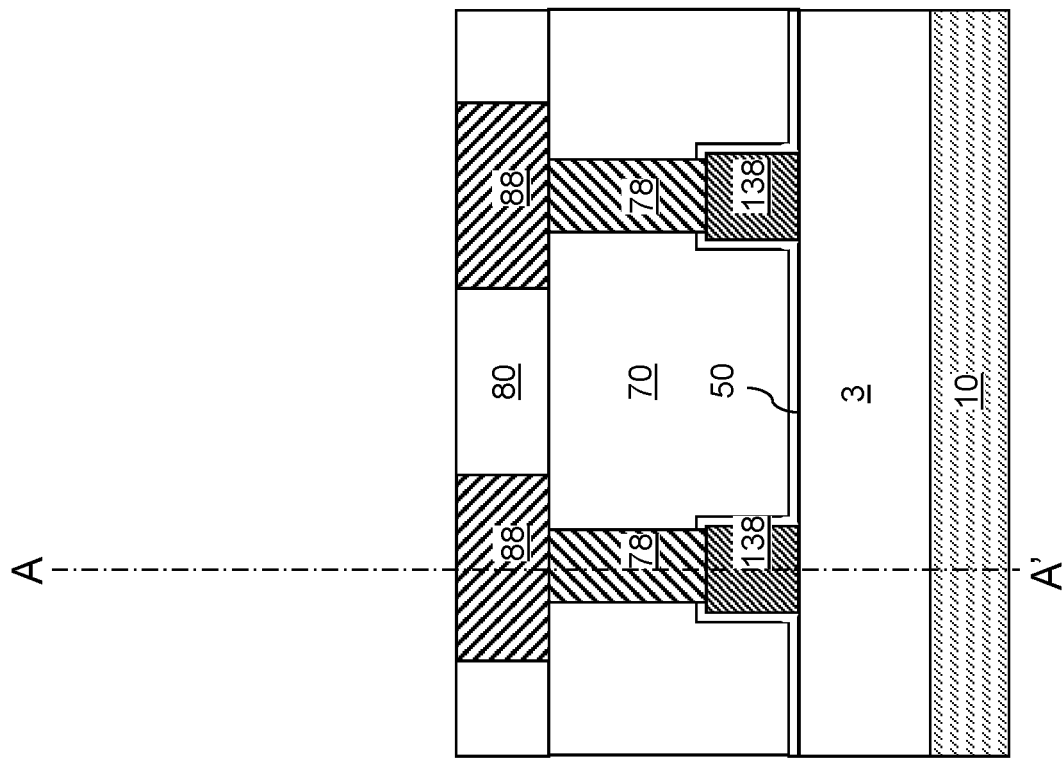
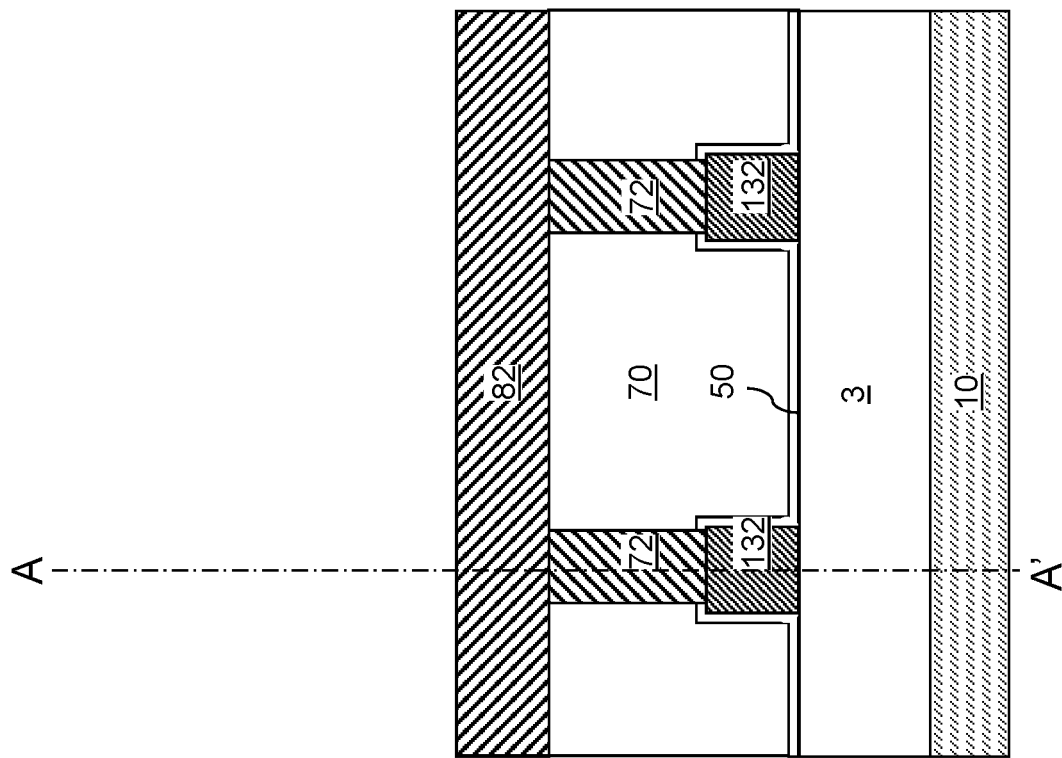

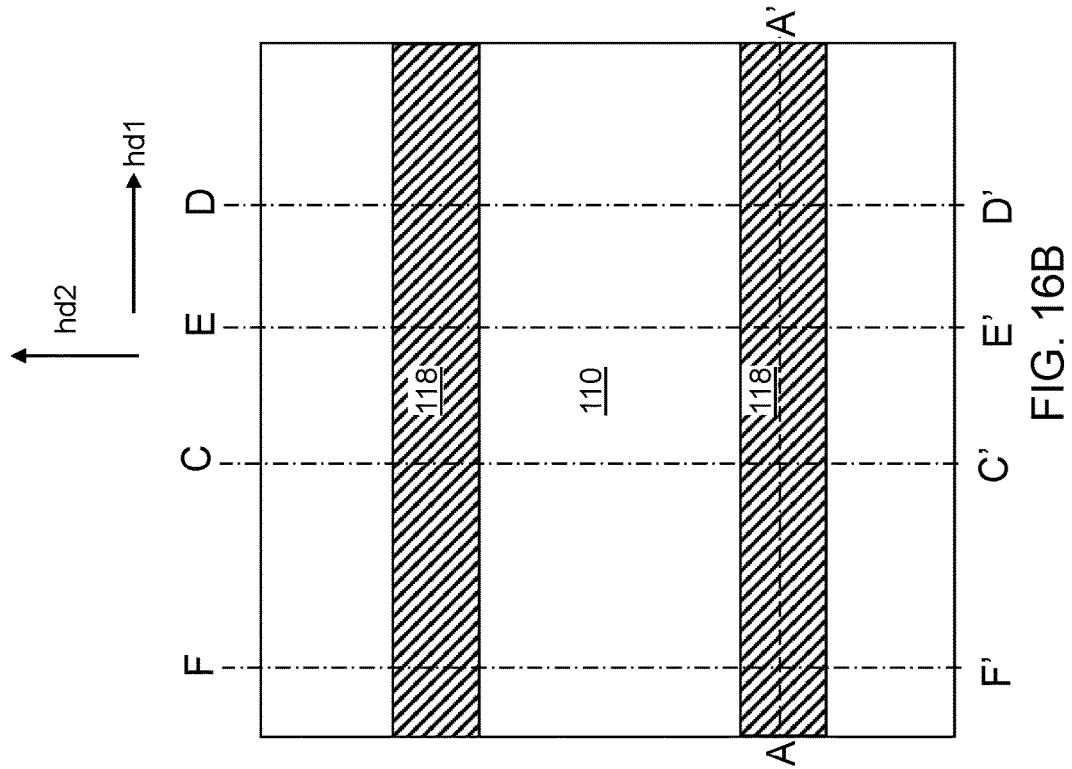
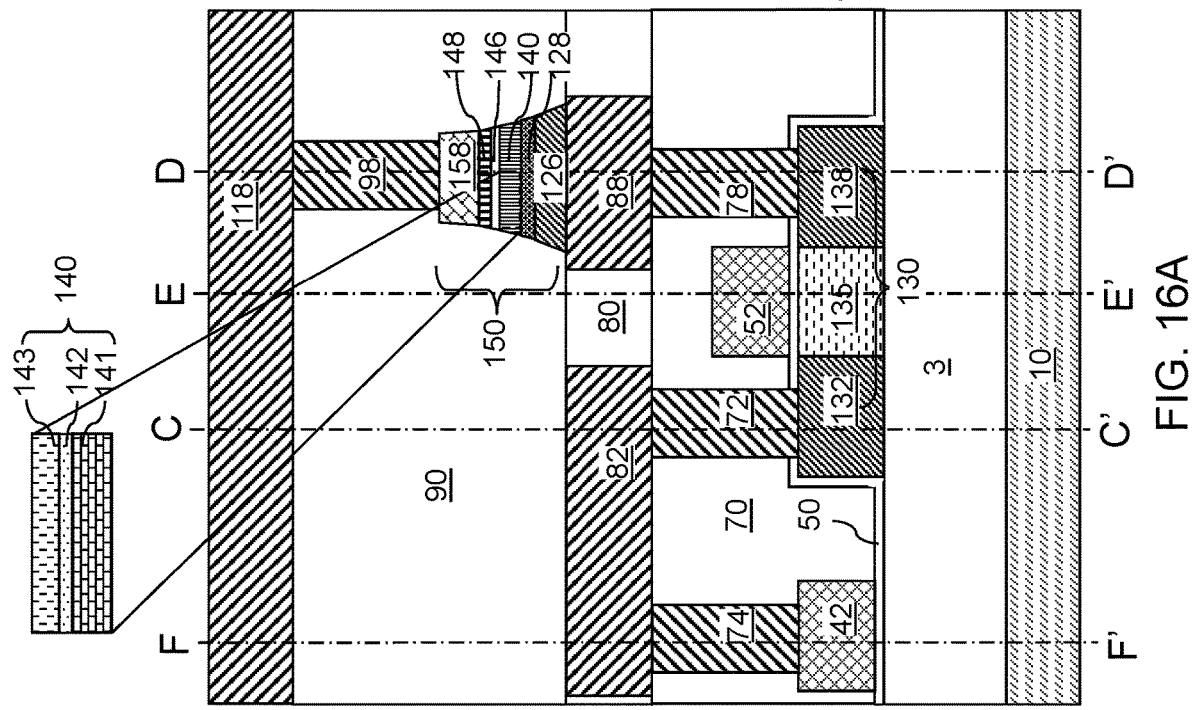
FIG. 16A                    FIG. 16B

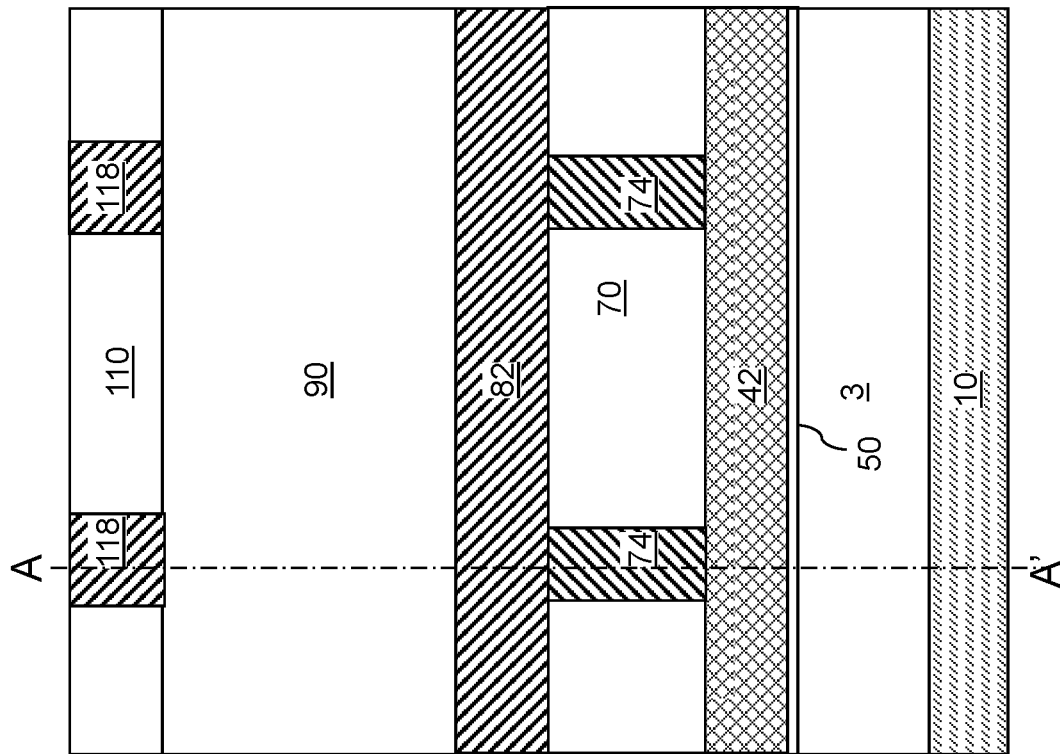
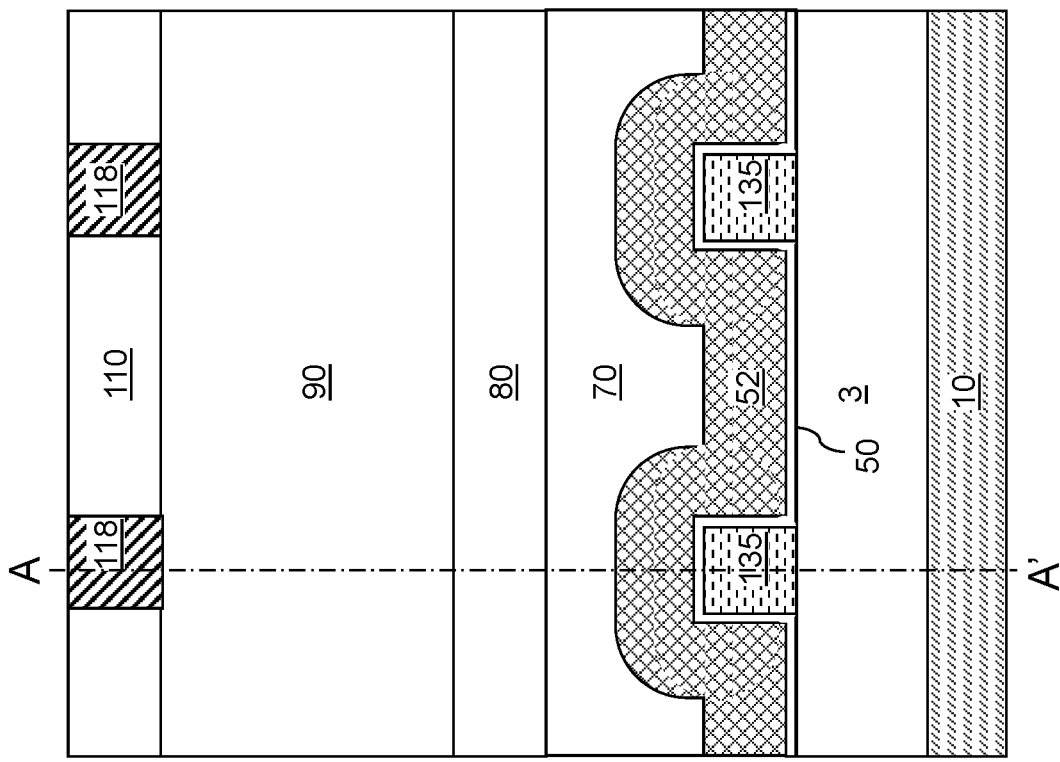
FIG. 16E
FIG. 16F

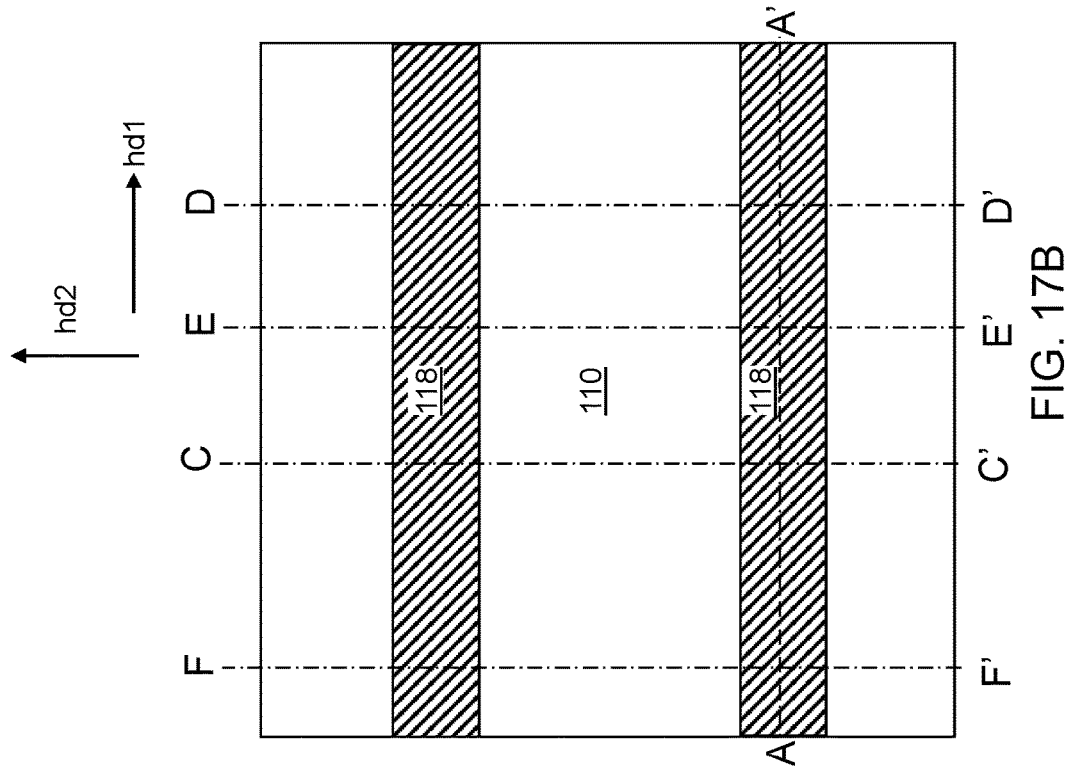
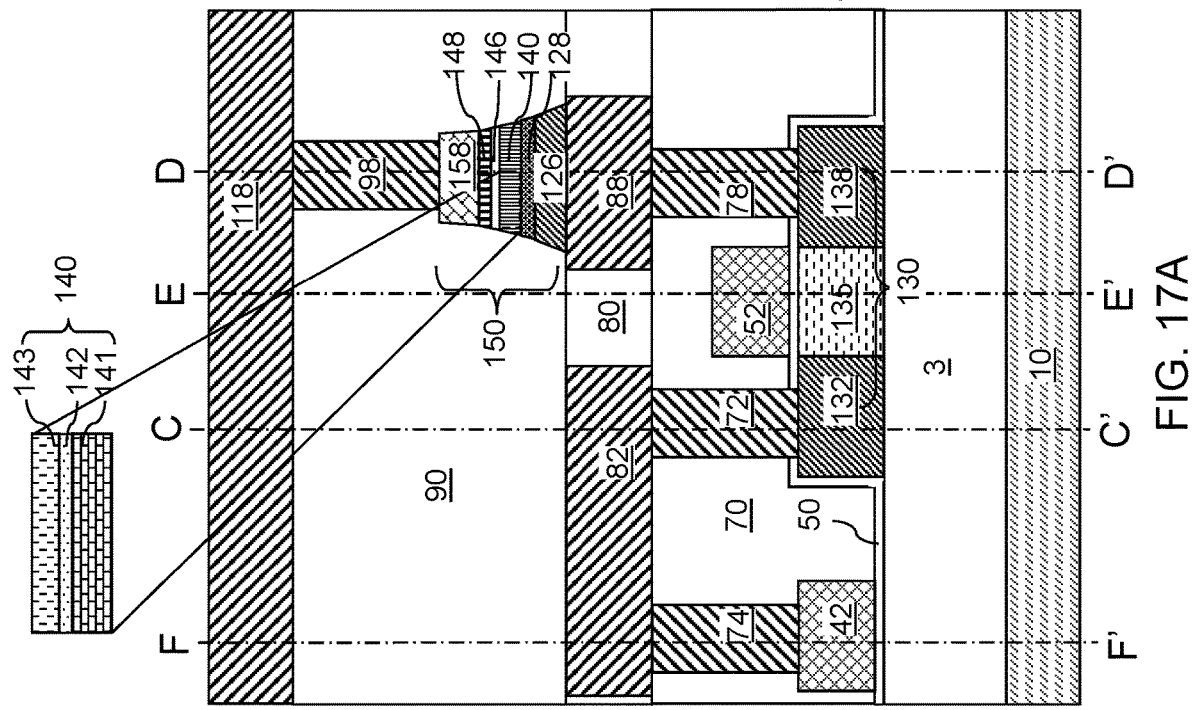
FIG. 17A
FIG. 17B

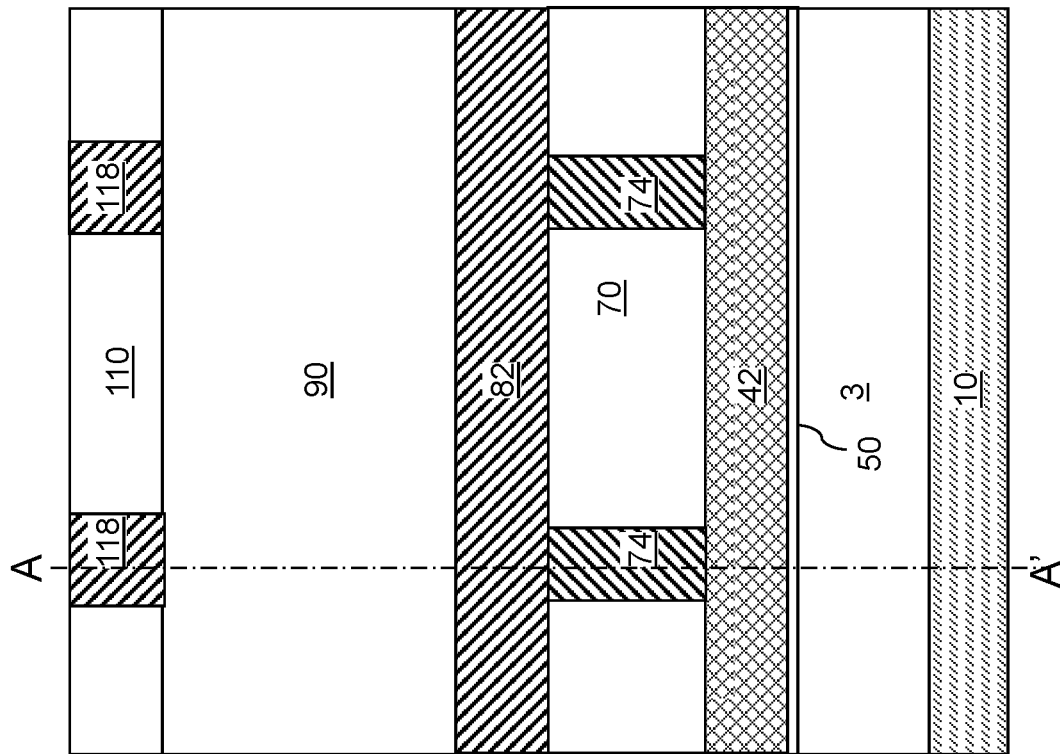
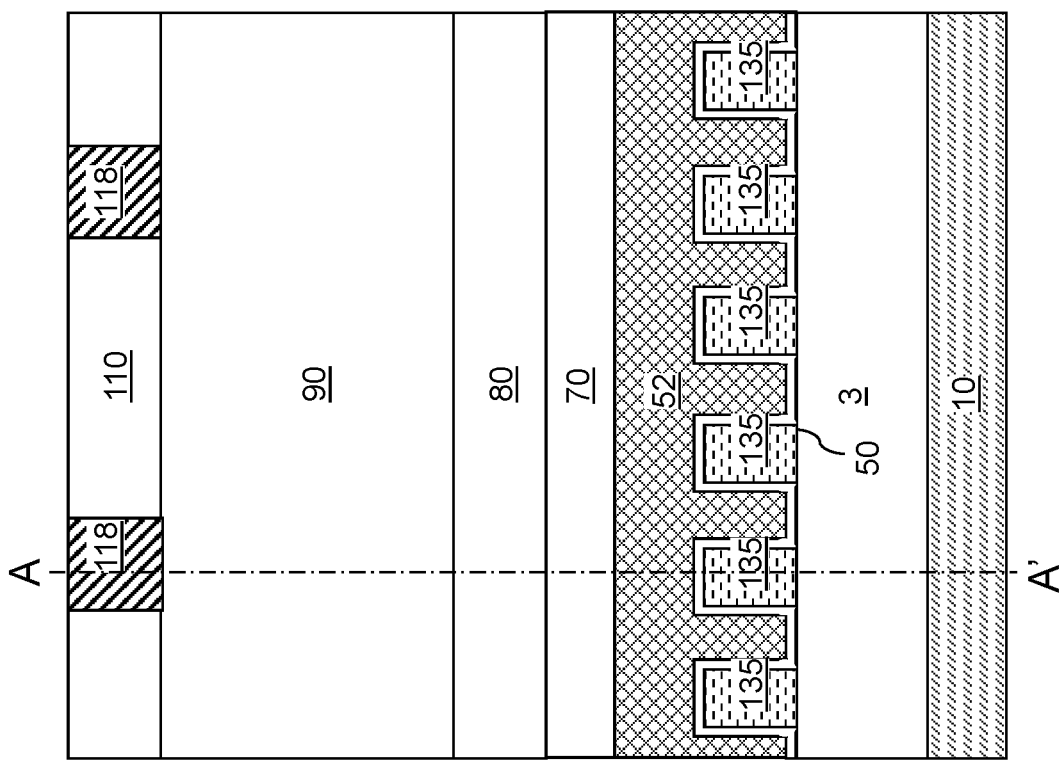
FIG. 17E
FIG. 17F

MEMORY DEVICE INCLUDING A SEMICONDUCTING METAL OXIDE FIN TRANSISTOR AND METHODS OF FORMING THE SAME

RELATED APPLICATIONS

This application claims the benefit of priority from U.S. Provisional Application No. 63/045,289 entitled "FinFET Type IGZO TFT as embedded MRAM Selector", filed on Jun. 29, 2000, the entire contents of which are hereby incorporated by reference for all purposes.

BACKGROUND

A memory cell uses an access transistor that controls the electrical current through the memory cell. As semiconductor devices scale to smaller dimensions, integrating access transistors capable of handling sufficient electrical current into the limited area of a semiconductor die becomes more difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a vertical cross-sectional view of the portion of the memory array region in the first configuration after formation of a gate electrode material layer according to an embodiment of the present disclosure.

FIG. 4B is a top-down view of the portion of the memory array region of FIG. 4A. The vertical plane A-A' is the plane of the vertical cross-section of FIG. 4A.

FIG. 4C is a vertical cross-sectional view of the portion of the memory array region along the vertical plane C-C' of FIG. 4B.

FIG. 4D is a vertical cross-sectional view of the portion of the memory array region along the vertical plane D-D' of FIG. 4B.

FIG. 5A is a vertical cross-sectional view of the portion of the memory array region in the first configuration after formation of a gate electrode strip according to an embodiment of the present disclosure.

FIG. 5B is a top-down view of the portion of the memory array region of FIG. 5A. The vertical plane A-A' is the plane of the vertical cross-section of FIG. 5A.

FIG. 6A is a vertical cross-sectional view of the portion of the memory array region in the first configuration after removal of a photoresist layer and formation of source regions and drain regions according to an embodiment of the present disclosure.

FIG. 6B is a top-down view of the portion of the memory array region of FIG. 6A. The vertical plane A-A' is the plane of the vertical cross-section of FIG. 6A.

FIG. 6E is a vertical cross-sectional view of the portion of the memory array region along the vertical plane E-E' of FIG. 6B.

FIG. 7A is a vertical cross-sectional view of the portion of the memory array region in the first configuration after formation of an access-level dielectric material layer, drain contact via structures, and source contact via structures according to an embodiment of the present disclosure.

FIG. 7B is a top-down view of the portion of the memory array region of FIG. 7A. The vertical plane A-A' is the plane of the vertical cross-section of FIG. 7A.

FIG. 7C is a vertical cross-sectional view of the portion of the memory array region along the vertical plane C-C' of FIG. 7B.

FIG. 7D is a vertical cross-sectional view of the portion of the memory array region along the vertical plane D-D' of FIG. 7B.

FIG. 8A is a vertical cross-sectional view of the portion of the memory array region in the first configuration after formation of a source line and metal plates according to an embodiment of the present disclosure.

FIG. 8B is a top-down view of the portion of the memory array region of FIG. 8A. The vertical plane A-A' is the plane of the vertical cross-section of FIG. 8A.

FIG. 8C is a vertical cross-sectional view of the portion of the memory array region along the vertical plane C-C' of FIG. 8B.

FIG. 8D is a vertical cross-sectional view of the portion of the memory array region along the vertical plane D-D' of FIG. 8B.

FIG. 9A is a vertical cross-sectional view of the portion of the memory array region in the first configuration after formation of memory cells according to an embodiment of the present disclosure.

FIG. 9B is a top-down view of the portion of the memory array region of FIG. 9A. The vertical plane A-A' is the plane of the vertical cross-section of FIG. 9A.

FIG. 9E is a vertical cross-sectional view of the portion of the memory array region along the vertical plane E-E' of FIG. 9B.

FIG. 10A is a vertical cross-sectional view of the portion of the memory array region in the first configuration after formation of a memory-level dielectric material layer and memory cell contact via structures according to an embodiment of the present disclosure.

FIG. 10B is a top-down view of the portion of the memory array region of FIG. 10A. The vertical plane A-A' is the plane of the vertical cross-section of FIG. 10A.

FIG. 10E is a vertical cross-sectional view of the portion of the memory array region along the vertical plane E-E' of FIG. 10B.

FIG. 12A is a vertical cross-sectional view of the portion of the memory array region in a second configuration after formation of a gate electrode strip and an auxiliary source line according to an embodiment of the present disclosure.

FIG. 12B is a top-down view of the portion of the memory array region of FIG. 12A. The vertical plane A-A' is the plane of the vertical cross-section of FIG. 12A.

FIG. 12C is a vertical cross-sectional view of the portion of the memory array region along the vertical plane C-C' of FIG. 12B.

FIG. 12D is a vertical cross-sectional view of the portion of the memory array region along the vertical plane D-D' of FIG. 12B.

FIG. 13A is a vertical cross-sectional view of the portion of the memory array region in the second configuration after removal of a photoresist layer and formation of source regions and drain regions according to an embodiment of the present disclosure.

FIG. 13B is a top-down view of the portion of the memory array region of FIG. 13A. The vertical plane A-A' is the plane of the vertical cross-section of FIG. 13A.

FIG. 13C is a vertical cross-sectional view of the portion of the memory array region along the vertical plane C-C' of FIG. 13B.

FIG. 13D is a vertical cross-sectional view of the portion of the memory array region along the vertical plane D-D' of FIG. 13B.

FIG. 13E is a vertical cross-sectional view of the portion of the memory array region along the vertical plane E-E' of FIG. 13B.

FIG. 13F is a vertical cross-sectional view of the portion of the memory array region along the vertical plane F-F' of FIG. 13B.

FIG. 14A is a vertical cross-sectional view of the portion of the memory array region in the second configuration after formation of an access-level dielectric material layer, drain contact via structures, source contact via structures, and source connection via structures according to an embodiment of the present disclosure.

FIG. 14B is a top-down view of the portion of the memory array region of FIG. 14A. The vertical plane A-A' is the plane of the vertical cross-section of FIG. 14A.

FIG. 14C is a vertical cross-sectional view of the portion of the memory array region along the vertical plane C-C' of FIG. 14B.

FIG. 14D is a vertical cross-sectional view of the portion of the memory array region along the vertical plane D-D' of FIG. 14B.

FIG. 15A is a vertical cross-sectional view of the portion of the memory array region in the second configuration after formation of a source line and metal plates according to an embodiment of the present disclosure.

FIG. 15B is a top-down view of the portion of the memory array region of FIG. 15A. The vertical plane A-A' is the plane of the vertical cross-section of FIG. 15A.

FIG. 15C is a vertical cross-sectional view of the portion of the memory array region along the vertical plane C-C' of FIG. 15B.

FIG. 15D is a vertical cross-sectional view of the portion of the memory array region along the vertical plane D-D' of FIG. 15B.

FIG. 16A is a vertical cross-sectional view of the portion of the memory array region in the second configuration after formation of a memory-level dielectric material layer and memory cell contact via structures according to an embodiment of the present disclosure.

FIG. 16B is a top-down view of the portion of the memory array region of FIG. 16A. The vertical plane A-A' is the plane of the vertical cross-section of FIG. 16A.

FIG. 16E is a vertical cross-sectional view of the portion of the memory array region along the vertical plane E-E' of FIG. 16B.

FIG. 16F is a vertical cross-sectional view of the portion of the memory array region along the vertical plane F-F' of FIG. 16B.

FIG. 17A is a vertical cross-sectional view of a portion of the memory array region in another alternative configuration after formation of a memory-level dielectric material layer and memory cell contact via structures according to an embodiment of the present disclosure.

FIG. 17B is a top-down view of the portion of the memory array region of FIG. 17A. The vertical plane A-A' is the plane of the vertical cross-section of FIG. 17A.

FIG. 17E is a vertical cross-sectional view of the portion of the memory array region along the vertical plane E-E' of FIG. 17B.

FIG. 17F is a vertical cross-sectional view of the portion of the memory array region along the vertical plane E-E' of FIG. 17B.

DETAILED DESCRIPTION

Figure 1A:
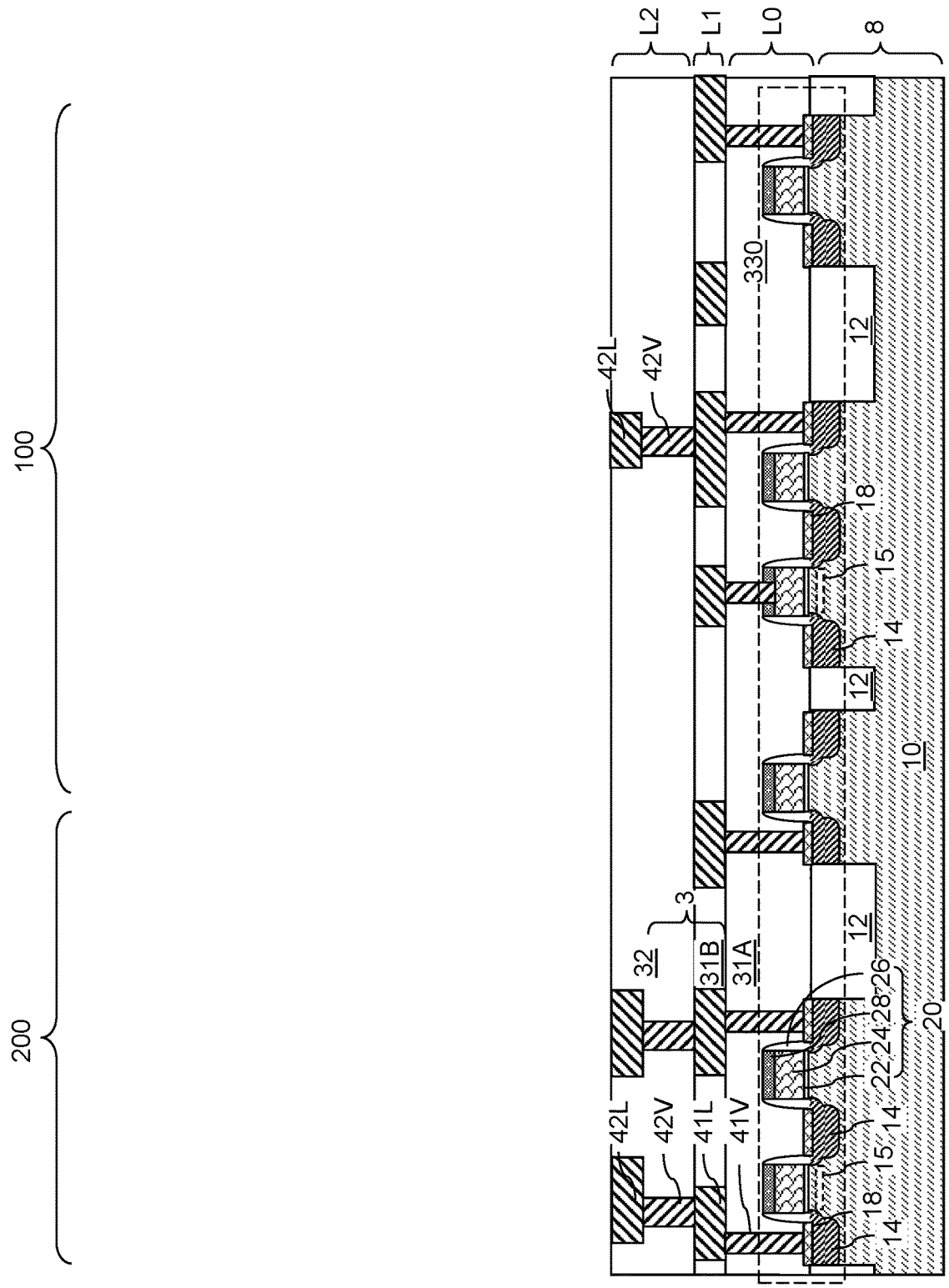
FIG. 1A is a vertical cross-sectional view of an exemplary structure prior to formation of a two-dimensional array of memory devices according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to a memory device incorporating a semiconducting metal oxide fin transistor and methods of manufacturing the same, the various aspects of which are now described in detail.

According to an aspect of the present disclosure, a semiconductor device of the present disclosure integrates a semiconducting metal oxide fin transistor as an access transistor for a memory cell in a back-end-of-line (BEOL) metal wiring level. A series connection of the access transistor and the memory cell may be provided between a bit line and a source line. Further, a gate electrode may control switching of the semiconducting metal oxide fin transistor. Each of the source lines, bit lines, and the gate lines may be controlled by field effect transistors that may be formed on a single crystalline semiconductor layer in a semiconductor substrate that underlies the semiconducting metal oxide fin transistor and the memory cell. Metal interconnect structures may provide electrical connection between the field effect transistors that are formed on the single crystalline semiconductor layer and the bit line, the source line, and the gate electrode. The semiconducting metal oxide fin transistor and the memory cell may be formed directly above the area of the underlying field effect transistor. Thus, the area of a semiconductor die may be efficiently utilized for high density device packing. A two-dimensional array of memory cell-access transistor assemblies may be formed in a BEOL metal interconnect level such that each memory cell is individually addressable through activating a respective source line, a respective bit line, and a respective gate electrode.

Figure 1C:
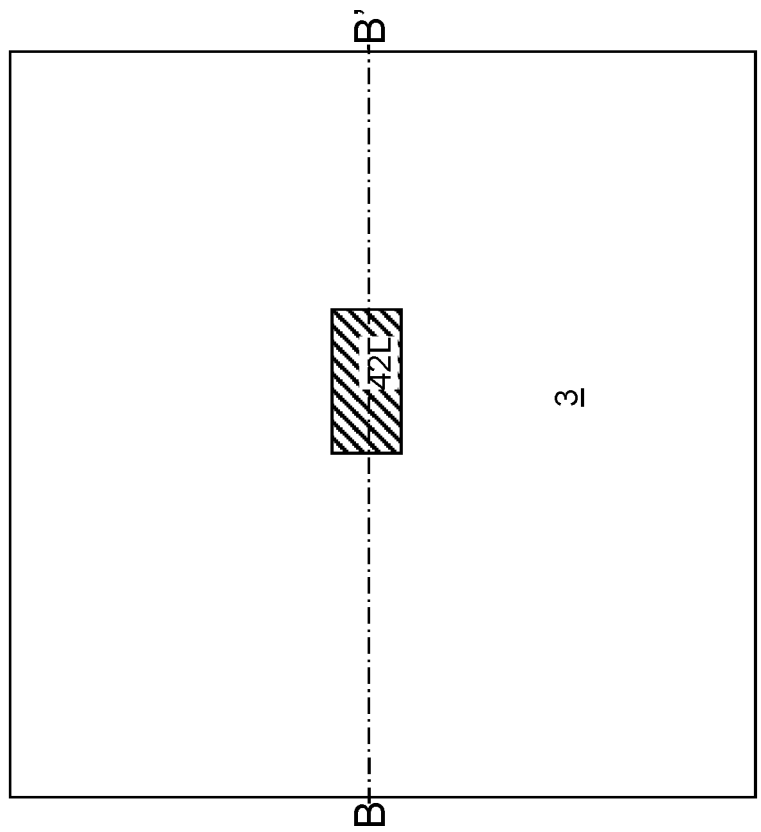
FIG. 1C is a top-down view of the portion of the memory array region of FIG. 1B. The vertical plane B-B' is the plane of the vertical cross-section of FIG. 1A.
Figure 1B:
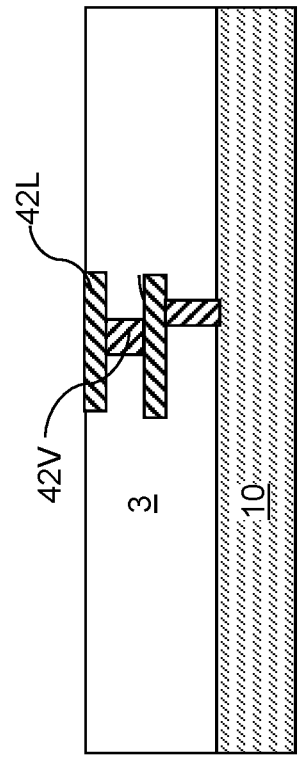
FIG. 1B is a vertical cross-sectional view of a portion of the memory array region of the exemplary structure of FIG. 1A.

Referring to FIGS. 1A-1C, an exemplary structure according to an embodiment of the present disclosure is illustrated. FIG. 1A is a vertical cross-sectional view of the exemplary structure, FIG. 1B is a magnified view of a portion of the memory array region 100 of the exemplary structure of FIG. 1A, and FIG. 1C is a top-down view of the portion of the memory array region of FIG. 1B.

The exemplary structure illustrated in FIGS. 1A-1C includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 100 in which at least one array of memory cell-access transistor assemblies may be subsequently formed, and a peripheral region 200 in which electrical connections between each array of memory cell-access transistor assemblies and a peripheral circuit including field effect transistors on the semiconductor material layer 10 may be subsequently formed. Areas of the memory array region 100 and the peripheral region 200 may be used to form various elements of the peripheral circuit.

Semiconductor devices such as field effect transistors may be formed on, and/or in, the semiconductor material layer 10. For example, shallow trench isolation structures 12 may be formed in an upper portion of the semiconductor material layer 10 by forming shallow trenches and subsequently filling the shallow trenches with a dielectric material such as silicon oxide. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a dielectric gate cap 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed using the gate structures 20 as self-aligned implantation masks to form deep source/drain regions, which may include deep source regions and deep drain regions. Upper portions of the deep source/drain regions may overlap with portions of the extension implantation regions. Each combination of an extension implantation region and a deep source/drain region constitutes a source/drain region 14, which may be a source region or a drain region depending on electrical biasing. A semiconductor channel 15 may be formed underneath each gate stack (22, 24, 28) between a neighboring pair of source/drain regions 14. Metal-semiconductor alloy regions 18 may be formed on the top surface of each source/drain region 14. Field effect transistors may be formed on the semiconductor material layer 10. Each field effect transistor may include a gate structure 20, a semiconductor channel 15, a pair of source/drain regions 14 (one of which functions as a source region and another of which functions as a drain region), and optional metal-semiconductor alloy regions 18. In some embodiments, a source/drain region 14 may be formed as a raised source/drain region. A complementary metal-oxide-semiconductor (CMOS) circuit 330 may be provided on the semiconductor material layer 10, which may include a periphery circuit for the array(s) of memory cell-access transistor assemblies to be subsequently formed. Planar transistors included in the circuit 330 are typically formed in the front end of line (FEOL) of production. These planar transistors tend to occupy large portions of the substrate area. While such planar transistors may provide sufficient current to drive subsequently formed memory cells, the sizing dimensions of such FEOL planar transistors tend to limit high density performance.

According to an embodiment of the present disclosure, the semiconductor material layer 10 may be a single crystalline semiconductor layer such as a single crystalline silicon layer. In this embodiment, the field effect transistors formed on the single crystalline semiconductor layer may comprise a respective single crystalline semiconductor channel. The single crystalline semiconductor channel of each field effect transistor formed on the semiconductor material layer 10 may include a patterned portion of the semiconductor material layer 10, or may include a portion of a single crystalline semiconductor material that is epitaxially grown from the semiconductor material layer 10. Generally, field effect transistors using a single crystalline semiconductor channel may provide superior on-off current ratios because the leakage current through a single crystalline semiconductor material is low while the single crystalline semiconductor material provides high charge carrier mobility that increases the on current. While planar field effect transistors including a respective horizontal semiconductor channel are illustrated in FIG. 1A, embodiments are expressly contemplated herein in which field effect transistors of different configurations are used, which may include, for example, one or more of fin field effect transistors, gate-all-around field effect transistors, nanowire field effect transistors, vertical field effect transistors, or other field effect transistors using a respective single crystalline semiconductor channel. These field effect transistors of different configurations may be formed in a BEOL position and may reduce the area used to form such transistors. Thus, use of such field effect transistors of different configurations may improve device density while maintaining the ability to provide sufficient operating current to memory cells.

The peripheral circuit including the field effect transistors may be configured to drive source lines, drain lines, and word lines of the array of memory cell-access transistor assemblies to be subsequently formed in the memory array region. The word lines may comprise gate electrode strips to be subsequently formed. As such, the peripheral circuit may include bit line drivers, source line drivers, word line drivers, a power regulator circuit, sense amplifiers, input/output (I/O) control circuits, and various buffer devices. According to an aspect of the present disclosure, the peripheral circuit may be formed not only in the peripheral region 200, but also in the memory array region 100. Thus, the entire area of the peripheral region 200 and the memory array region 100 may be used to place the various components of the peripheral circuit. A subset of the field effect transistors in the peripheral circuit may have an areal overlap with the array of memory cell-access transistor assemblies to be subsequently formed in a plan view, which is a view along a direction perpendicular to the top surface of the substrate 8.

Various interconnect-level structures may be subsequently formed, which are formed prior to formation of an array of memory cell-access transistor assemblies, and are herein referred to as lower interconnect-level structures (L0, L1, L2). In embodiments in which a two-dimensional array of memory cell-access transistor assemblies may be subsequently formed over two levels of interconnect-level structures, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the source/drain regions 14 or the gate electrodes 24 and embedded within the planarization dielectric layer 31A. The first interconnect-level structure L1 may include a first interconnect-level dielectric material layer 31B and first metal lines 41L embedded within the first interconnect-level dielectric material layer 31B. The first interconnect-level dielectric material layer 31B is also referred to as a first line-level dielectric material layer. The first metal lines 41L may contact a respective one of the contact via structures 41V. The second interconnect-level structure L2 includes a second interconnect-level dielectric material layer 32, which may include a stack of a first via-level dielectric material layer and a second line-level dielectric material layer or a line-and-via-level dielectric material layer. The second interconnect-level dielectric material layer 32 embeds second metal interconnect structures (42V, 42L), which includes first metal via structures 42V and second metal lines 42L. Top surfaces of the second metal lines 42L may be coplanar with the top surface of the second interconnect-level dielectric material layer 32.

The set of all dielectric material layers within the lower interconnect-level structures (L0, L1, L2) is herein referred to as at least one lower-level dielectric material layer 3, which may include, for example, the planarization dielectric layer 31A, the first interconnect-level dielectric material layer 31B, and the second interconnect-level dielectric material layer 32. The set of all metal interconnect structures within the lower interconnect-level structures (L0, L1, L2) is herein referred to as first metal interconnect structures (41V, 41L, 42V, 42L), which may include, for example, the contact via structures 41V, the first metal lines 41L, and the second metal interconnect structures (42V, 42L). At least a subset of the first metal interconnect structures (41V, 41L, 42V, 42L) may be electrically connected to a respective one of the field effect transistors in circuit 330.

According to an embodiment of the present disclosure, a subset of the second metal lines 42L may be formed within the area of the memory array region 100. Specifically, the subset of the second metal lines 42L may be formed at locations in which gate electrode strips that include gate electrodes for a respective row of semiconducting metal oxide fin transistors are to be subsequently formed. In this embodiment, a subset of the first metal interconnect structures (41V, 41L, 42V, 42L) may provide an electrically conductive path between each second metal lines 42L formed within the memory array region 100 and a respective node of the field effect transistor located on the semiconductor material layer 10, which may include a node of a word line driver transistor.

It should be understood that formation of an array of memory cell-access transistor assemblies as a component of a third interconnect-level structure overlying the second interconnect-level structure L2 is only for illustrative purposes, and the array of memory cell-access transistor assemblies may be formed at different levels. Such embodiments are expressly contemplated herein.

Figure 2A:
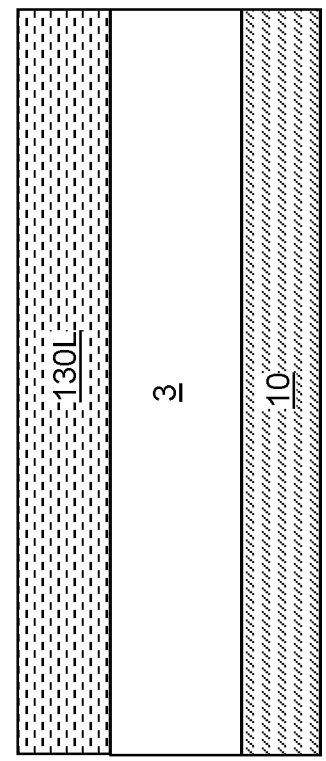
FIG. 2A is a vertical cross-sectional view of the portion of the memory array region in a first configuration after formation of a semiconducting metal oxide material layer according to an embodiment of the present disclosure.
Figure 2B:
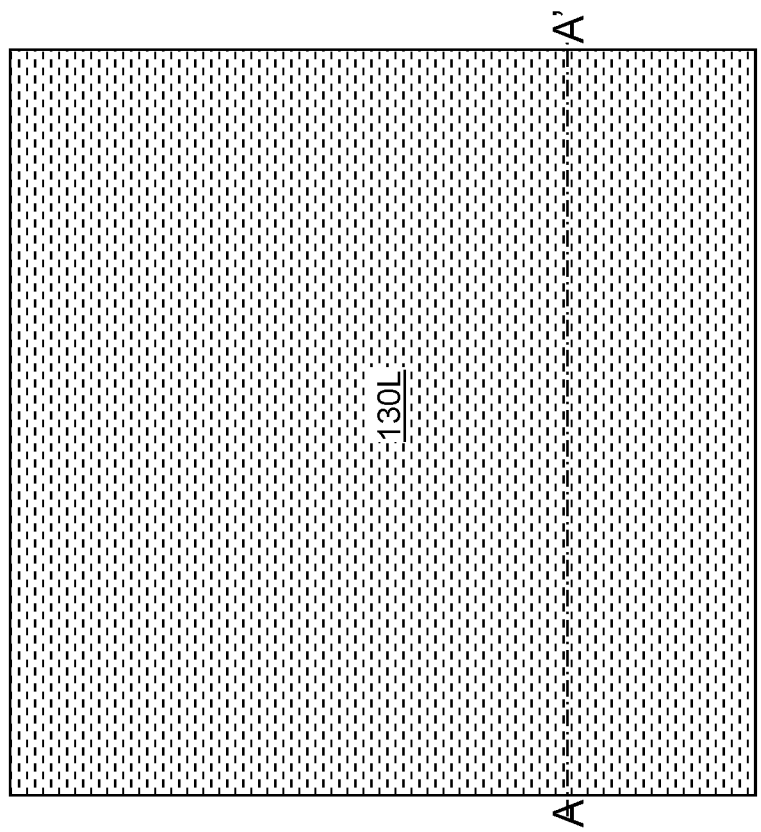
FIG. 2B is a top-down view of the portion of the memory array region of FIG. 2A. The vertical plane A-A' is the plane of the vertical cross-section of FIG. 2A.

Referring to FIGS. 2A and 2B, a portion of the memory array region 100 in a first configuration is illustrated after formation of a semiconducting metal oxide material layer 130L. The semiconducting metal oxide material layer 130L includes a semiconducting metal oxide material, i.e., a metal oxide material that is capable of providing electrical conductivity in a range from 1.0 S/m to $1.0 \times 10^5$ S/m upon suitable doping with electrical dopants (which may be p-type dopants or n-type dopants). In an intrinsic state or under a condition of a low-level electrical doping, a semiconducting metal oxide material may be semiconducting or insulating, and may have electrical conductivity generally in a range from $1.0 \times 10^{-10}$ S/m to $1.0 \times 10$ S/m. Exemplary semiconducting metal oxide materials that may be used for the semiconducting metal oxide material layer 130L include, but are not limited to, indium gallium zinc oxide (IGZO), doped zinc oxide, doped indium oxide, and doped cadmium oxide with a high level of doping. Other suitable semiconducting materials are within the contemplated scope of the present disclosure. In one embodiment, the semiconducting metal oxide material layer 130L may include indium gallium zinc oxide. The semiconducting metal oxide material of the semiconducting metal oxide material layer 130L may be deposited, for example, by physical vapor deposition (i.e., sputtering). The semiconducting metal oxide material of the semiconducting metal oxide material layer 130L may be deposited as a polycrystalline material, or may be deposited as an amorphous material and may be subsequently annealed at an elevated temperature into a polycrystalline material in order to increase the average grain size of the semiconducting metal oxide material. The semiconducting metal oxide material layer 130L may be deposited over, and directly on, a top surface of at least one lower-level dielectric material layer 3 (e.g., second interconnect-level dielectric material layer 32). The thickness of the semiconducting metal oxide material layer 130L may be in a range from 30 nm to 600 nm, such as from 60 nm to 300 nm, although lesser and greater thicknesses may also be used.

Figure 3B:
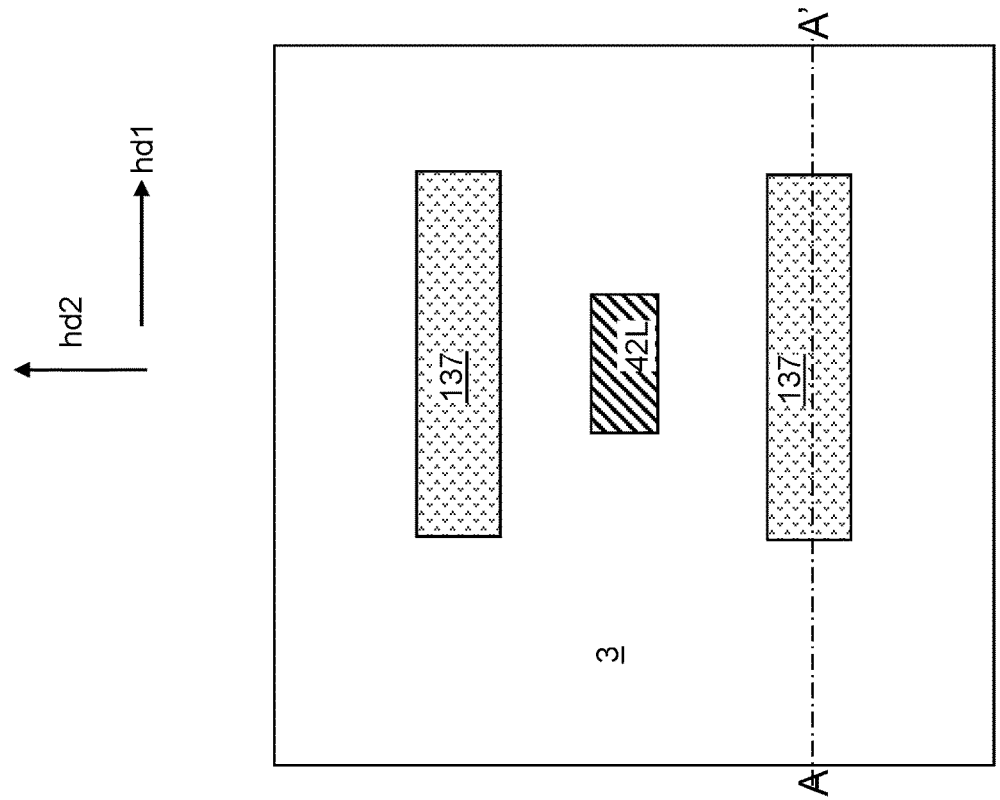
FIG. 3B is a top-down view of the portion of the memory array region of FIG. 3A. The vertical plane A-A' is the plane of the vertical cross-section of FIG. 3A.
Figure 3A:
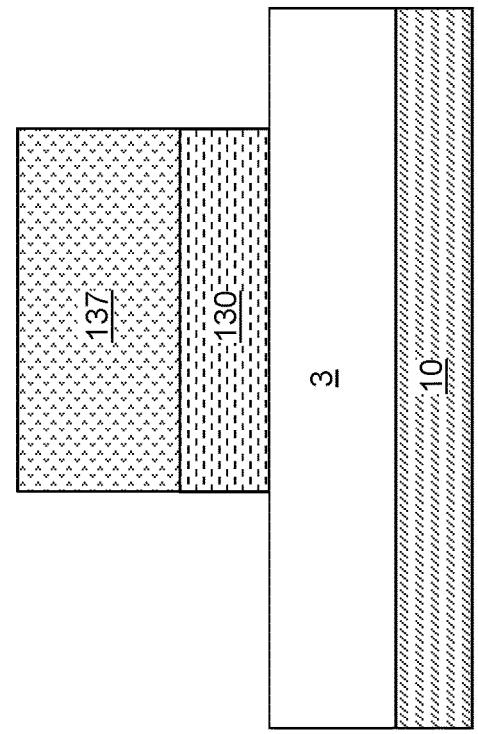
FIG. 3A is a vertical cross-sectional view of the portion of the memory array region after formation of semiconducting metal oxide fins according to an embodiment of the present disclosure.
Figure 5C:
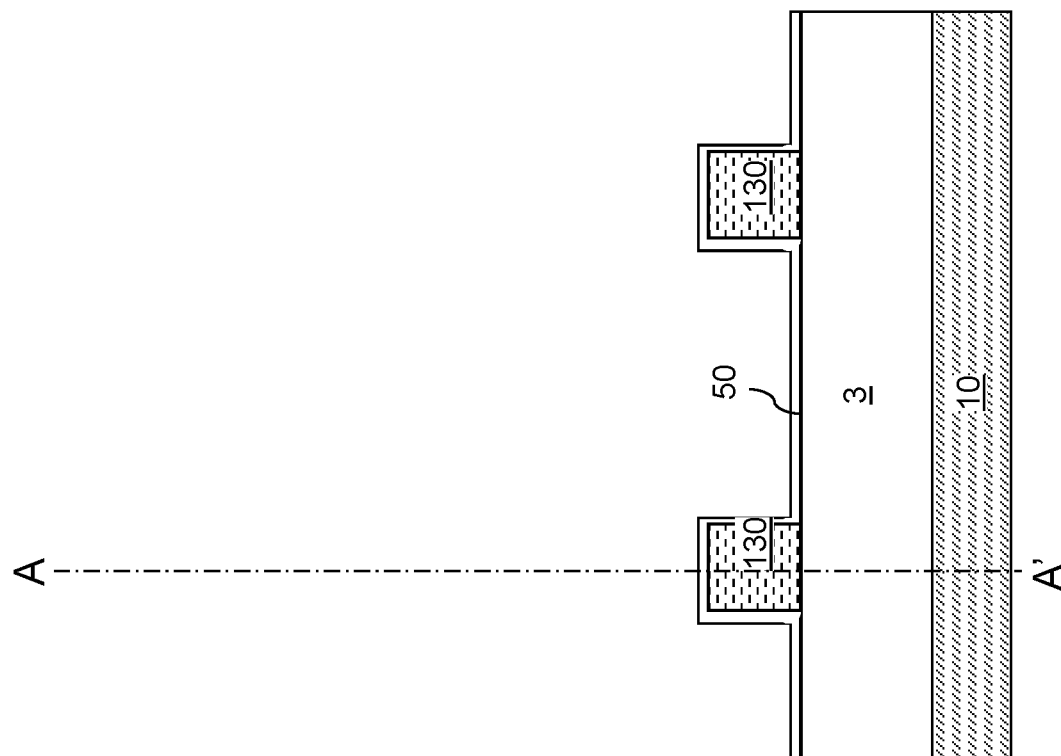
FIG. 5C is a vertical cross-sectional view of the portion of the memory array region along the vertical plane C-C' of FIG. 5B.
Figure 5D:
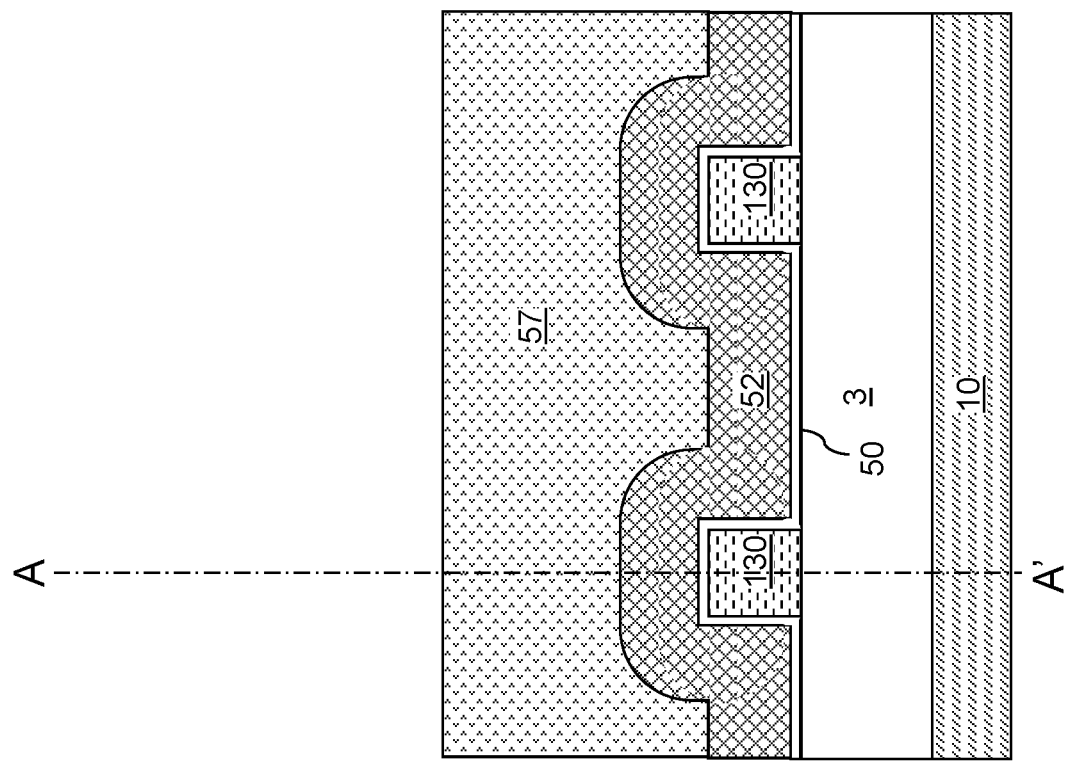
FIG. 5D is a vertical cross-sectional view of the portion of the memory array region along the vertical plane D-D' of FIG. 5B.
Figure 6C:
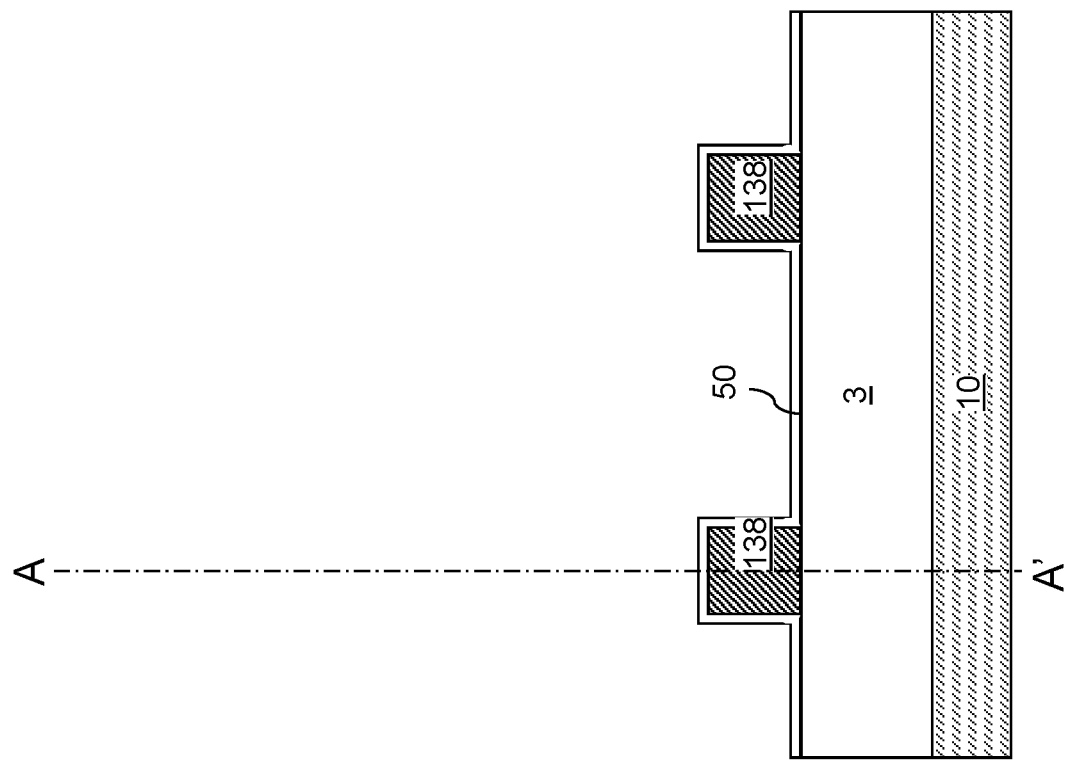
FIG. 6C is a vertical cross-sectional view of the portion of the memory array region along the vertical plane C-C' of FIG. 6B.
Figure 6D:
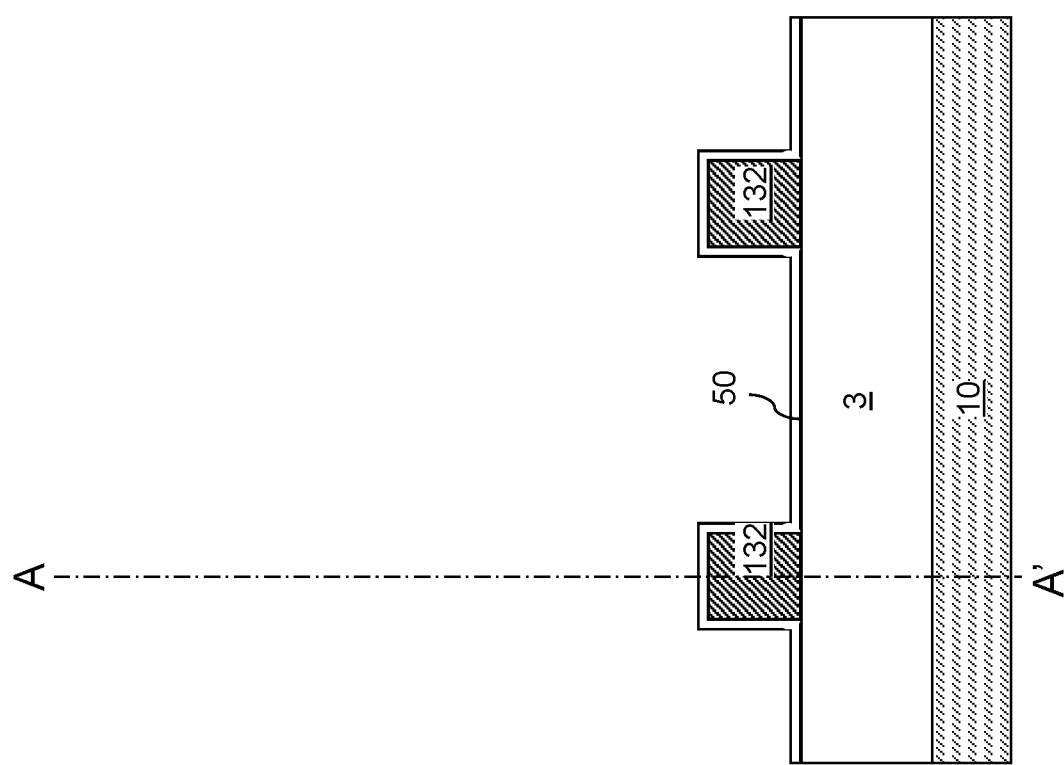
FIG. 6D is a vertical cross-sectional view of the portion of the memory array region along the vertical plane D-D' of FIG. 6B.

Referring to FIGS. 3A and 3B, the portion of the memory array region 100 is illustrated after formation of semiconducting metal oxide fins 130. In one embodiment, a photoresist layer 137 may be applied over the top surface of the semiconducting metal oxide material layer 130L, and may be lithographically patterned into at least one discrete photoresist material portion. The pattern may be a two-dimensional periodic array of discrete photoresist material portions. In one embodiment, the two-dimensional periodic array of discrete photoresist material portions may be a rectangular periodic array having a first pitch along a first horizontal direction hd1 and having a second pitch along a second horizontal direction hd2. The second horizontal direction hd2 may be perpendicular to the first horizontal direction hd1. The first pitch may be in a range from 100 nm to 1,000 nm. The second pitch may be in a range from 50 nm to 500 nm, although lesser and greater dimensions may also be used for each of the first pitch and the second pitch. In one embodiment, each patterned discrete photoresist material portion may have a rectangular horizontal cross-sectional shape. Although other horizontal cross-section shapes may be used. For example, ovals or ellipsis, square, etc. may be used.

An anisotropic etch process may be performed to etch unmasked portions of the semiconducting metal oxide material layer 130L. The anisotropic etch process may comprise a reactive ion etch process that forms vertical sidewalls, or substantially vertical sidewalls, on the patterned portions of the semiconducting metal oxide material layer 130L. Each patterned portion of the semiconducting metal oxide material layer 130L may constitute a semiconducting metal oxide fin 130. In one embodiment, a two-dimensional periodic array of semiconducting metal oxide fins 130 may be formed on the top surface of the at least one lower-level dielectric material layer 3. Each semiconducting metal oxide fin 130 may have a pair of lengthwise sidewalls that laterally extend along the first horizontal direction hd1, a pair of widthwise sidewalls that laterally extend along the second horizontal direction hd2, and a pair of horizontal surfaces which are the respective top surface and the bottom surface of the semiconducting metal oxide fin 130. In one embodiment, lower-level metal lines (such as the second metal lines 42L) embedded in an upper portion of the at least one lower-level dielectric material layer 3 may be laterally offset from the semiconducting metal oxide fins 130 to avoid electrical shorts between the lower-level metal lines and the semiconducting metal oxide fins 130. The photoresist layer 137 may be subsequently removed, for example, by ashing.

Referring to FIGS. 4A-4D, portion of the memory array region in the first configuration is illustrated after formation of a gate dielectric layer 50 and a gate electrode material layer 52L. The gate dielectric layer 50 includes at least one gate dielectric material such as silicon oxide, silicon oxynitride, a dielectric metal oxide, and/or a stack thereof. For example, the gate dielectric layer 50 may include a layer stack of a silicon oxide layer formed by thermal decomposition or plasma decomposition of tetraethylorthosilicate (TEOS) and a dielectric metal oxide layer (such as an aluminum oxide layer, a hafnium oxide layer, or a titanium oxide layer). Other suitable dielectric materials for the gate dielectric layer are within the contemplated scope of disclosure. The gate dielectric layer 50 may be formed by conformal deposition of at least one dielectric material layer. For example, the gate dielectric layer 50 may be deposited by chemical vapor deposition and/or atomic layer deposition. The thickness of the gate dielectric layer 50 may be in a range from 1.0 nm to 12 nm, such as from 2 nm to 6 nm, although lesser and greater thicknesses may also be used.

A gate electrode material layer 52L may be deposited over the gate dielectric layer 50. The gate electrode material layer 52L includes at least one conductive material such as an elemental metal, an intermetallic alloy, a conductive metallic compound (such as a conductive metallic nitride material or a conductive metallic carbide material), or a metal-semiconductor alloy material (such as a metal silicide material). For example, the gate electrode material layer 52L may include, and/or may consist essentially of one or more of, tungsten, molybdenum, ruthenium, niobium, cobalt, copper, platinum, nickel, tungsten nitride, tantalum nitride, titanium nitride, and/or another metallic material. Other suitable conductive materials for the gate electrode material layer are within the contemplated scope of disclosure. The thickness of the gate electrode material layer 52L, as measured from a planar portion having a planar top surface and laterally spaced from the semiconducting metal oxide fins 130, may be in a range from 50 nm to 500 nm, such as from 100 nm to 250 nm, although lesser and greater thicknesses may also be used. The gate electrode material layer 52L may be deposited by a conformal deposition process and/or a non-conformal deposition process. For example, the gate electrode material layer 52L may be deposited by physical vapor deposition, chemical vapor deposition, electroplating, and/or electroless plating.

Referring to FIGS. 5A-5D, the portion of the memory array region 100 in the first configuration is illustrated after formation of gate electrode strips 52. A photoresist layer 57 may be applied over the gate electrode material layer 52L, and may be patterned into an array of line-shaped photoresist material portions by lithographic exposure and development. Each line-shaped photoresist material portion may laterally extend along the second horizontal direction hd2. Each line-shaped photoresist material portion may have a uniform width along the first horizontal direction hd1 that is less than the lengthwise dimension of each semiconducting metal oxide fin 130 along the first horizontal direction hd1. Specifically, each line-shaped photoresist material portion may straddle center portions of a respective row of semiconducting metal oxide fins 130 that are arranged along the second horizontal direction hd2. The width of each line-shaped photoresist material portion may be the gate length of the semiconducting metal oxide transistors to be subsequently formed. For example, the width of each line-shaped photoresist material portion may be in a range from 20 nm to 300 nm, such as from 40 nm to 150 nm, although lesser and greater widths may also be used.

An anisotropic etch process may be performed to transfer the pattern in the array of line-shaped photoresist material portions of the photoresist layer 57 through the gate electrode material layer 52L. The anisotropic etch process etches unmasked portions of the gate electrode material layer 52L. A terminal portion of the anisotropic etch process may be selective to the material of the gate dielectric layer 50. Each patterned portion of the gate electrode material layer 52L comprises a gate electrode strip 52, which laterally extends along the second horizontal direction hd2 over a respective row of semiconducting metal oxide fins 130. Each gate electrode strip 52 includes gate electrodes for a respective underlying row of semiconducting metal oxide fins 130. In other words, each gate electrode for a semiconducting metal oxide fin transistor including a respective semiconducting metal oxide fin 130 comprising an overlying portion of a gate electrode strip 52. In embodiments in which a two-dimensional periodic array of semiconducting metal oxide fins 130 is provided, a one-dimensional periodic array of gate electrode strips 52 may be formed. Each gate electrode may comprise a portion of a respective gate electrode strip 52, may be located on the gate dielectric layer 50 and may straddle a respective underlying semiconducting metal oxide fin 130 along the second horizontal direction hd2.

In one embodiment, a subset of the first metal interconnect structures (41V, 41L, 42V, 42L), such as a subset of the second metal lines 42L, may be provided in the memory array region 100. In this embodiment, each of the gate electrode strips 52 may contact a respective one, or a respective subset, of the first metal interconnect structures (41V, 41L, 42V, 42L), which may be a respective one, or a respective subset, of the second metal lines 42L. In embodiments in which the gate electrode strips 52 may be formed on a respective one (or a respective subset) of the first metal interconnect structures (41V, 41L, 42V, 42L), each gate electrode strip 52 may be electrically connected to a respective one of the field effect transistors located on the semiconductor material layer 10 (which may include a respective gate line driver transistor).

Referring to FIGS. 6A-6E, the portion of the memory array region 100 in the first configuration is illustrated after removal of the photoresist layer 57 and formation of source regions 132 and drain regions 138. The removal of the photoresist layer 57 may be effected, for example, by ashing. Suitable electrical dopants may be implanted into unmasked portions of the semiconducting metal oxide fins 130 by performing an ion implantation process. The gate electrode strips 52 may be used as an ion implantation mask during the ion implantation process. Electrical dopants that may form excess holes or excess electrons in the implanted portions of the semiconducting metal oxide fins 130 include, but are not limited to, Na, K, Mg, Ca, Sr, Y, La, B, Al, Ga, N, P, As, Sb, F, Cl, and other elements that may induce formation of holes or excess electrons in the semiconducting metal oxide fins 130. Alternatively or additionally, a plasma treatment may be optionally performed to improve electrical characteristics of the semiconducting metal oxide material in the semiconducting metal oxide fins 130. A source region 132 may be formed in one side of each semiconducting metal oxide fin 130, and a drain region 138 may be formed in another side of each semiconducting metal oxide fin 130. The unimplanted portion of each semiconducting metal oxide fin 130 constitutes a channel region 135, which underlies a respective one of the gate electrode strips 52.

A two-dimensional array of fin field effect transistors may be formed. Each fin field effect transistor is a semiconducting metal oxide fin transistor using a portion of a semiconducting metal oxide fin 130 (i.e., the portion that underlies a gate electrode strip 52) as a channel region 135. Each fin field effect transistor includes a respective semiconducting metal oxide fin 130, and is located over a top surface of at least one lower-level dielectric material layer 3. In one embodiment, the semiconducting metal oxide fin 130 comprises indium gallium zinc oxide (IGZO). The gate electrode strips 52 may overlie a respective row of the semiconducting metal oxide fins 130, and may be laterally spaced apart along the first horizontal direction hd1 from one another, and may laterally extending along the second horizontal direction hd2. In this embodiment, each of the fin field effect transistors comprises a portion of a respective one of the gate electrode strips 52 as a gate electrode. The two-dimensional array of semiconducting metal oxide fin transistors may be used as a two-dimensional array of access transistors that provide individual access to a respective memory cell within a two-dimensional array of memory cells.

Figure 7E:
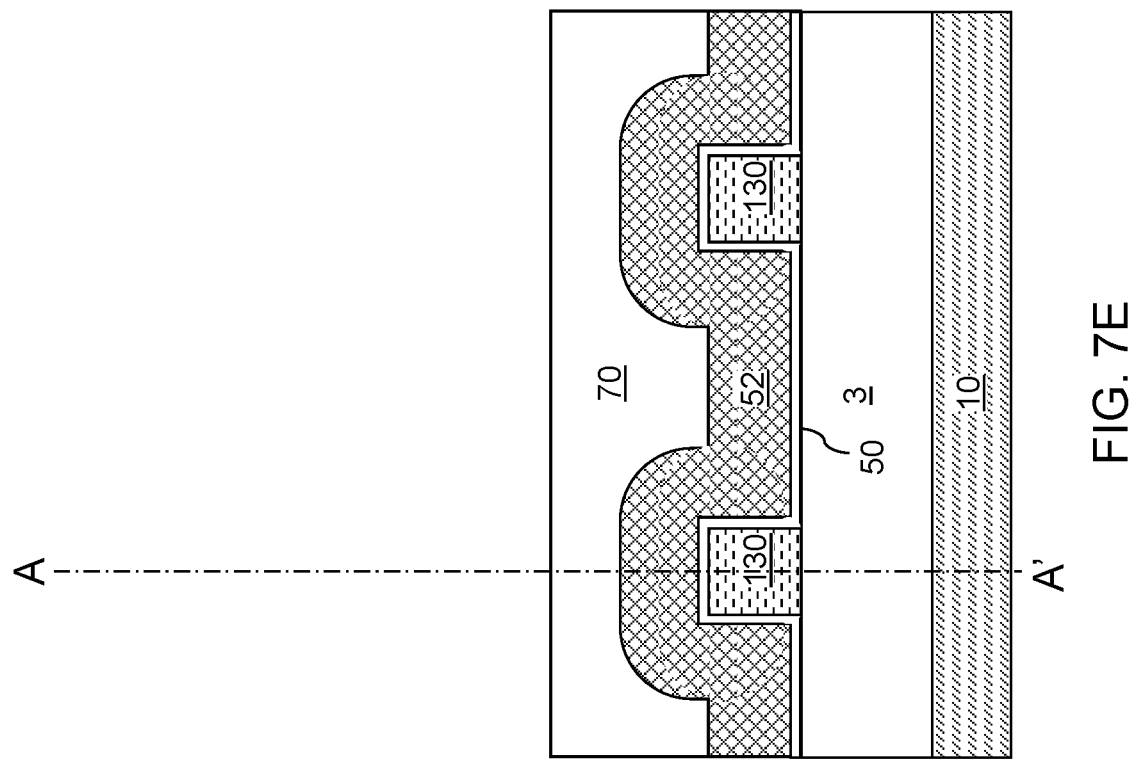
FIG. 7E is a vertical cross-sectional view of the portion of the memory array region along the vertical plane E-E' of FIG. 7B.
Figure 7F:
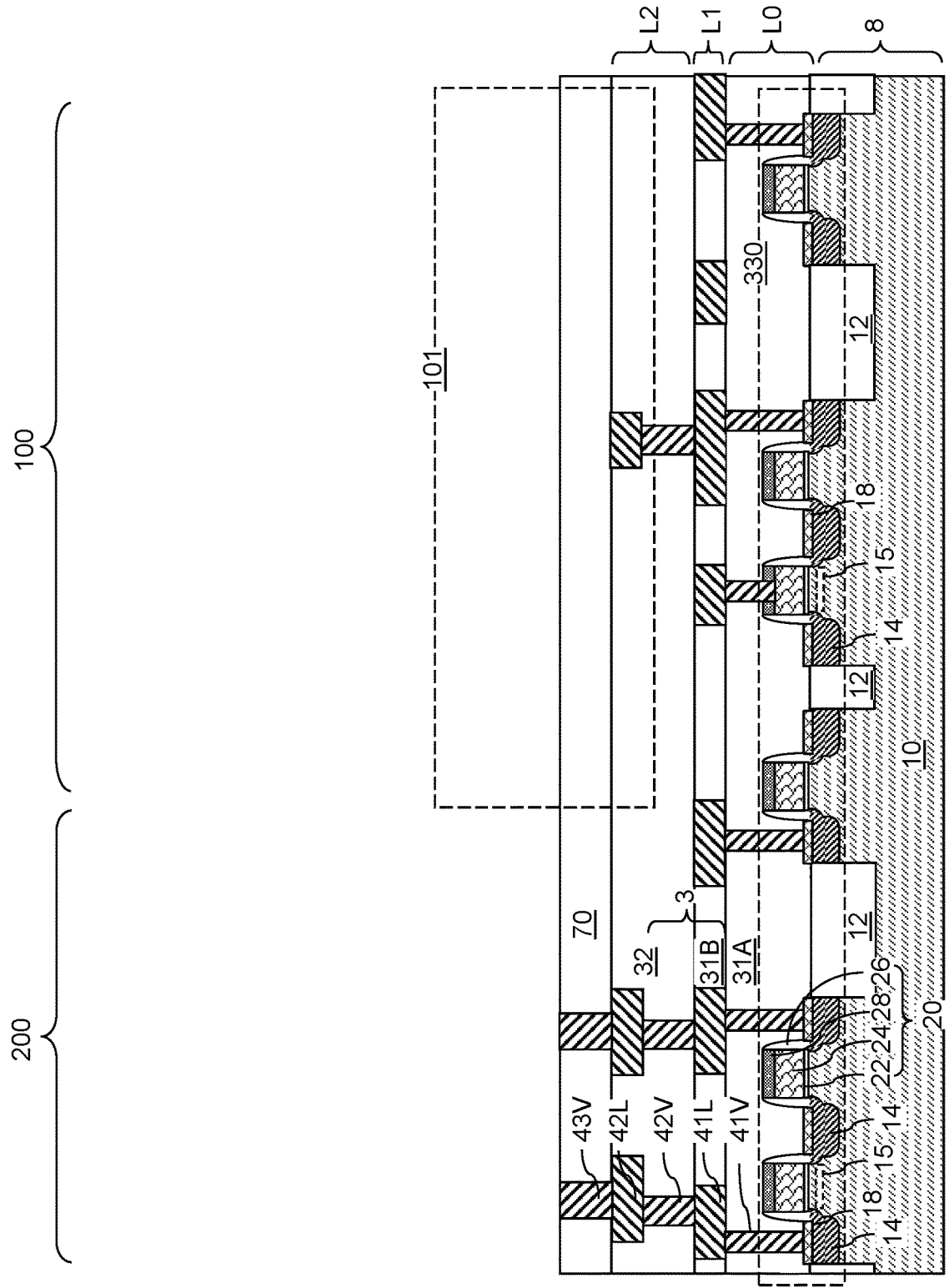
FIG. 7F is a vertical cross-sectional view of the exemplary structure at the processing steps of FIGS. 7A-7E.

FIGS. 7A-7E illustrate the portion of the memory array region 100 in the first configuration after formation of an access-level dielectric material layer 70, drain contact via structures 78, and source contact via structures 72. FIG. 7F illustrate the exemplary structure at the processing steps of FIGS. 7A-7E. It is noted that many components within a two-dimensional array of memory cell-access transistor assemblies 101 in FIG. 7F are omitted for clarity. The two-dimensional array of semiconducting metal oxide fin transistors may be used as a two-dimensional array of access transistors that controls individualized access (i.e., select transistor devices) to memory cells to be subsequently formed. As such, the dielectric material layer that is formed at the level of the two-dimensional array of semiconducting metal oxide fin transistors is referred to as the access-level dielectric material layer 70. The access-level dielectric material layer 70 includes a dielectric material such as undoped silicate glass, a doped silicate glass, organosilicate glass, or a porous dielectric material. The access-level dielectric material layer 70 may be deposited by chemical vapor deposition and/or by spin coating. Optionally, the access-level dielectric material layer 70 may be planarized by a chemical mechanical planarization (CMP) process to provide a horizontal planar top surface for the access-level dielectric material layer 70. The vertical distance between the topmost surfaces of the gate electrode strips 52 and the top surface of the access-level dielectric material layer 70 may be in a range from 50 nm to 500 nm, such as from 100 nm to 250 nm, although lesser and greater vertical distances may also be used. Generally, the access-level dielectric material layer 70 may be formed over, and may embed, the gate electrode strips 52 and the semiconducting metal oxide fins 130. The access-level dielectric material layer 70 may extend into the peripheral region 200 as illustrated in FIG. 7F.

A photoresist layer (not shown) may be applied over the access-level dielectric material layer 70, and may be lithographically patterned to form openings in areas that overlie the source regions 132, the drain regions 138, a subset of the first metal interconnect structures (41V, 41L, 42V, 42L) (which may be a respective one, or a respective subset, of the second metal lines 42L) located in the peripheral region 200, and optionally the gate electrode strips 52 (in embodiments in which the gate electrode strips 52 do not contact a respective underlying one of the first metal interconnect structures (41V, 41L, 42V, 42L) such as the second metal lines 42L). An anisotropic etch process may be performed to transfer the pattern of the openings in the photoresist layer through the access-level dielectric material layer 70. In other words, portions of the access-level dielectric material layer 70 that are not masked by the patterned photoresist layer may be etched by the anisotropic etch process. Via cavities may be formed underneath each opening in the photoresist layer. A top surface of a respective one of the source regions 132, the drain regions 138, the first metal interconnect structures (41V, 41L, 42V, 42L), and/or the gate electrode strips 52 may be physically exposed at the bottom of each opening and via cavity through the access-level dielectric material layer 70. The photoresist layer may be subsequently removed, for example, by ashing. Alternatively, two or more photoresist layers may be used to pattern a respective subset of openings through the access-level dielectric material layer 70 in order to optimize the depth of each via cavity. At least a top surface of a source region 132 may be physically exposed underneath each via cavity that overlies the source region 132, and at least a top surface of a drain region 138 may be physically exposed underneath each via cavity that overlies the drain region 138. In one embodiment, sidewalls of a source region 132 may be physically exposed underneath a via cavity that overlies the source region 132, and sidewalls of a drain region 138 may be physically exposed underneath a via cavity that overlies the drain region 138. A top surface of a first metal interconnect structure (41V, 41L, 42V, 42L), which may be a second metal line 42L, may be physically exposed at the bottom of each via cavity that overlies the first metal interconnect structure (41V, 41L, 42V, 42L). A top surface of a gate electrode strip 52 may be physically exposed underneath each via cavity that overlies the gate electrode strip 52.

At least one metallic material may be deposited in each of the via cavities. The at least one metallic material may include, for example, a combination of a metallic barrier liner including a conductive metallic nitride material (such as WN, TiN, and/or WN) and a metallic fill material such as Cu, W, Mo, Co, Ru, another elemental metal, or an intermetallic alloy. Excess portions of the at least one metallic material may be removed from above the horizontal plane including the top surface of the access-level dielectric material layer 70 by a planarization process. The planarization process may include a recess etch process and/or a chemical mechanical planarization process. Each remaining portion of the at least one conductive material filling a respective via cavity comprises an access-level metal via structure (72, 78, 43V).

The access-level metal via structures (72, 78, 43V) may include source contact via structures 72 that contact a top surface, and optionally sidewalls, of an underlying source region 132. The access-level metal via structures (72, 78, 43V) may include drain contact via structures 78 that contact a top surface, and optionally sidewalls, of an underlying drain region 138. The access-level metal via structures (72, 78, 43V) may include second metal via structures 43V that contact a top surface of a respective second metal line 42L. In embodiments in which the lower interconnect-level structures include a different number of dielectric material layers, the metal via structures vertically extending through the portion of the access-level dielectric material layer 70 located in the peripheral region 200 may contact a metal line located at a different level. Optionally, the access-level metal via structures (72, 78, 43V) may include gate contact via structures (not illustrated) that contact a top surface of a respective one of the gate electrode strips 52. In this embodiment, the gate electrode strips 52 may laterally extend into an edge of the peripheral region 200, and the gate contact via structures may be formed at end portions of the gate electrode strips 52 within, or near, the peripheral region to reduce cluttering of metal via structures within the memory array region 100. Each of the access-level metal via structures (72, 78, 43V) is embedded within the access-level dielectric material layer 70.

The access-level metal via structures (72, 78, 43V) may be concurrently formed. In other words, the at least one metallic material that is deposited into the via cavities extending through the access-level dielectric material layer 70 may be deposited using a same set of deposition processes, and a same planarization process defines the top surfaces of the access-level metal via structures (72, 78, 43V). Thus, the access-level metal via structures (72, 78, 43V) in the peripheral region 200 (such as the second metal via structures 43V) may be formed directly on a top surface of a respective one of the first metal interconnect structures (41V, 41L, 42V, 42L) (e.g., the second metal lines 42L) concurrently with formation of the drain contact via structures 78 and the source contact via structures 72. Thus, each access-level metal via structures (72, 78, 43V) may comprise a same metallic material. For example, each access-level metal via structures (72, 78, 43V) may include a same combination of a metallic barrier liner material (such as TiN, TaN, and/or WN) and a same metallic fill material. Top surfaces of each access-level metal via structure (72, 78, 43V) may be formed within a same horizontal plane. For example, each second metal via structure 43V may have a respective top surface located within the same horizontal plane as the top surfaces of the drain contact via structures 78 and the source contact via structures 72.

Figure 8E:
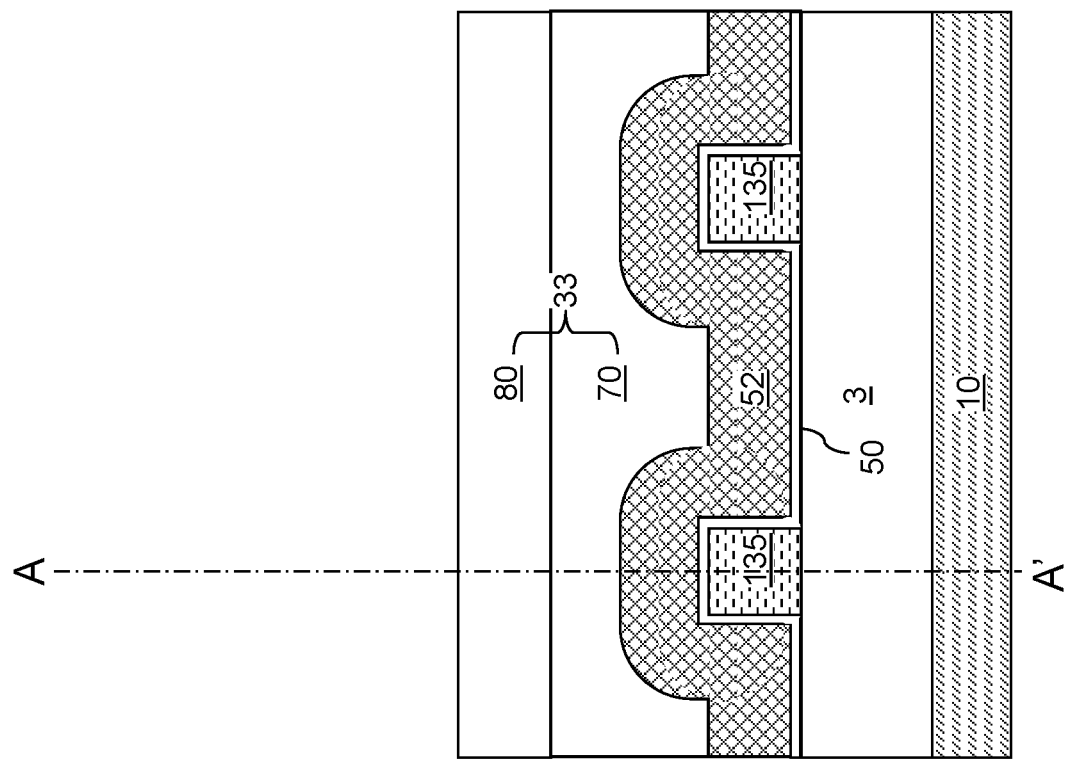
FIG. 8E is a vertical cross-sectional view of the portion of the memory array region along the vertical plane E-E' of FIG. 8B.
Figure 8F:
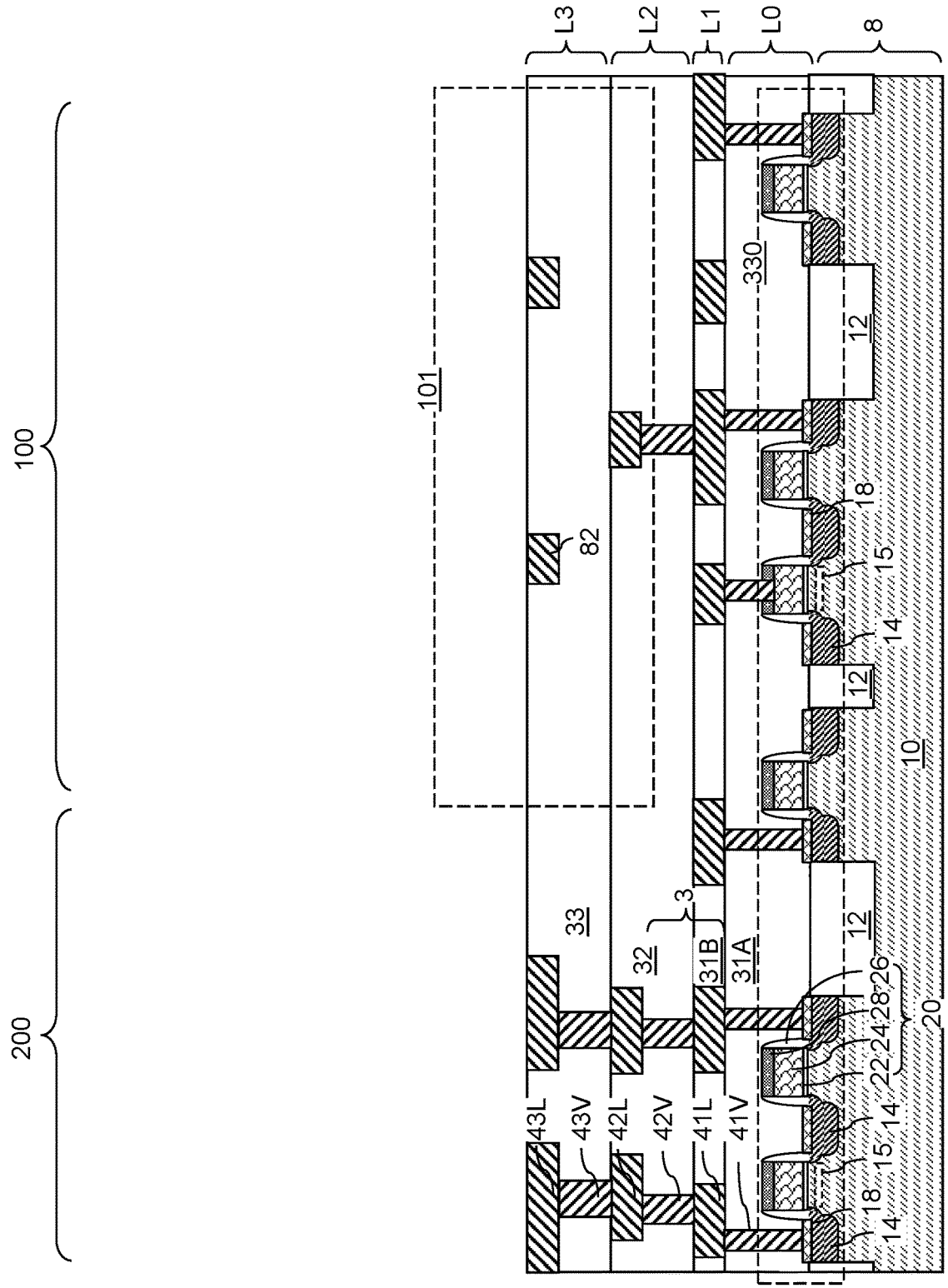
FIG. 8F is a vertical cross-sectional view of the exemplary structure at the processing steps of FIGS. 8A-8E.
Figure 9D:
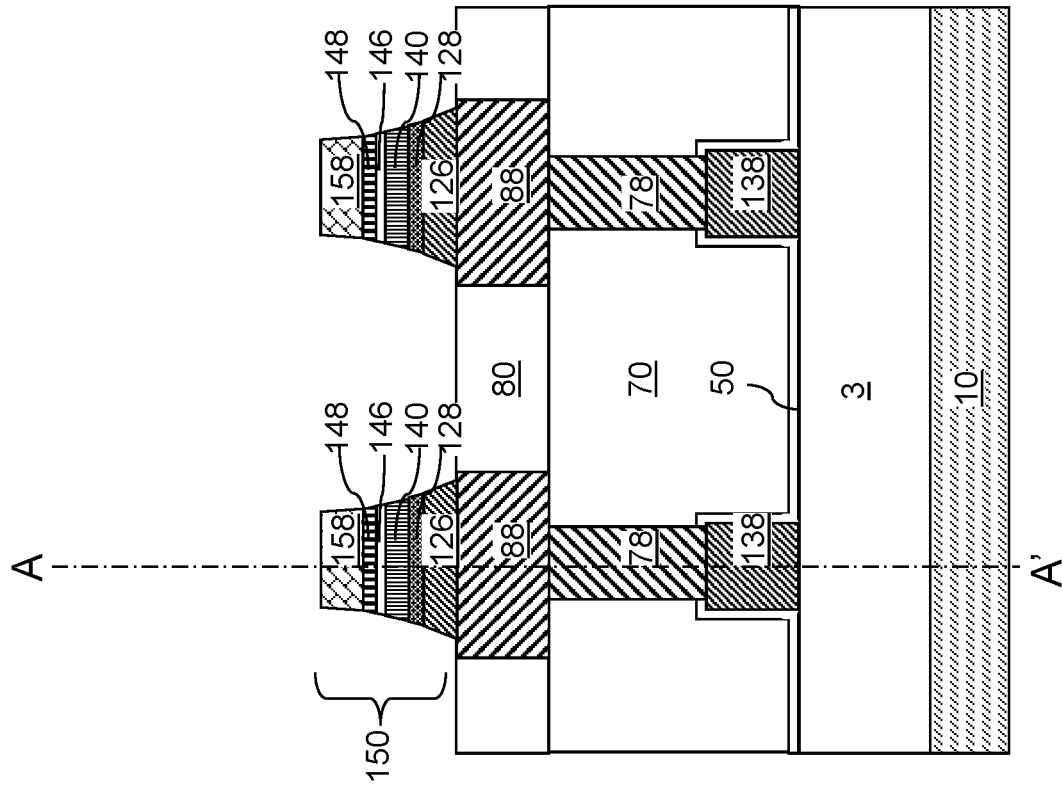
FIG. 9D is a vertical cross-sectional view of the portion of the memory array region along the vertical plane D-D' of FIG. 9B.
Figure 9C:
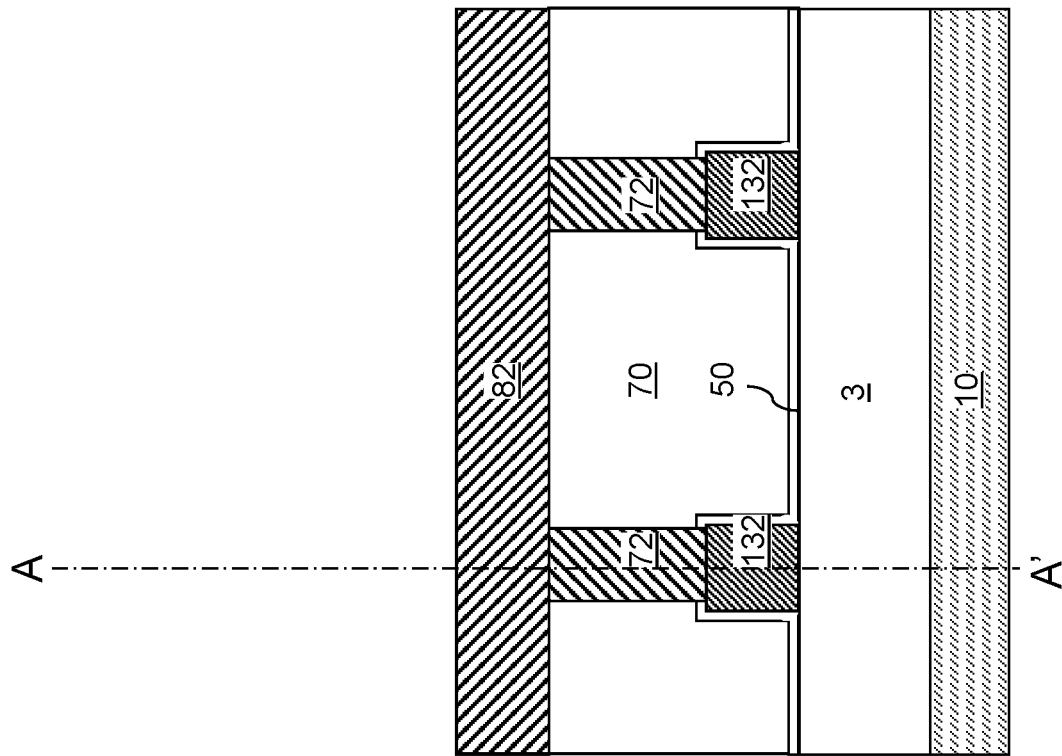
FIG. 9C is a vertical cross-sectional view of the portion of the memory array region along the vertical plane C-C' of FIG. 9B.

Referring to FIGS. 8A-8E, the portion of the memory array region 100 in the first configuration is illustrated after formation of a source line 82 and metal plates 88. FIG. 8F illustrates the exemplary structure at the processing steps of FIGS. 8A-8E. It is noted that many components within a two-dimensional array of memory cell-access transistor assemblies 101 in FIG. 8F are omitted for clarity.

A dielectric material layer may be deposited over the access-level dielectric material layer 70 after formation of the access-level metal via structures (72, 78, 43V). The dielectric material layer is herein referred to a source-line-level dielectric material layer 80. In embodiments in which the access-level dielectric material layer 70 is formed on a top surface of a second interconnect-level dielectric material layer 32 that is a component of a second interconnect-level structure L2, the combination of the access-level dielectric material layer 70 and the source-line-level dielectric material layer 80 constitutes a third interconnect-level dielectric material layer 33 that is a component of a third interconnect-level structure L3. The source-line-level dielectric material layer 80 includes a dielectric material such as undoped silicate glass, a doped silicate glass, organosilicate glass, or a porous dielectric material. The source-line-level dielectric material layer 80 may be deposited by chemical vapor deposition or by spin coating. The thickness of the source-line-level dielectric material layer 80 may be in a range from 50 nm to 300 nm, although lesser and greater thicknesses may also be used.

A photoresist layer may be applied over the source-line-level dielectric material layer 80, and may be lithographically patterned to form openings therein. The pattern of the openings may include line-shaped openings and pad-shaped openings. For example, a line-shaped opening may be formed over the area of each source contact via structure 72, and a pad-shaped opening may be formed over the area of each drain contact via structure 78. Further, a line-shaped opening or a pad-shaped opening may be formed over each area of the second metal via structures 43V and the gate contact via structures (if present). In one embodiment, the photoresist layer may include a plurality of line-shaped opening that laterally extend along the second horizontal direction hd2 such that each line shaped opening overlies a respective row of source contact via structures 72 that are arranged along the second horizontal direction hd2.

An anisotropic etch process may be performed to transfer the pattern of the openings in the photoresist layer through the source-line-level dielectric material layer 80. At least one top surface of access-level metal via structures (72, 78, 43V) may be physically exposed underneath each cavity formed underneath the openings in the photoresist layer. The photoresist layer may be subsequently removed, for example, by ashing.

At least one metallic material may be deposited in each of the cavities in the source-line-level dielectric material layer 80. The at least one metallic material may include, for example, a combination of a metallic barrier liner including a conductive metallic nitride material (such as WN, TiN, and/or WN) and a metallic fill material such as Cu, W, Mo, Co, Ru, another elemental metal, or an intermetallic alloy. Excess portions of the at least one metallic material may be removed from above the horizontal plane including the top surface of the source-line-level dielectric material layer 80 by a planarization process. The planarization process may include a recess etch process and/or a chemical mechanical planarization process. Each remaining portion of the at least one conductive material filling a respective cavity in the source-line-level dielectric material layer 80 comprises a source-line-level interconnect structure (82, 88, 43L).

The source-line-level interconnect structures (82, 88, 43L) may include a source line 82 that contacts a respective row of source contact via structures 72 and laterally extends along the second horizontal direction hd2. Thus, the lengthwise direction of the source lines 82 may be parallel to the lengthwise direction of the gate electrode strips 52. In one embodiment, the source lines 82 may be formed as a one-dimensional periodic array having the first pitch along the first horizontal direction hd1. The source lines 82 may be laterally spaced apart along the first horizontal direction hd1. Generally, the source lines 82 may be electrically connected to a respective set of source regions 132 located within a respective row of field effect transistors within the two-dimensional array of fin field effect transistors through a respective row of source contact via structures 72.

The source-line-level interconnect structures (82, 88, 43L) may include metal plate 88 contacting a top surface of a respective one of the drain contact via structures 78. In one embodiment, the metal plates 88 may be formed as a periodic two-dimensional array having the first pitch along the first horizontal direction hd1 and having the second pitch along the second horizontal direction hd2. In one embodiment, the metal plates 88 may be sized such that the entire area of a respective memory cell to be subsequently formed fits inside the periphery of a respective metal plate 88.

The source-line-level interconnect structures (82, 88, 43L) may include metal lines that may be formed in the peripheral region 200. Such metal lines may be third metal lines 43L in embodiments in which the source-line-level dielectric material layer 80 constitutes a third interconnect-level dielectric material layer 33 that is a component of a third interconnect-level structure. In this embodiment, a third metal line 43L may contact at least one second metal via structure 43V. In embodiments in which gate contact via structures are embedded in the access-level dielectric material layer, the source-line-level interconnect structures (82, 88, 43L) may include gate connection metal lines (not illustrated) or gate connection metal pads (not illustrated), which may be used to provide electrical connection between each gate electrode strip 52 and a respective field effect transistor located on the semiconductor material layer 10 (which may include a word line driver transistor).

Each source-line-level interconnect structure (such as a third metal line 43L) that is formed in the peripheral region 200 may contact a top surface of a respective one of the access-level metal via structures (such as a respective one of the second metal via structures 43V). Each source-line-level interconnect structure (such as a third metal line 43L) that is formed in the peripheral region 200 may be formed concurrently with formation of the metal plates 88 and the source lines 82.

FIGS. 9A-9E illustrate the portion of the memory array region 100 in the first configuration after formation of memory cells 150. In embodiments in which the semiconducting metal oxide fin transistors are formed as a two-dimensional periodic array, the memory cells 150 may be formed as a two-dimensional periodic array of memory cells 150. In one embodiment, each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material and contacting a respective one of the metal plates 88, and a second electrode 158 including a metallic material and protecting an underlying data-storing portion of the memory cell 150. A memory element is provided between the first electrode 126 (i.e., bottom electrode) and the second electrode 158 (i.e., top electrode). In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. In case the first electrode 126 is omitted, the metal plate 88 may function as the first electrode. The SAF structure 140 may include, from bottom to top, a hard magnetization layer 141, an antiferromagnetic coupling layer 142, and a reference magnetization layer 143.

. The first electrode 126 includes a metallic material such as TiN, TaN, WN, W, Cu, Al, Ti, Ta, Ru, Co, Mo, Pt, an alloy thereof, and/or a combination thereof. Other suitable metallic materials for the first electrode are within the contemplated scope of disclosure. The thickness of the first electrode 126 may be in a range from 10 nm to 100 nm, although lesser and greater thicknesses may also be used. The metallic seed layer 128 may include titanium, ruthenium, or another transition metal that induces crystalline growth of subsequent material layers. Other suitable metallic seed materials for the metallic seed layer are within the contemplated scope of disclosure. The thickness of the metallic seed layer 128 may be in a range from 3 nm to 30 nm, although lesser and greater thicknesses may also be used. The hard magnetization layer 141 of the SAF structure 140 may include a hard ferromagnetic material such as PtMn, IrMn, RhMn, FeMn, OsMn, etc. Other suitable hard ferromagnetic materials for the hard magnetization layer 141 are within the contemplated scope of disclosure. The antiferromagnetic coupling layer 142 of the SAF structure 140 may include ruthenium or iridium. Other suitable antiferromagnetic materials for the antiferromagnetic coupling layer 142 are within the contemplated scope of disclosure. The thickness of the antiferromagnetic coupling layer may be selected such that the exchange interaction induced by the antiferromagnetic coupling layer stabilizes the relative magnetization directions of the hard magnetization layer and the reference magnetization layer at opposite directions, i.e., in an antiparallel alignment. The reference magnetization layer 143 of the SAF structure 140 may include a hard ferromagnetic material such as Co, CoFe, CoFeB, CoFeTa, NiFe, CoPt, CoFeNi, etc. Other suitable hard ferromagnetic materials for the reference magnetization layer 143 are within the contemplated scope of disclosure. The thickness of the SAF structure 140 may be in a range from 5 nm to 30 nm, although lesser and greater thicknesses may also be used. The tunneling barrier layer 146 may include a tunneling barrier material such as magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable tunneling barrier materials for the tunneling barrier layer are within the contemplated scope of disclosure. The thickness of the tunneling barrier layer 146 may be 0.7 nm to 2.0 nm, although lesser and greater thicknesses may also be used. The free magnetization layer 148 includes a ferromagnetic material having two stable magnetization directions that are parallel or antiparallel to the magnetization direction of the reference magnetization layer in the SAF structure 140. The free magnetization layer 148 includes a hard ferromagnetic material such as Co, CoFe, CoFeB, CoFeTa, NiFe, CoPt, CoFeNi, etc. Other suitable hard ferromagnetic materials for the free magnetization layer are within the contemplated scope of disclosure. The thickness of the free magnetization layer 148 may be in a range from 1 nm to 6 nm, although lesser and greater thicknesses may also be used. The second electrode 158 includes at least one metallic material such as TiN, TaN, WN, W, Cu, Al, Ti, Ta, Ru, Co, Mo, Pt, an alloy thereof, and/or a combination thereof. Other suitable metallic materials for the second electrode are within the contemplated scope of disclosure. The thickness of the second electrode 158 may be in a range from 10 nm to 100 nm, although lesser and greater thicknesses may also be used.

Generally, the two-dimensional array of memory cells 150 may be formed by depositing blanket (un-patterned) memory material layers, forming a two-dimensional array of discrete etch mask material portions (which may be photoresist material portions, hard mask material portions, or other patterning material portions) that cover portions of the blanket memory material layers that overlie the metal plates 88, and by removing unmasked portions of the blanket memory material layers using at least one anisotropic etch process and/or ion milling. The array of discrete etch mask material portions may be removed, for example, by ashing or by dissolving in an etchant. In one embodiment, each memory cell 150 may be formed on a top surface of a respective metal plate 88. In one embodiment, each memory cell 150 comprises a first electrode 126 that is electrically connected to a respective drain region 138 within a respective semiconducting metal oxide fin 130 through a first electrically conductive path. For example, the first electrically conductive path may include a drain contact via structure 78 and a metal plate 88.

Figure 10D:
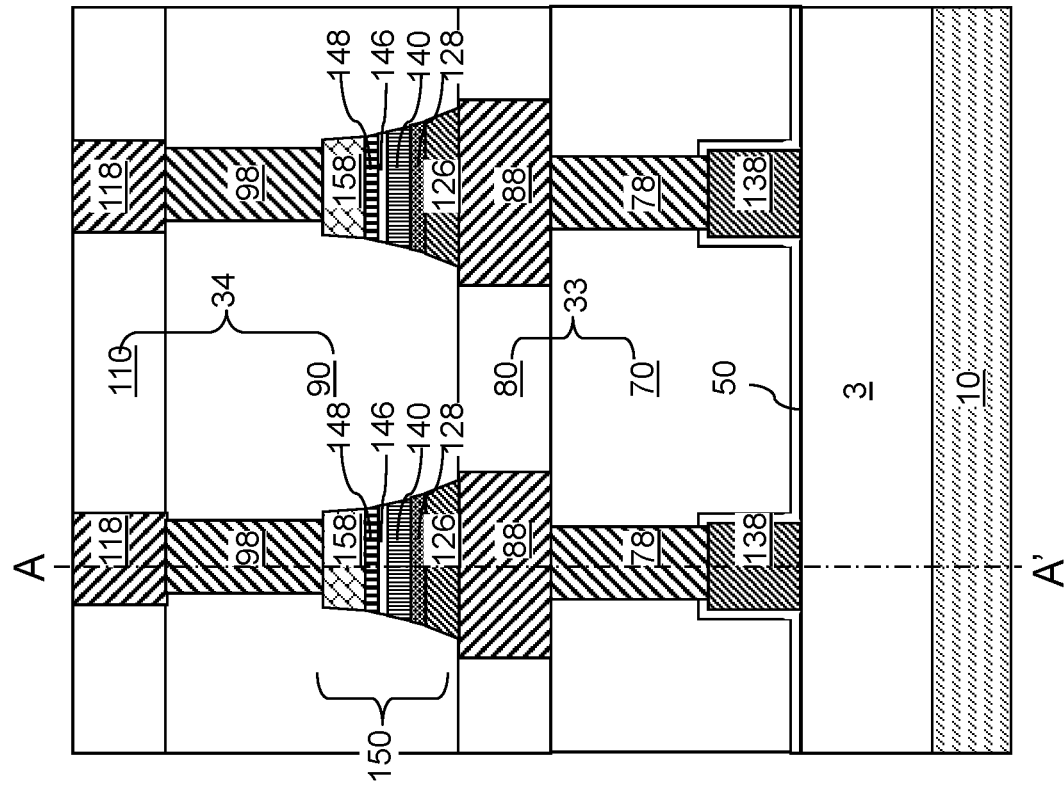
FIG. 10D is a vertical cross-sectional view of the portion of the memory array region along the vertical plane D-D' of FIG. 10B.
Figure 10C:
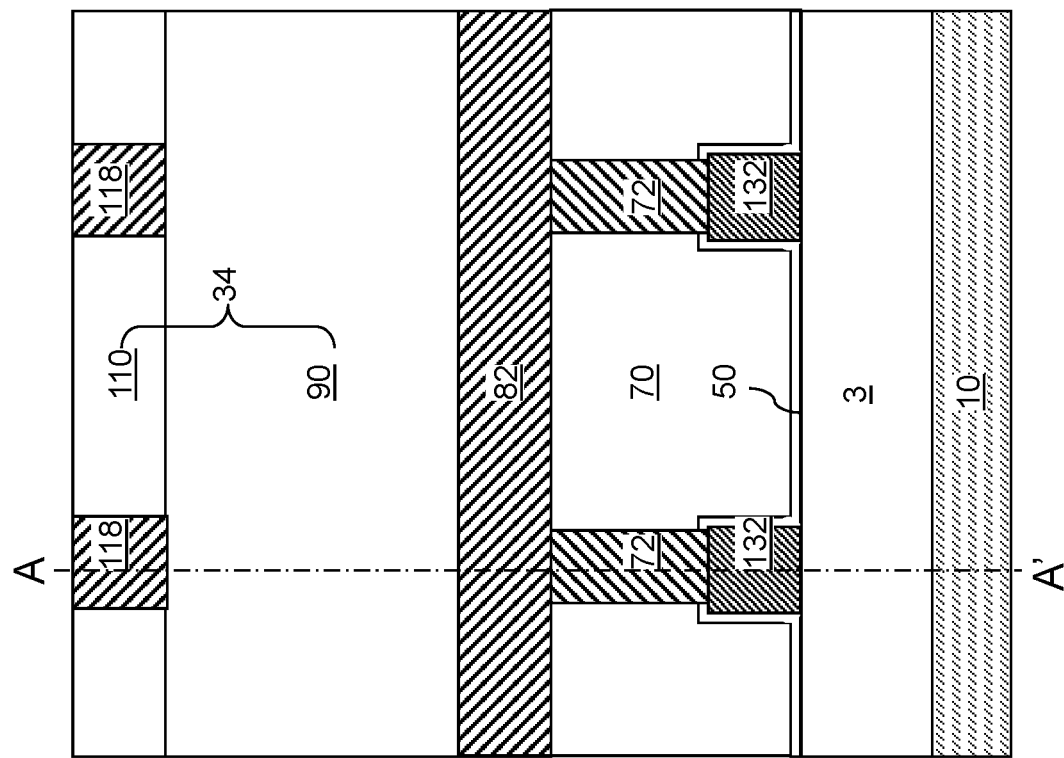
FIG. 10C is a vertical cross-sectional view of the portion of the memory array region along the vertical plane C-C' of FIG. 10B.
Figure 10F:
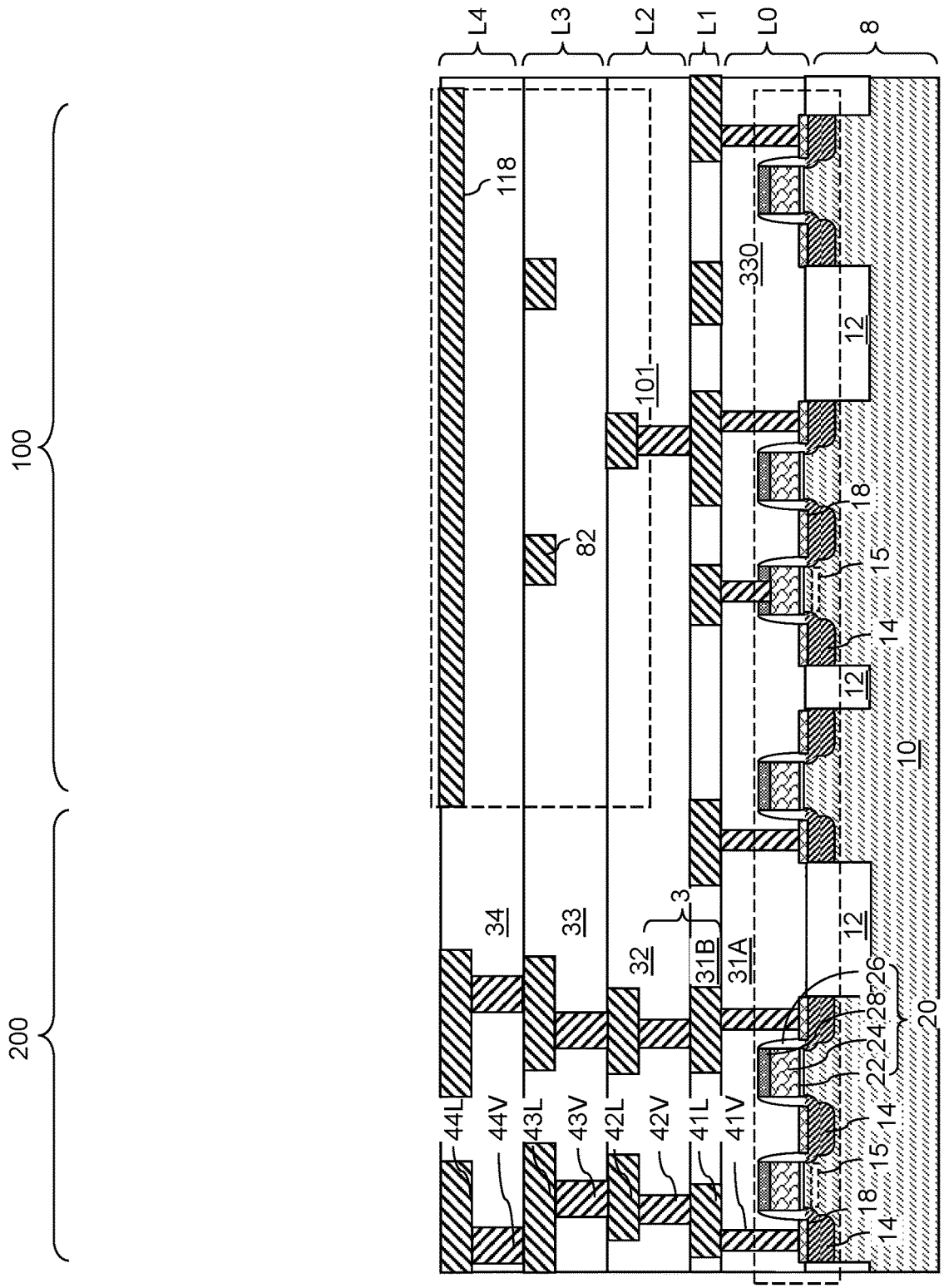
FIG. 10F is a vertical cross-sectional view of the exemplary structure at the processing steps of FIGS. 10A-10E.
Figure 11A:
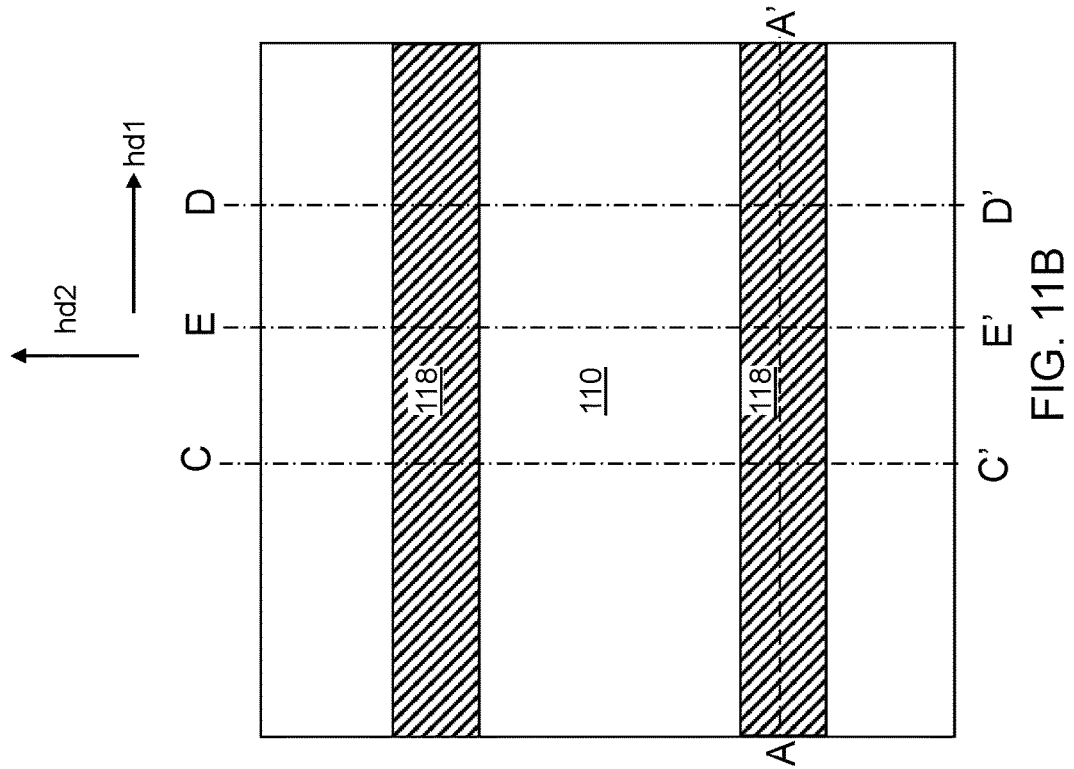
FIG. 11A is a vertical cross-sectional view of a portion of the memory array region in an alternative configuration after formation of a memory-level dielectric material layer and memory cell contact via structures according to an embodiment of the present disclosure.
Figure 11B:
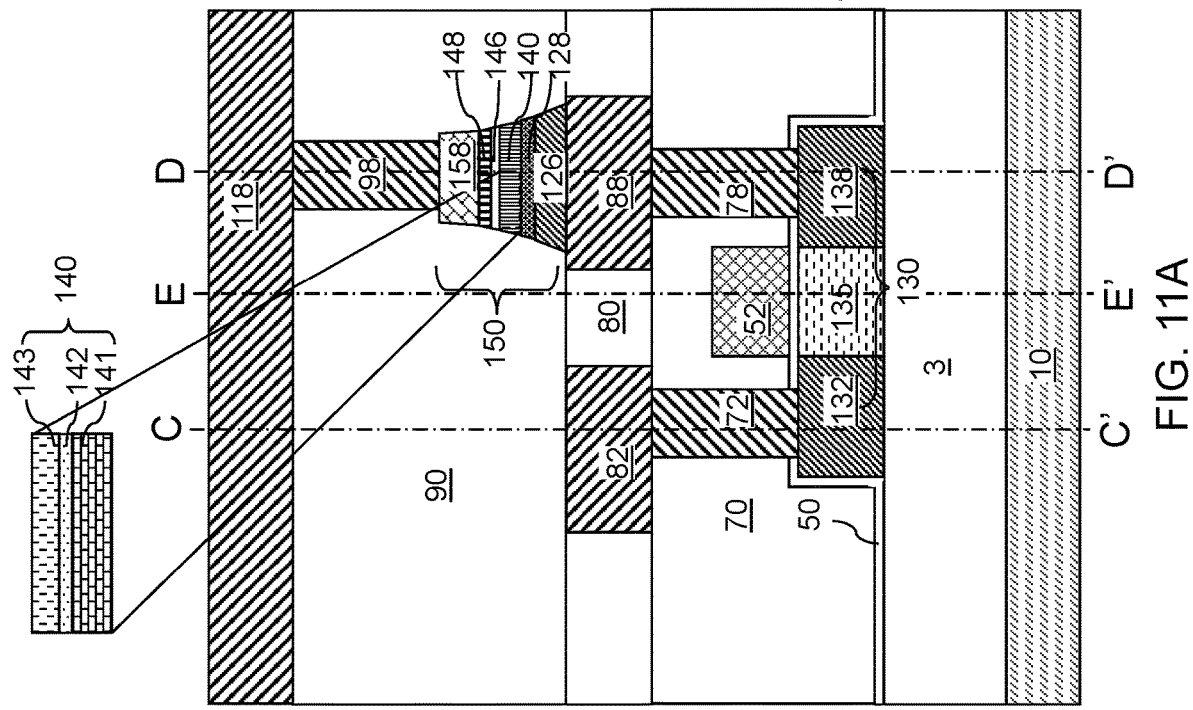
FIG. 11B is a top-down view of the portion of the memory array region of FIG. 11A. The vertical plane A-A' is the plane of the vertical cross-section of FIG. 11A.
Figure 11C:
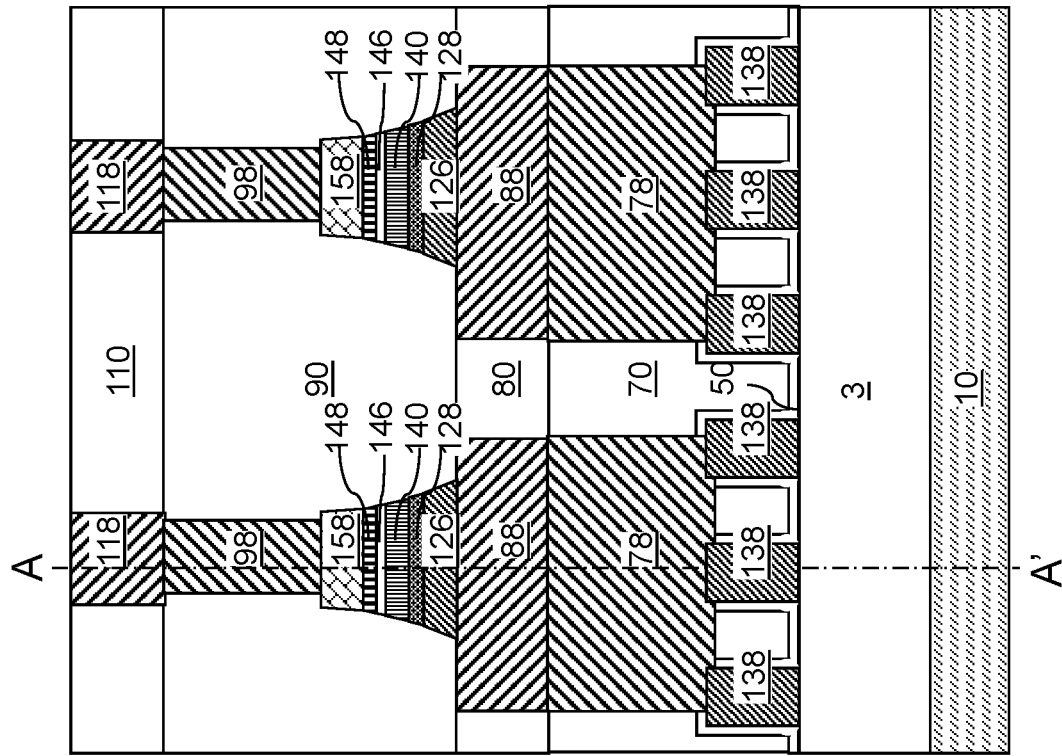
FIG. 11C is a vertical cross-sectional view of the portion of the memory array region along the vertical plane C-C' of FIG. 11B.
Figure 11D:
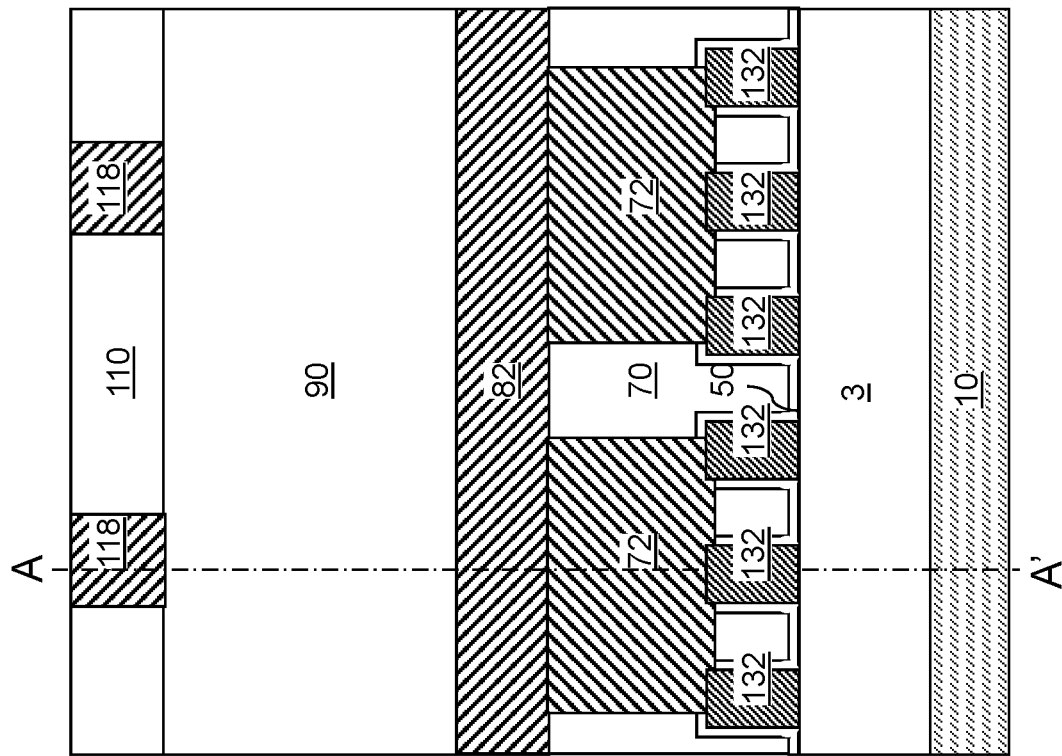
FIG. 11D is a vertical cross-sectional view of the portion of the memory array region along the vertical plane D-D' of FIG. 11B.
Figure 11E:
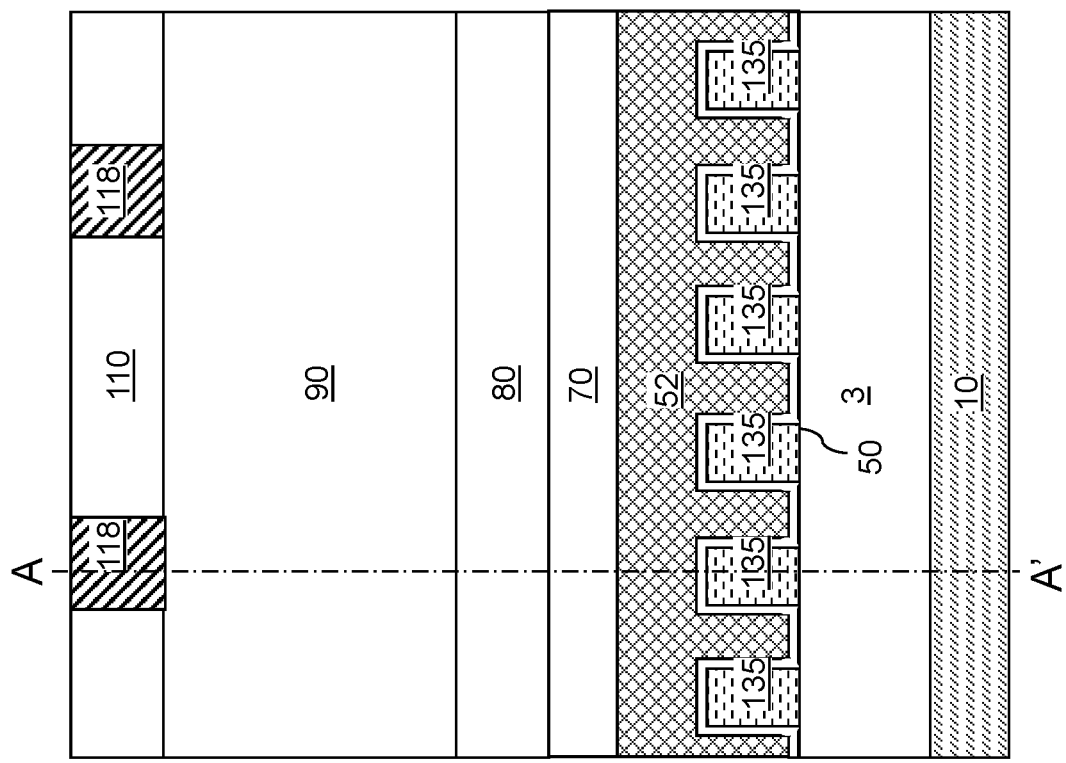
FIG. 11E is a vertical cross-sectional view of the portion of the memory array region along the vertical plane E-E' of FIG. 11B.
Figure 12E:
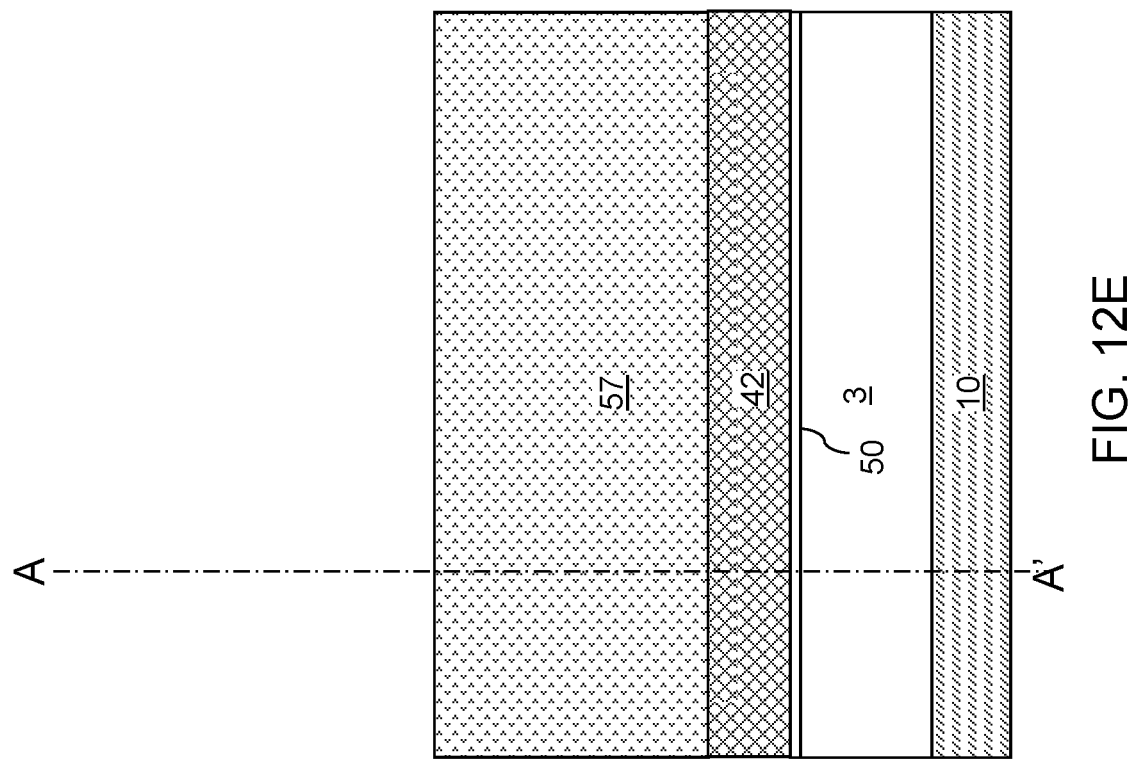
FIG. 12E is a vertical cross-sectional view of the portion of the memory array region along the vertical plane E-E' of FIG. 12B.
Figure 14F:
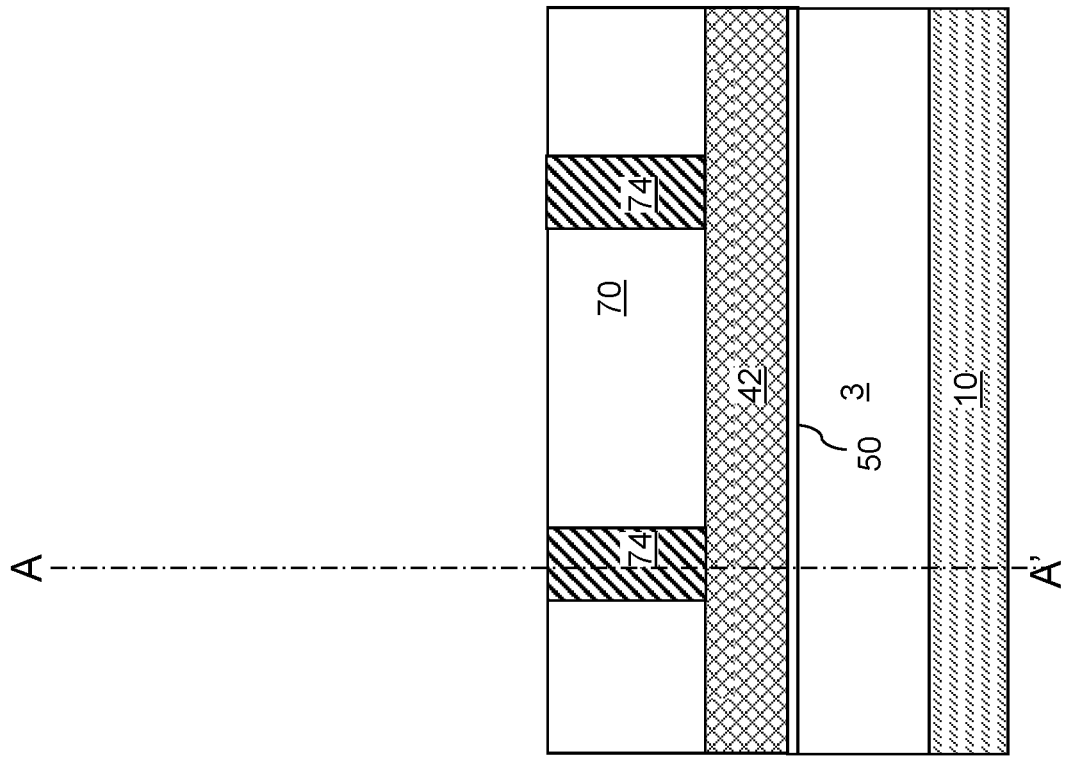
FIG. 14F is a vertical cross-sectional view of the portion of the memory array region along the vertical plane F-F' of FIG. 14B.
Figure 14E:
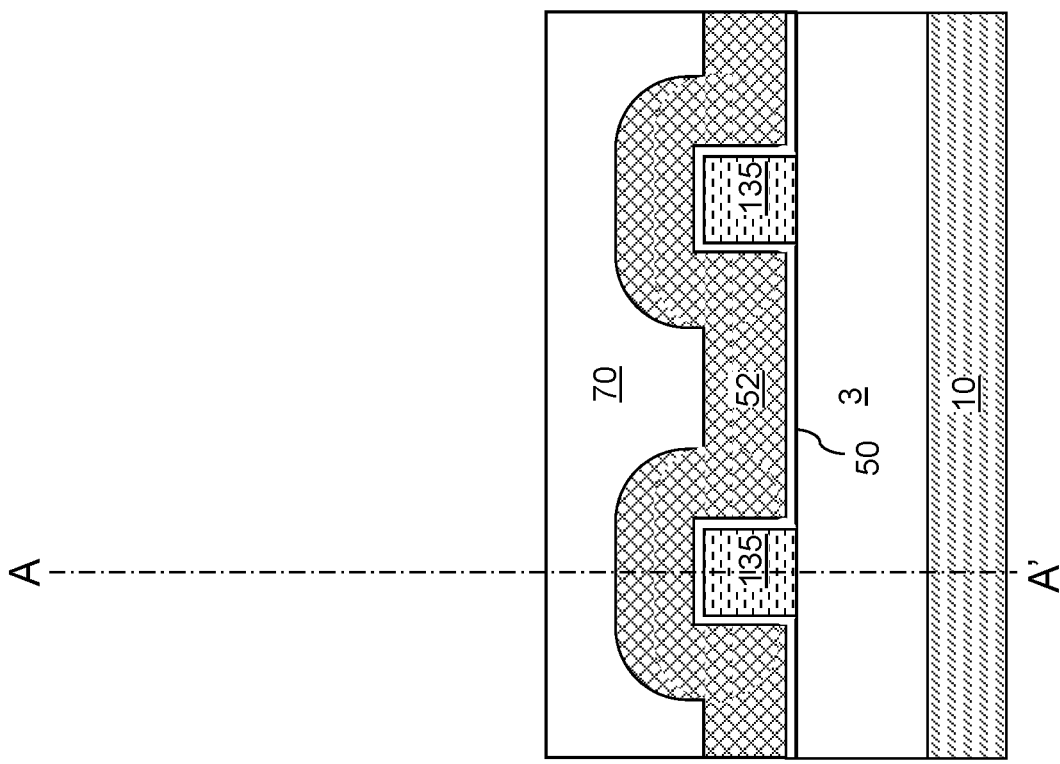
FIG. 14E is a vertical cross-sectional view of the portion of the memory array region along the vertical plane E-E' of FIG. 14B.
Figure 15F:
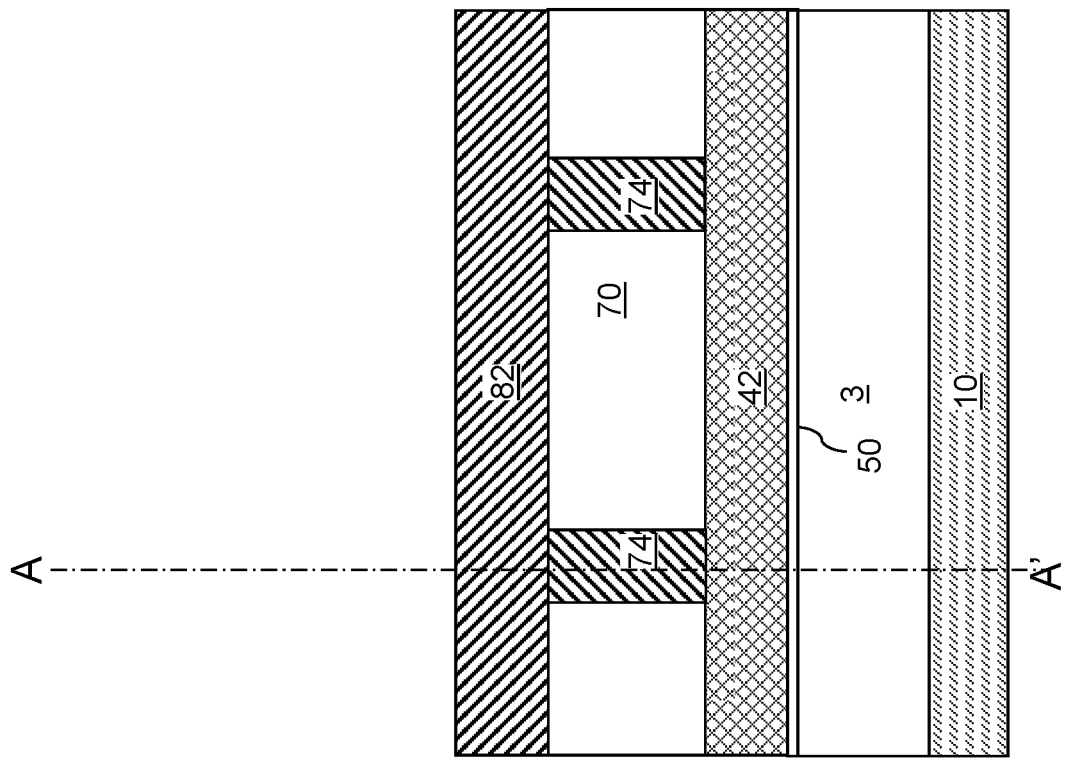
FIG. 15F is a vertical cross-sectional view of the portion of the memory array region along the vertical plane F-F' of FIG. 15B.
Figure 15E:
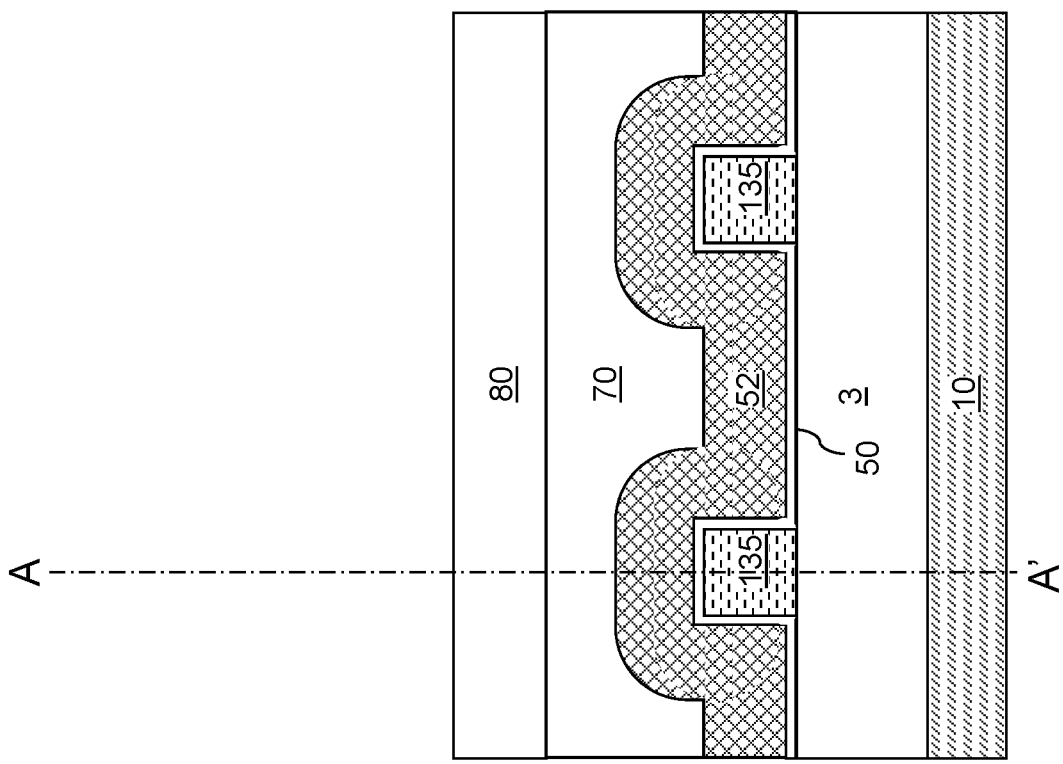
FIG. 15E is a vertical cross-sectional view of the portion of the memory array region along the vertical plane E-E' of FIG. 15B.
Figure 16D:
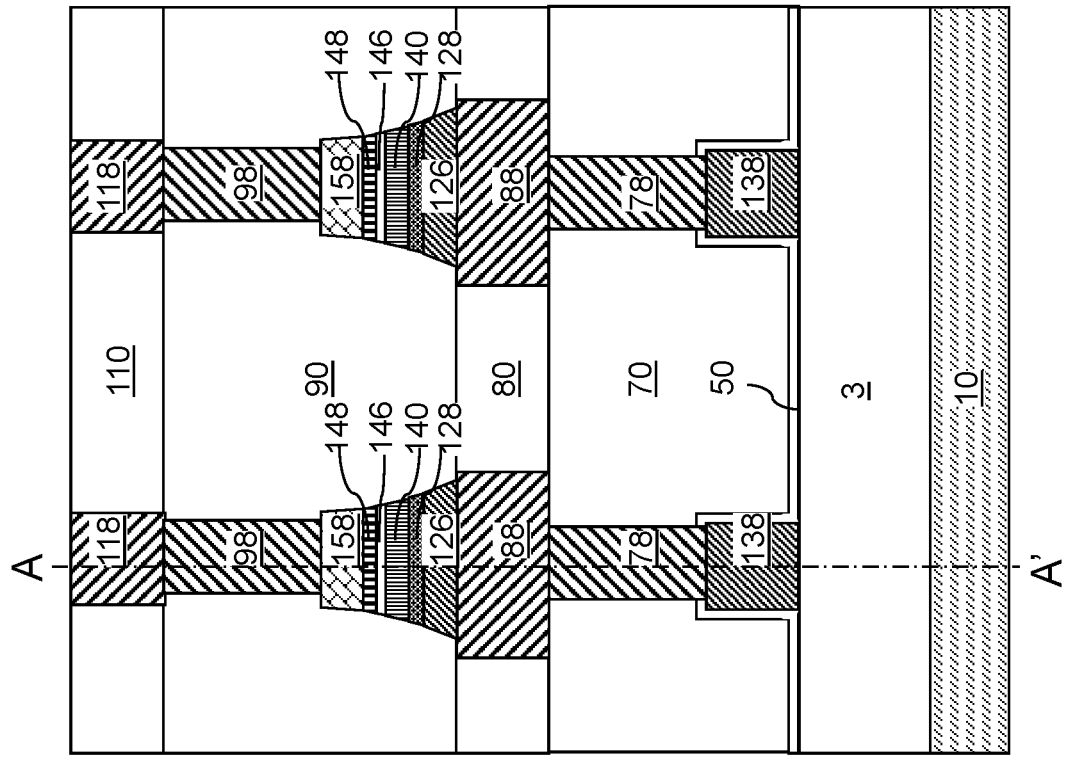
FIG. 16D is a vertical cross-sectional view of the portion of the memory array region along the vertical plane D-D' of FIG. 16B.
Figure 16C:
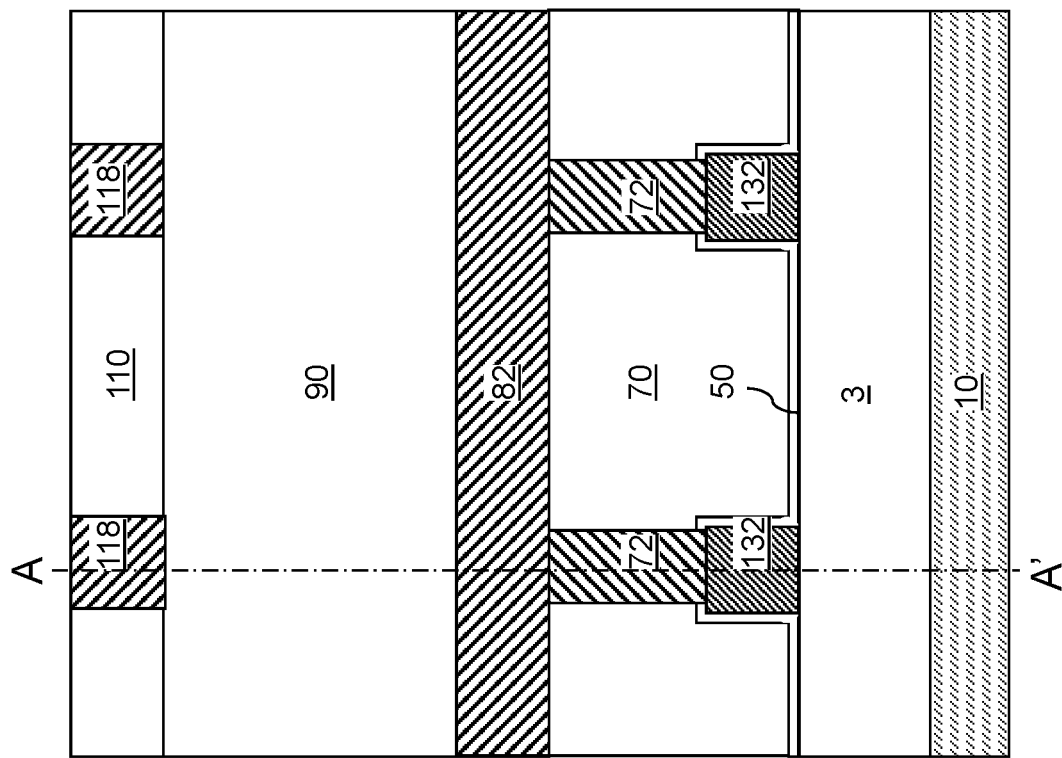
FIG. 16C is a vertical cross-sectional view of the portion of the memory array region along the vertical plane C-C' of FIG. 16B.
Figure 17D:
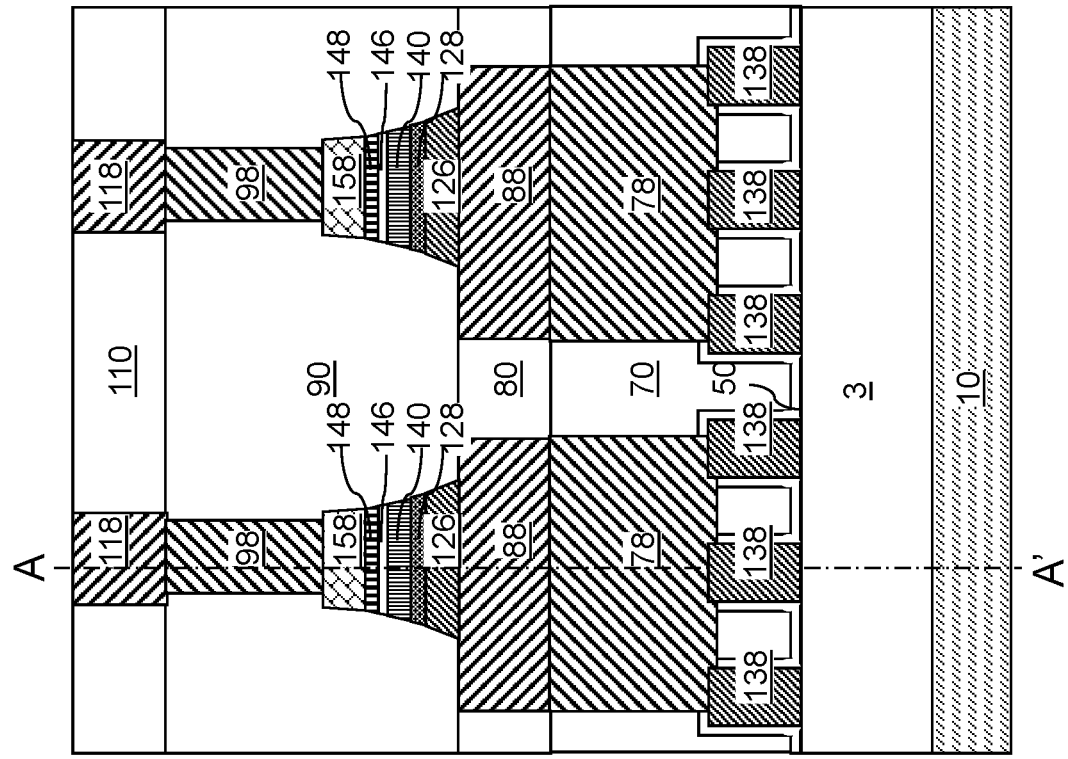
FIG. 17D is a vertical cross-sectional view of the portion of the memory array region along the vertical plane D-D' of FIG. 17B.
Figure 17C:
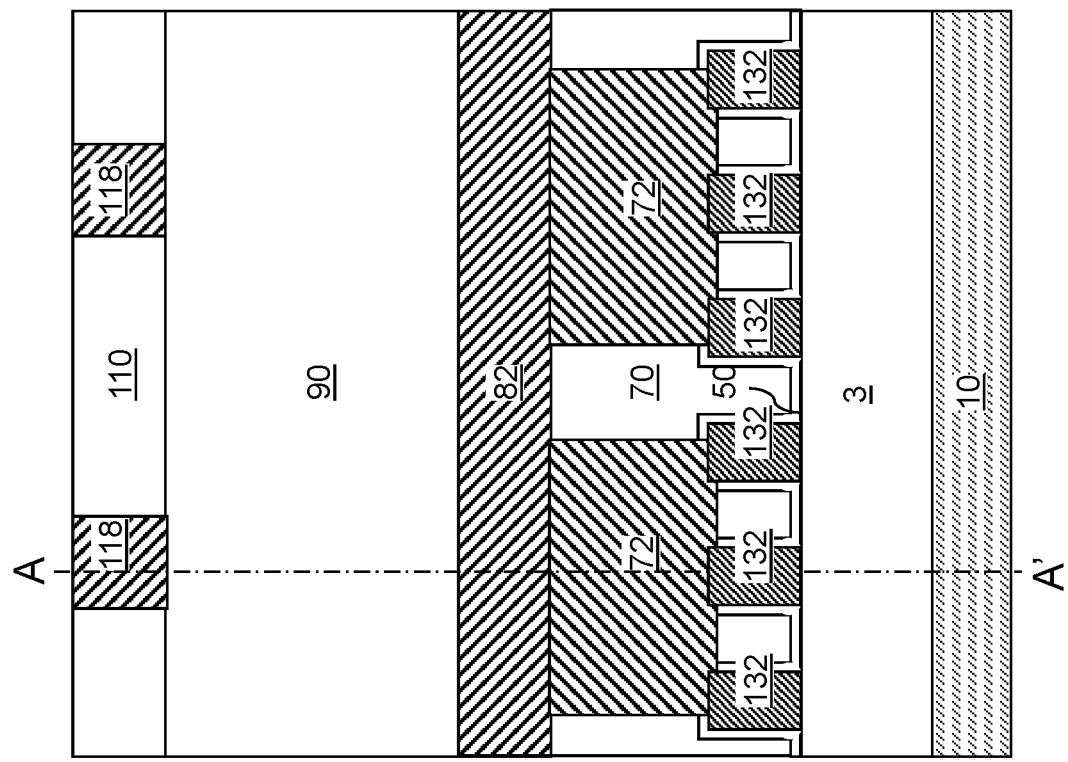
FIG. 17C is a vertical cross-sectional view of the portion of the memory array region along the vertical plane C-C' of FIG. 17B.

FIG. 10A-10E illustrate the portion of the memory array region 100 in the first configuration after formation of a memory-level dielectric material layer 90 and memory cell contact via structures 98. FIG. 10F illustrates the exemplary structure at the processing steps of FIGS. 10A-10E. It is noted that many components within a two-dimensional array of memory cell-access transistor assemblies 101 in FIG. 10F are omitted for clarity.

The memory-level dielectric material layer 90 may be formed at the level of the two-dimensional array of memory cells 150, and laterally surrounds, and embeds, the two-dimensional array of memory cells 150. The memory-level dielectric material layer 90 includes a dielectric material such as undoped silicate glass, a doped silicate glass, organosilicate glass, or a porous dielectric material. The memory-level dielectric material layer 90 may be deposited by chemical vapor deposition and/or by spin coating. The memory-level dielectric material layer 90 may be deposited with a planar top surface. The thickness of the memory-level dielectric material layer 90 may be in a range from 50 nm to 500 nm, such as from 100 nm to 250 nm, although lesser and greater thicknesses may also be used. Generally, the memory-level dielectric material layer 90 extends into the peripheral region 200 as illustrated in FIG. 10F.

A photoresist layer (not shown) may be applied over the memory-level dielectric material layer 90, and may be lithographically patterned to form openings in areas that overlie the memory cells 150, the third metal lines 43L in the peripheral region 200, the source lines 82, and/or gate connection metal lines (not shown) or gate connection metal pads (not shown) that are embedded in the source-line-level dielectric material layer 80. An anisotropic etch process may be performed to transfer the pattern of the openings in the photoresist layer through the memory-level dielectric material layer 90. In other words, portions of the memory-level dielectric material layer 90 that are not masked by the patterned photoresist layer may be etched by the anisotropic etch process. Via cavities may be formed underneath each opening in the photoresist layer. A top surface of a respective one of the memory cells 150, the third metal lines 43L in the peripheral region 200, the source lines 82, and/or gate connection metal lines (not shown) or gate connection metal pads (not shown) may be physically exposed at the bottom of each opening and via cavity through the memory-level dielectric material layer 90. The photoresist layer may be subsequently removed, for example, by ashing.

At least one metallic material may be deposited in each of the via cavities. The at least one metallic material may include, for example, a combination of a metallic barrier liner including a conductive metallic nitride material (such as WN, TiN, and/or WN) and a metallic fill material such as Cu, W, Mo, Co, Ru, another elemental metal, or an intermetallic alloy. Other suitable metallic fill materials for the memory level metal via may be within the contemplated scope of disclosure. Excess portions of the at least one metallic material may be removed from above the horizontal plane including the top surface of the memory-level dielectric material layer 90 by a planarization process. The planarization process may include a recess etch process and/or a chemical mechanical planarization process. Each remaining portion of the at least one conductive material filling a respective via cavity comprises a memory-level metal via structure (98, 44V).

The memory-level metal via structure (98, 44V) may include memory cell contact via structures 98 that contact a top surface of a respective memory cell 150, such as a top surface of a respective second electrode 158. In case the second electrode 158 is omitted, the memory cell contact via structure 98 can function as a second electrode. The memory-level metal via structure (98, 44V) may include third metal via structures 44V that contact a top surface of a respective third metal line 43L in the peripheral region 200. Optionally, the memory-level metal via structure (98, 44V) may include additional connection via structures (not illustrated) that contact a top surface of a respective source line 82, a respective gate connection metal line (not illustrated), or a respective gate connection metal pads (not illustrated).

The memory-level metal via structure (98, 44V) may be concurrently formed. In other words, the at least one metallic material that is deposited into the via cavities extending through the memory-level dielectric material layer 90 may be deposited using a same set of deposition processes, and a same planarization process defines the top surfaces of the memory-level metal via structure (98, 44V). Thus, the memory-level metal via structure in the peripheral region 200 (such as the third metal via structures 44V) may be formed directly on a top surface of a respective one of the source-line-level interconnect structures (82, 88, 43L) in the peripheral region 200 (such as the third metal via structures 44V) concurrently with formation of the drain contact via structures 78 and the source contact via structures 72. Thus, each memory-level metal via structure (98, 44V) may comprise a same metallic material. For example, each memory-level metal via structure (98, 44V) may include a same combination of a metallic barrier liner material (such as TiN, TaN, and/or WN) and a same metallic fill material. Top surfaces of each memory-level metal via structure (98, 44V) may be formed within a same horizontal plane. For example, each third metal via structure 43V may have a respective top surface located within the same horizontal plane as the top surfaces of the memory cell contact via structure 98. Each memory cell contact via structure 98 may contact a top surface of a memory cell 150, and may be embedded in the memory-level dielectric material layer 90.

A dielectric material layer may be deposited over the memory-level dielectric material layer 90 after formation of the memory-level metal via structures (98, 44V). The dielectric material layer is herein referred to a bit-line-level dielectric material layer 110. In embodiments in which the combination of the access-level dielectric material layer 70 and the source-line-level dielectric material layer 80 is formed as a third interconnect-level dielectric material layer 33 that is a component of a third interconnect-level structure L3, the combination of the memory-level dielectric material layer 90 and the bit-line-level dielectric material layer 110 constitutes a fourth interconnect-level dielectric material layer 34 that is a component of a fourth interconnect-level structure L4. The bit-line-level dielectric material layer 110 includes a dielectric material such as undoped silicate glass, a doped silicate glass, organosilicate glass, or a porous dielectric material. The bit-line-level dielectric material layer 110 may be deposited by chemical vapor deposition or by spin coating. The thickness of the bit-line-level dielectric material layer 110 may be in a range from 50 nm to 300 nm, although lesser and greater thicknesses may also be used.

A photoresist layer may be applied over the bit-line-level dielectric material layer 110, and may be lithographically patterned to form openings therein. The pattern of the openings may include line-shaped openings and pad-shaped openings. For example, a line-shaped opening laterally extending along the first horizontal direction hd1 may be formed over each column of memory cell contact via structures 98. Additional line-shaped openings and/or pad-shaped opening may be formed over other memory-level metal via structures (98, 44V).

An anisotropic etch process may be performed to transfer the pattern of the openings in the photoresist layer through the bit-line-level dielectric material layer 110. At least one top surface of memory-level metal via structures (98, 44V) may be physically exposed underneath each cavity formed underneath the openings in the photoresist layer. The photoresist layer may be subsequently removed, for example, by ashing.

At least one metallic material may be deposited in each of the cavities in the bit-line-level dielectric material layer 110. The at least one metallic material may include, for example, a combination of a metallic barrier liner including a conductive metallic nitride material (such as WN, TiN, and/or WN) and a metallic fill material such as Cu, W, Mo, Co, Ru, another elemental metal, or an intermetallic alloy. Excess portions of the at least one metallic material may be removed from above the horizontal plane including the top surface of the bit-line-level dielectric material layer 110 by a planarization process. The planarization process may include a recess etch process and/or a chemical mechanical planarization process. Each remaining portion of the at least one conductive material filling a respective cavity in the bit-line-level dielectric material layer 110 comprises a bit-line-level interconnect structure (118, 44L).

The bit-line-level interconnect structures (118, 44L) may include bit lines 118 that contact a respective column of memory cell contact via structures 98 and laterally extend along the first horizontal direction hd1. Thus, the lengthwise direction of the bit lines 118 may be perpendicular to the lengthwise direction of the gate electrode strips 52. In one embodiment, the bit lines 118 may be formed as a one-dimensional periodic array having the second pitch along the second horizontal direction hd2. The bit lines 118 may be laterally spaced apart along the second horizontal direction hd2. The bit lines 118 may overlie, and may be electrically connected, to a respective column of memory cells 150, which is a set of memory cells 150 within the two-dimensional array of memory cells 150. In one embodiment, each second electrode 158 of a memory cell 150 may be electrically connected to a respective bit line 118, for example, through a respective memory cell contact via structure 98.

Additional dielectric material layers (not shown) and additional metal interconnect structures (not shown) may be formed, which are collectively referred to as upper-level metal interconnect structures. The set of all metal interconnect structures that are formed above the first metal interconnect structures (41V, 41L, 42V, 42L) is herein referred to as second metal interconnect structures. The second metal interconnect structures include the metal interconnect structures that are formed within the access-level dielectric material layer 70, the source-line-level dielectric material layer 80, the memory-level dielectric material layer 90, and the bit-line-level dielectric material layer 110. Each bit line 118 may be electrically connected to a respective one of the field effect transistors on the semiconductor material layer 10 through a subset of the second metal interconnect structures and the first metal interconnect structures (41V, 41L, 42V, 42L).

In one embodiment, the substrate 8 may comprise a semiconductor substrate and may include a single crystalline semiconductor layer as the semiconductor material layer 10, and may underlie the at least one lower-level dielectric material layer 3. Field effect transistors comprising a respective single crystalline semiconductor channel may be located on the single crystalline semiconductor layer. Each bit line 118 may be electrically connected to a respective one of the field effect transistors through a respective subset of metal interconnect structures embedded within the at least one lower-level dielectric material layer 3, the access-level dielectric material layer 70, the source-line-level dielectric material layer 80, and the memory-level dielectric material layer 90. Each source line 82 may be electrically connected to a respective one of the field effect transistors through a respective subset of metal interconnect structures embedded within the at least one lower-level dielectric material layer 3 and the access-level dielectric material layer 70. In one embodiment, at least one of the first metal interconnect structures (41V, 41L, 42V, 42L) may be electrically connected to a bit line 118 through a subset of second metal interconnect structures overlying the top surface of the at least one lower-level dielectric material layer 3.

In one embodiment, the gate electrode strips 52 may be formed on one of the first metal interconnect structures (41V, 41L, 42V, 42L) (such as a second metal line 42L), or is electrically connected to one of the field effect transistors on the semiconductor material layer 10 through a subset of the second metal interconnect structures and a subset of the first metal interconnect structures (41V, 41L, 42V, 42L). In one embodiment, a field effect transistor on the semiconductor material layer 10 may be electrically connected to a gate electrode of a semiconducting metal oxide fin transistor (comprising a portion of a gate electrode strip 52) through a set of metal interconnect structures embedded in the at least one lower-level dielectric material layer 3.

While the present disclosure is described using an embodiment in which a two-dimensional array of memory cells 150 is formed above the level of a two-dimensional array of semiconducting metal oxide fin transistors, embodiments are expressly contemplated herein in which a two-dimensional array of semiconducting metal oxide fin transistors is formed above a two-dimensional array of memory cells 150. In this embodiment, a first electrode 126 of each memory cell 150 may be formed above a second electrode 158 and a memory element of the memory cell 150, and metal interconnect structures may be modified to provide electrical connection between each first electrode 126 of a memory cell 150 to a drain region 138 of a semiconducting metal oxide fin transistor.

Generally, a two-dimensional array of memory cells 150 may be vertically offset from the two-dimensional array of fin field effect transistors. Each memory cell 150 may comprise a respective first electrode 126 that is electrically connected to a drain region 138 of a respective one of the two-dimensional array of fin field effect transistors, a respective memory element, and a respective second electrode 158.

Referring to FIGS. 11A-11E, a portion of the memory array region 100 in an alternative configuration is illustrated, which may be derived from the first configuration illustrated in FIGS. 10A-10E by forming a plurality of semiconducting metal oxide fins 130 per semiconducting metal oxide transistor. Specifically, two or more semiconducting metal oxide fins 130 that are laterally spaced apart along the second horizontal direction hd2 and aligned along the first horizontal direction hd1 may be formed within each cell area of the memory cell-access transistor assemblies 101. Each source contact via structure 72 may contact all of the source regions 132 of the semiconducting metal oxide fins 130 of a respective memory cell-access transistor assembly 101, and each drain contact via structure 78 may contact all of the drain regions 138 of the semiconducting metal oxide fins 130 of a respective memory cell-access transistor assembly 101. The plurality of semiconducting metal oxide fins 130 in a memory cell-access transistor assembly 101 may be used to increase the on-current of the semiconducting metal oxide fin transistor of each memory cell-access transistor assembly 101, and to provide effective programming, erasing, and reading of a respective memory cell 150.

Referring to FIGS. 12A-12E, a portion of the memory array region 100 in a second configuration is illustrated after formation of gate electrode strips 52 and auxiliary source lines 42. The second configuration illustrated in FIGS. 12A-12E may be derived from the first configuration illustrated in FIGS. 4A-4D by performing the processing steps of FIGS. 5A-5D with a modification to the pattern in the photoresist layer 57. Specifically, the photoresist layer 57 used at the processing steps of FIGS. 5A-5D may be lithographically pattered to provide line-shaped photoresist material portions located between each neighboring row of semiconducting metal oxide fins 130. As such, the line-shaped photoresist material portions may laterally extend along the second horizontal direction hd2, and may be located entirely outside the areas of the semiconducting metal oxide fins 130.

An anisotropic etch process may be performed to pattern the gate electrode material layer 52L. The anisotropic etch process may be the same as the anisotropic etch process used at the processing steps of FIGS. 5A-5D. Remaining patterned portions of the gate electrode material layer 52L include the gate electrode strips 52 (which may be the same as in the first configuration) and the auxiliary source lines 42. In one embodiment, the auxiliary source lines 42 may be formed as a periodic one-dimensional array having the first pitch along the first horizontal direction. The auxiliary source lines 42 and the gate electrode strips 52 may have a same material portion. The auxiliary source line 42 may be located on the top surface of the at least one lower-level dielectric material layer 3. The thickness of the auxiliary source line 42 may be the same as the thickness of the planar portions of the gate electrode strips 52 that contact a top surface of the at least one lower-level dielectric material layer 3.

Referring to FIGS. 13A-13F, the processing steps of FIGS. 6A-6E may be performed to form a source region 132, a drain region 138, and a channel region 135 in each semiconducting metal oxide fin 130.

Referring to FIGS. 14A-14F, the processing steps of FIGS. 7A-7F may be performed with a modification to form source contact via structures 72, drain contact via structures 78, source connection via structures 74, second metal via structures 43V, and optionally gate contact via structures (not shown). The source connection via structures 74 may be formed through the access-level dielectric material layer 70 directly on a top surface of a respective one of the auxiliary source lines 42 concurrently with formation of the source contact via structures 72, the drain contact via structures 78, the second metal via structures 43V, and the optionally gate contact via structures. As such, the source connection via structures 74 may have the same material composition as the source contact via structures 72, the drain contact via structures 78, the second metal via structures 43V, and the optionally gate contact via structures. Further, the top surfaces of the source connection via structures 74 may be located within the same horizontal plane including the top surfaces of the source contact via structures 72, the drain contact via structures 78, the second metal via structures 43V, and the optionally gate contact via structures. Each auxiliary source line 42 may be contacted by a respective row of source connection via structures 74 that are arranged along the second horizontal direction hd2.

Referring to FIGS. 15A-15F, the processing steps of FIGS. 8A-8F may be performed with a modification in the pattern of the source lines 82. In this embodiment, the source lines 82 may be widened along the first horizontal direction to provide an areal overlap with a respective row of source connection via structures 74 that are arranged along the second horizontal direction hd2. Thus, each source line 82 may contact top surfaces of a respective row of source contact via structures 72 and a respective row of source connection via structures 74.

Each source contact via structure 72 may contact a respective source region 132 within a respective semiconducting metal oxide fin 130, and may be embedded within the access-level dielectric material layer 70. Each source line 82 may laterally extend along the second horizontal direction hd2, and may contact a respective set of source contact via structures 72 and a respective set of source connection via structures 74. Each source connection via structure 74 may contact a bottom surface of a respective source line 82. Each auxiliary source line 42 may be located on the top surface of the at least one lower-level dielectric material layer 3, and may the same material as the gate electrode strips 52 (which include the gate electrodes of the semiconducting metal oxide fin transistors), and may contact bottom surfaces of a respective row of source connection via structures 74.

Referring to FIGS. 16A-16F, the processing steps of FIGS. 9A-9E and 10A-10F may be performed to form a two-dimensional array of memory cells 150, a memory-level dielectric material layer 90, various memory-level metal via structures (98, 44V), a bit-line-level dielectric material layer 110, and various bit-line-level interconnect structures (118, 44L).

Referring to FIGS. 17A-17F, a portion of the memory array region 100 in another alternative configuration is illustrated, which may be derived from the second configuration illustrated in FIGS. 16A-16F by forming a plurality of semiconducting metal oxide fins 130 per semiconducting metal oxide transistor. Specifically, two or more semiconducting metal oxide fins 130 that are laterally spaced apart along the second horizontal direction hd2 and aligned along the first horizontal direction hd1 may be formed within each cell area of the memory cell-access transistor assemblies 101. Each source contact via structure 72 may contact all of the source regions 132 of the semiconducting metal oxide fins 130 of a respective memory cell-access transistor assembly 101, and each drain contact via structure 78 may contact all of the drain regions 138 of the semiconducting metal oxide fins 130 of a respective memory cell-access transistor assembly 101. The plurality of semiconducting metal oxide fins 130 in a memory cell-access transistor assembly 101 may be used to increase the on-current of the semiconducting metal oxide fin transistor of each memory cell-access transistor assembly 101, and to provide effective programming, erasing, and reading of a respective memory cell 150.

Figure 18:
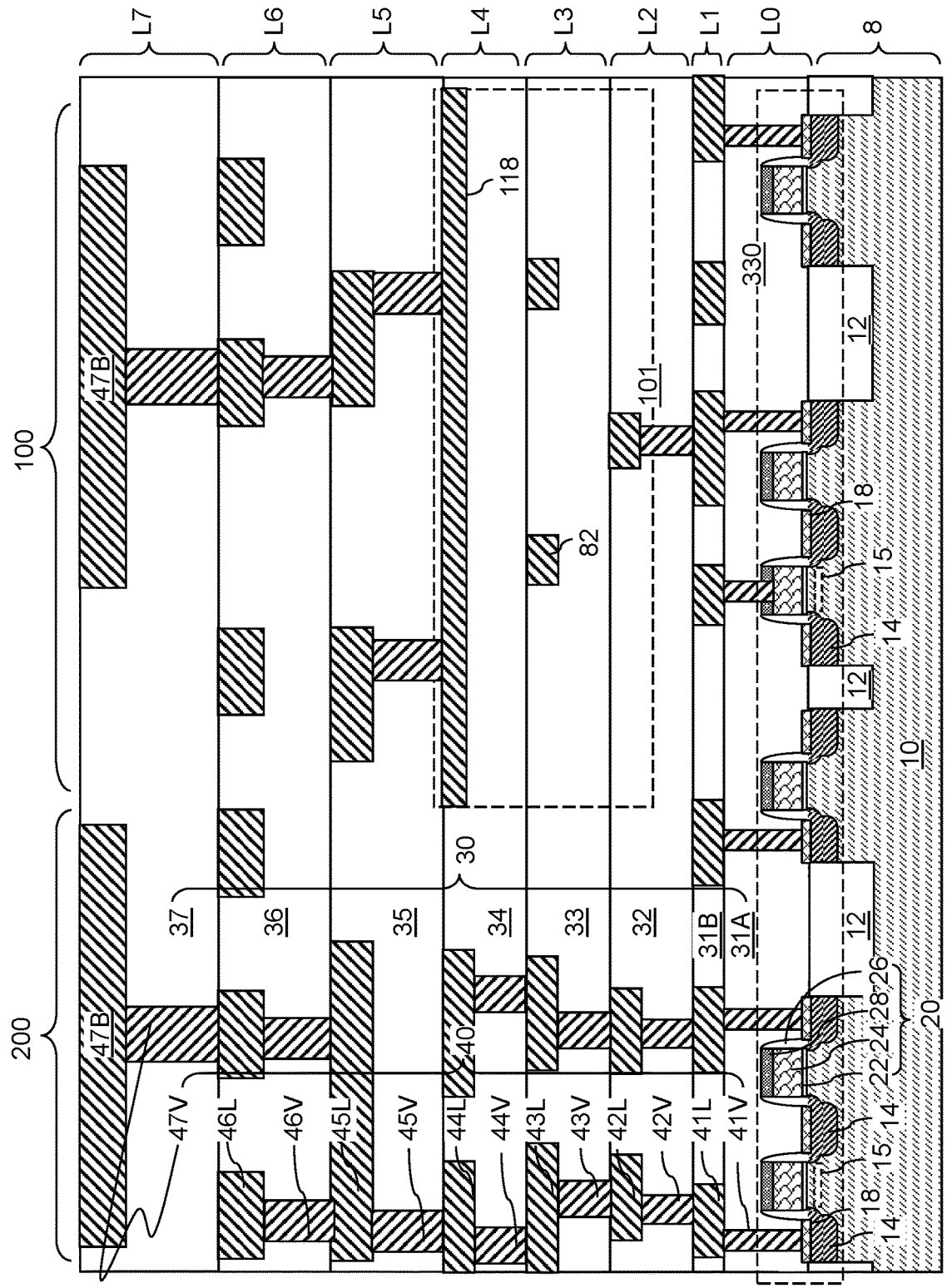
FIG. 18 is a vertical cross-sectional view of the exemplary structure after formation of upper-level metal interconnect structures according to an embodiment of the present disclosure.

Referring to FIG. 18, the exemplary structure is illustrated after formation of upper-level dielectric material layers that embed upper-level metal interconnect structures. In embodiments in which the an array of memory cell-access transistor assemblies 101 is formed over the second interconnect-level structure L2, a third interconnect-level structure L3 may include the access-level dielectric material layer 70 and the source-line-level dielectric material layer 80 and all devices structures embedded therein, and a fourth interconnect-level structure L4 may include the memory-level dielectric material layer 90 and the bit-line-level dielectric material layer 110 and all device structures embedded therein. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect-level dielectric material layer 34 embedding fourth metal interconnect structures (44V, 44L), which may include third metal via structures 44V and fourth metal lines 44L. The fifth interconnect-level structure L5 may include a fifth interconnect-level dielectric material layer 35 embedding fifth metal interconnect structures (45V, 45L), which may include fourth metal via structures 45V and fifth metal lines 45L. The sixth interconnect-level structure L6 may include a sixth interconnect-level dielectric material layer 36 embedding sixth metal interconnect structures (46V, 46L), which may include fifth metal via structures 46V and sixth metal lines 46L. The seventh interconnect-level structure L7 may include a seventh interconnect-level dielectric material layer 37 embedding sixth metal via structures 47V (which are seventh metal interconnect structures) and metal bonding pads 47B. The metal bonding pads 47B may be configured for solder bonding (which may use C4 ball bonding or wire bonding), or may be configured for metal-to-metal bonding (such as copper-to-copper bonding).

Each interconnect-level dielectric material layer may be referred to as an interconnect-level dielectric (ILD) layer 30. Each metal interconnect structures may be referred to as a metal interconnect structure 40. Each combination of a metal via structure and an overlying metal line located within a same interconnect-level structure (L2-L7) may be formed sequentially as two distinct structures by using two single damascene processes, or may be simultaneously formed as a unitary structure using a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Various etch stop dielectric layers and dielectric capping layers may be inserted between vertically neighboring pairs of ILD layers 30, or may be incorporated into one or more of the ILD layers 30.

While the present disclosure is described using an embodiment in which the array of memory cell-access transistor assemblies 101 may be formed as a component of a third interconnect-level structure L3 and a fourth interconnect-level structure L4, embodiments are expressly contemplated herein in which the array of memory cell-access transistor assemblies 101 is formed as components of any other interconnect-level structure. Further, while the present disclosure is described using an embodiment in which a set of eight interconnect-level structures may be formed, embodiments are expressly contemplated herein in which a different number of interconnect-level structures is used. In addition, embodiments are expressly contemplated herein in which two or more arrays of memory cell-access transistor assemblies 101 are provided within multiple interconnect-level structures in the memory array region 100.

Figure 19:
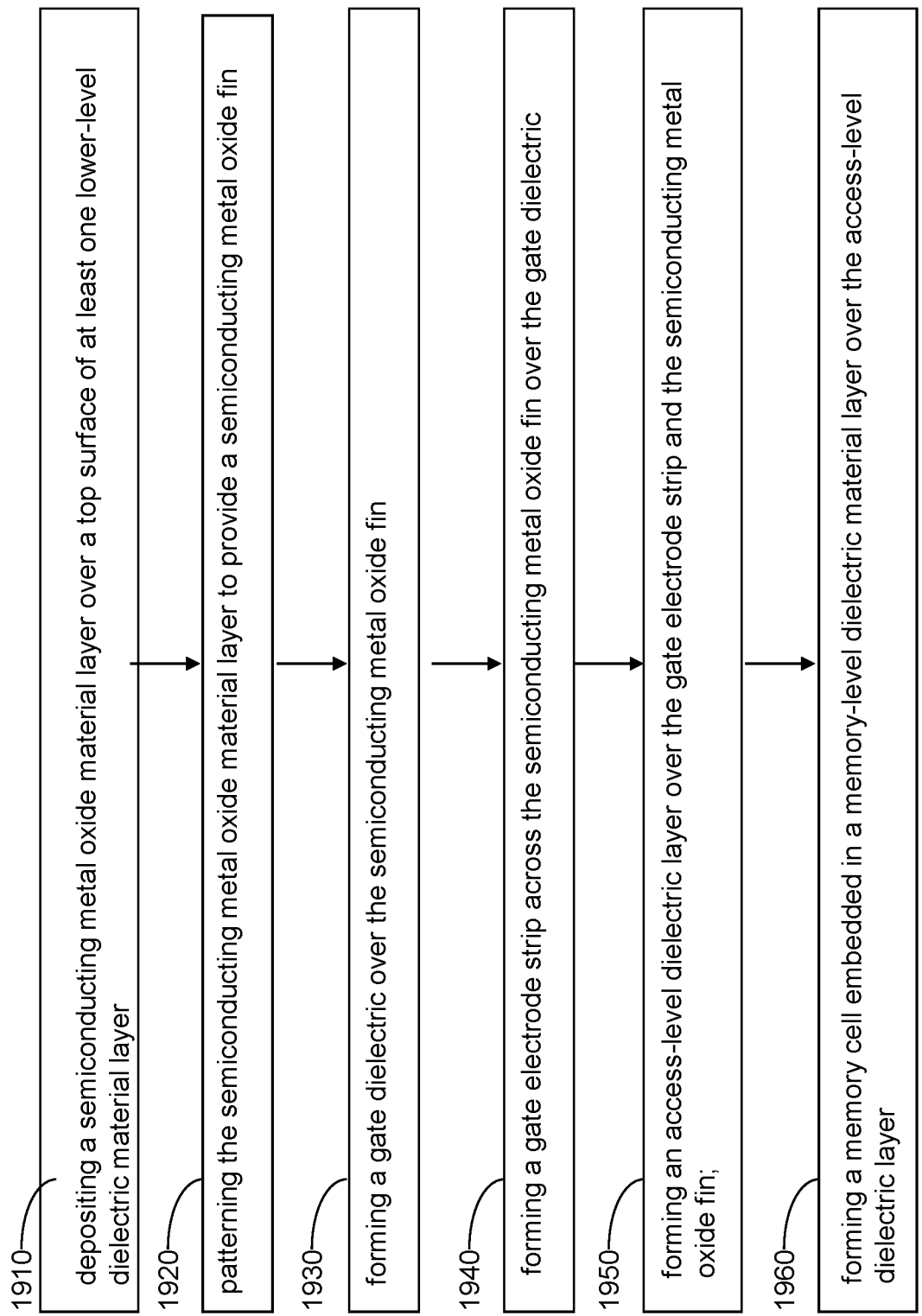
FIG. 19 is a flowchart illustrating steps for manufacture of a semiconductor device according to an embodiment of the present disclosure.

Referring to FIG. 19, a flowchart illustrates steps for manufacture of a semiconductor device according to an embodiment of the present disclosure. Referring to step 1910 and FIGS. 1A-2B, a semiconducting metal oxide material layer 130L may be deposited over a top surface of at least one lower-level dielectric material layer 3. Referring to step 1920 and FIGS. 3A and 3B, 11A-11E, and 18, the semiconducting metal oxide material layer 130L may be patterned to provide a semiconducting metal oxide fin 130. Referring to step 1930 and FIGS. 4A-4D, 11A-11E, and 18, a gate dielectric layer 50 may be formed over the semiconducting metal oxide fin 130. Referring to step 1940 and FIGS. 5A-5D, 11A-11E, 12A-12E, and 18, a gate electrode strip 52 may be formed across the semiconducting metal oxide fin 130 over the gate dielectric layer 50. Referring to step 1950 and FIGS. 7A-7E, 11A-11E, 13A-14F, and 18, an access-level dielectric material layer 70 may be formed over the gate electrode strip 52 and the semiconducting metal oxide fin 130. Referring to step 1960 and FIGS. 8A-10F, 11A-11E, 15A-17F, and 18, a memory cell 150 embedded in a memory-level dielectric material layer 90 may be formed over the access-level dielectric material layer 70. The memory cell 150 comprises a first electrode 126 that is electrically connected to a drain region 138 within the semiconducting metal oxide fin 130 through a first electrically conductive path, a memory element, and a second electrode 158.

Referring to all drawings and according to various embodiments of the present disclosure, a semiconductor device is provided, which comprises: a semiconducting metal oxide fin 130 located over a top surface of at least one lower-level dielectric material layer 3 and extending along a first horizontal direction hd1 and having a width along a second horizontal direction hd2; a gate dielectric layer 50 located on a top surface and sidewalls of the semiconducting metal oxide fin 130; a gate electrode (comprising a portion of a gate electrode strip 52) located on the gate dielectric layer 50 and straddling the semiconducting metal oxide fin 130 along the second horizontal direction hd2; an access-level dielectric material layer 70 embedding the gate electrode and the semiconducting metal oxide fin 130; a memory cell 150 embedded in a memory-level dielectric material layer 90 that is vertically offset from the access-level dielectric material layer 70 and comprising a first electrode 126, a memory element (such as, but not limited to, a magnetic tunnel junction (128, 140, 146, 148)), and a second electrode 158; and a bit line 118 overlying the memory cell 150, wherein: the first electrode 126 is electrically connected to a drain region 138 within the semiconducting metal oxide fin 130 through a first electrically conductive path (78, 88); and the second electrode 158 is electrically connected to the bit line 118.

According to another aspect of the present disclosure, a two-dimensional memory array is provided, which comprises: a two-dimensional array of fin field effect transistors including a respective semiconducting metal oxide fin 130 and located over a top surface of at least one lower-level dielectric material layer 3; gate electrode strips 52 overlying a respective row of the semiconducting metal oxide fins 130, laterally spaced apart along a first horizontal direction hd1 from one another, and each laterally extending along a second horizontal direction hd2, wherein each of the fin field effect transistors comprises a portion of a respective one of the gate electrode strips 52 as a gate electrode; a two-dimensional array of memory cells 150 that are vertically offset from the two-dimensional array of fin field effect transistors and comprising a respective first electrode 126 that is electrically connected to a drain region 138 of a respective one of the two-dimensional array of fin field effect transistors, a respective memory element, and a respective second electrode 158; and bit lines 118 laterally extending along the first horizontal direction hd1, laterally spaced apart along the second horizontal direction hd2, and electrically connected to a set of memory cells 150 located within the two-dimensional array of memory cells 150. The gate electrode strips 52 may function as word lines for the two-dimensional memory array, which is a two-dimensional array of memory cell-access transistor assemblies 101.

The various embodiments of the present disclosure provide a two-dimensional array of memory cell-access transistor assemblies 101 including a series connection of a semiconducting metal oxide fin transistor and a memory cell 150 that is embedded entirely with two interconnect-level structures that are formed as a portion of a back-end-of-line structures. The peripheral circuits for the two-dimensional array of memory cell-access transistor assemblies 101 may be provided on the top surface of a semiconductor material layer 10 located in a semiconductor substrate. Further, more than two two-dimensional arrays of memory cell-access transistor assemblies 101 may be vertically stacked. The area of a memory die may be effectively used by using a two-dimensional array of semiconducting metal oxide fin transistors as access transistors in a series connection with a respective one of memory cells 150 within a two-dimensional array of memory cells 150 and embedded entirely within an interconnect level. Thus, a compact memory device having a higher device density may be provided using the various embodiments of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate comprising a single crystalline semiconductor layer;
at least one lower-level dielectric material layer overlying the semiconductor substrate and having a top surface that is located entirely within a first horizontal plane;
a semiconducting metal oxide fin located over the top surface of the at least one lower-level dielectric material layer and extending along a first horizontal direction and having a width along a second horizontal direction, wherein the semiconducting metal oxide fin comprises a channel region having a doping of a first conductivity type and in contact with a first horizontal surface segment of the top surface of the at least one lower-level dielectric material layer, a source region having a doping of a second conductivity type that is an opposite of the first conductivity type and contacting the channel region at a first junction and in contact with a second horizontal surface segment of the top surface of the at least one lower-level dielectric material layer, and a drain region having a doping of the second conductivity type and contacting the channel region at a second junction and in contact with a third horizontal surface segment of the top surface of the at least one lower-level dielectric material layer;
a gate dielectric layer located on a top surface and sidewalls of the semiconducting metal oxide fin and in contact with a fourth horizontal surface segment of the top surface of the at least one lower-level dielectric material layer, wherein each of the first junction and the second junction continuously extends from the top surface of the at least one lower-level dielectric material layer to an interface between a top surface of the semiconducting metal oxide fin and the gate dielectric layer;
a gate electrode located on the gate dielectric layer and straddling the semiconducting metal oxide fin along the second horizontal direction;
an access-level dielectric material layer embedding the gate electrode and the semiconducting metal oxide fin;
a memory cell embedded in a memory-level dielectric material layer that is vertically offset from the access-level dielectric material layer and comprising a first electrode, a memory element, and a second electrode; and
a bit line overlying the memory cell, wherein:
the first electrode is electrically connected to the drain region through a first electrically conductive path; and
the second electrode is electrically connected to the bit line.

2. The semiconductor device of claim 1, further comprising field effect transistors located on the single crystalline semiconductor layer and comprising a respective single crystalline semiconductor channel.

3. The semiconductor device of claim 2, further comprising first metal interconnect structures embedded in the at least one lower-level dielectric material layer and electrically connected to a respective node of the field effect transistors located on the single crystalline semiconductor layer, wherein at least one of the first metal interconnect structures is electrically connected to the bit line through a subset of second metal interconnect structures overlying the top surface of the at least one lower-level dielectric material layer.

4. The semiconductor device of claim 1, wherein the first electrically conductive path comprises:
a drain contact via structure contacting the drain region within the semiconducting metal oxide fin and embedded within the access-level dielectric material layer; and
a metal plate contacting a top surface of the drain contact via structure.

5. The semiconductor device of claim 4, further comprising:
a source contact via structure contacting the source region within the semiconducting metal oxide fin and embedded within the access-level dielectric material layer; and
a source line contacting the source contact via structure and laterally extending along the second horizontal direction.

6. The semiconductor device of claim 5, further comprising:
a semiconductor substrate comprising a single crystalline semiconductor layer and underlying the at least one lower-level dielectric material layer; and
field effect transistors located on the single crystalline semiconductor layer and comprising a respective single crystalline semiconductor channel, wherein:
a first one of the field effect transistors located on the single crystalline semiconductor layer is electrically connected to the bit line; and
a second of the field effect transistors located on the single crystalline semiconductor layer is electrically connected to the source line.

7. The semiconductor device of claim 6, wherein a third one of the field effect transistors located on the single crystalline semiconductor layer is electrically connected to the gate electrode through a set of metal interconnect structures embedded in the at least one lower-level dielectric material layer.

8. The semiconductor device of claim 5, further comprising an auxiliary source line located on the top surface of the at least one lower-level dielectric material layer, comprising a same material as the gate electrode, and contacting a source connection via structure that contacts a bottom surface of the source line.

9. The semiconductor device of claim 4, further comprising:
lower-level metal lines embedded in an upper portion of the at least one lower-level dielectric material layer and laterally offset from the semiconducting metal oxide fin;
access-level metal via structures contacting a top surface of a respective one of the lower-level metal lines, comprising a same material as the drain contact via structure, and having a respective top surface located within a same horizontal plane as a top surface of the drain contact via structure; and
source-line-level interconnect structures contacting a top surface of a respective one of the access-level metal via structures.

10. The semiconductor device of claim 9, further comprising:
a memory cell contact via structure contacting a top surface of the memory cell and embedded in the memory-level dielectric material layer; and
memory-level metal via structures embedded in the memory-level dielectric material layer, contacting a respective one of the source-line-level interconnect structures, and having a respective top surface within a horizontal plane including a top surface of the memory cell contact via structure.

11. The semiconductor device of claim 1, wherein the semiconducting metal oxide fin comprises indium gallium zinc oxide.

12. The semiconductor device of claim 1, wherein the memory cell comprises a magnetic tunnel junction, a ferroelectric tunnel junction, a phase change memory material, or a vacancy-modulated conductive oxide material portion.

13. A memory array comprising:
a semiconductor substrate comprising a single crystalline semiconductor layer;
at least one lower-level dielectric material layer overlying the semiconductor substrate and having a top surface that is located entirely within a first horizontal plane;
a two-dimensional array of fin field effect transistors including a respective semiconducting metal oxide fin and located over the top surface of at least one lower-level dielectric material layer, wherein the respective semiconducting metal oxide fin comprises a respective channel region having a doping of a first conductivity type and in contact with a respective first horizontal surface segment of the top surface of the at least one lower-level dielectric material layer, a respective source region having a doping of a second conductivity type that is an opposite of the first conductivity type and contacting the respective channel region at a respective first junction and in contact with a second horizontal surface segment of the top surface of the at least one lower-level dielectric material layer, and a respective drain region having a doping of the second conductivity type and contacting the respective channel region at a respective second junction and in contact with a third horizontal surface segment of the top surface of the at least one lower-level dielectric material layer;
a gate dielectric layer located on a top surface and sidewalls of each of the semiconducting metal oxide fins in the two-dimensional array of fin field effect transistors and in contact with a fourth horizontal surface segment of the top surface of the at least one lower-level dielectric material layer, wherein each of the first junctions and the second junctions continuously extends from the top surface of the at least one lower-level dielectric material layer to an interface between a top surface of a respective one of the semiconducting metal oxide fins and the gate dielectric layer;
gate electrode strips overlying a respective row of the semiconducting metal oxide fins, laterally spaced apart along a first horizontal direction from one another, and each laterally extending along a second horizontal direction, wherein each of the fin field effect transistors comprises a portion of a respective one of the gate electrode strips as a gate electrode;
a two-dimensional array of memory cells that are vertically offset from the two-dimensional array of fin field effect transistors and comprising a respective first electrode that is electrically connected to the drain region of a respective one of the two-dimensional array of fin field effect transistors, a respective memory element, and a respective second electrode; and
bit lines laterally extending along the first horizontal direction, laterally spaced apart along the second horizontal direction, and electrically connected to a set of memory cells within the two-dimensional array of memory cells.

14. The memory array of claim 13, further comprising source lines laterally extending along the second horizontal direction, laterally spaced apart along the first horizontal direction, and electrically connected to a set of source regions located within a respective row of field effect transistors within the two-dimensional array of fin field effect transistors through a respective row of source contact via structures.

15. The memory array of claim 13, further comprising:
a semiconductor substrate comprising a single crystalline semiconductor layer and underlying the at least one lower-level dielectric material layer;
field effect transistors located on the single crystalline semiconductor layer and comprising a respective single crystalline semiconductor channel,
wherein each of the bit lines and the gate electrode strips is electrically connected to a respective one of the field effect transistors located on the single crystalline semiconductor layer through a respective subset of metal interconnect structures embedded within the at least one lower-level dielectric material layer.

16. A semiconductor device comprising:
a semiconductor substrate comprising a single crystalline semiconductor layer;
field effect transistors located on the single crystalline semiconductor layer and comprising a respective single crystalline semiconductor channel;
at least one lower-level dielectric material layer overlying the semiconductor substrate and having a top surface that is located entirely within a first horizontal plane;
a semiconducting metal oxide fin located over the top surface of the at least one lower-level dielectric material layer and extending along a first horizontal direction and having a width along a second horizontal direction, wherein the semiconducting metal oxide fin comprises a channel region having a doping of a first conductivity type and in contact with a first horizontal surface segment of the top surface of the at least one lower-level dielectric material layer, a source region having a doping of a second conductivity type that is an opposite of the first conductivity type and contacting the channel region at a first junction and in contact with a second horizontal surface segment of the top surface of the at least one lower-level dielectric material layer, and a drain region having a doping of the second conductivity type and contacting the channel region at a second junction and in contact with a third horizontal surface segment of the top surface of the at least one lower-level dielectric material layer;

a gate dielectric layer located on a top surface and sidewalls of the semiconducting metal oxide fin and in contact with a fourth horizontal surface segment of the top surface of the at least one lower-level dielectric material layer, wherein each of the first junction and the second junction continuously extends from the top surface of the at least one lower-level dielectric material layer to an interface between a top surface of the semiconducting metal oxide fin and the gate dielectric layer;

a gate electrode located on the gate dielectric layer and straddling the semiconducting metal oxide fin along the second horizontal direction;

an access-level dielectric material layer embedding the gate electrode and the semiconducting metal oxide fin; and a memory cell embedded in a memory-level dielectric material layer that is vertically offset from the access-level dielectric material layer.

17. The semiconductor device of claim 16, wherein:
the memory cell comprises a first electrode, a memory element, and a second electrode;
the first electrode is electrically connected to the drain region within the semiconducting metal oxide fin through a first electrically conductive path; and
the second electrode is electrically connected to a bit line that overlies the memory cell.

18. The semiconductor device of claim 17, further comprising first metal interconnect structures embedded in the at least one lower-level dielectric material layer and electrically connected to a respective node of the field effect transistors located on the single crystalline semiconductor layer, wherein at least one of the first metal interconnect structures is electrically connected to the bit line through a subset of second metal interconnect structures overlying the top surface of the at least one lower-level dielectric material layer.

19. The semiconductor device of claim 17, wherein the first electrically conductive path comprises:
a drain contact via structure contacting the drain region within the semiconducting metal oxide fin and embedded within the access-level dielectric material layer; and
a metal plate contacting a top surface of the drain contact via structure.

20. The semiconductor device of claim 19, further comprising:
a source contact via structure contacting the source region within the semiconducting metal oxide fin and embedded within the access-level dielectric material layer; and
a source line contacting the source contact via structure and laterally extending along the second horizontal direction.

* * * * *